United States Patent
Murakawa et al.

(10) Patent No.: US 10,964,787 B2
(45) Date of Patent: Mar. 30, 2021

(54) SEMICONDUCTOR DEVICE AND METHOD FOR MANUFACTURING SEMICONDUCTOR DEVICE

(71) Applicant: Semiconductor Energy Laboratory Co., Ltd., Atsugi (JP)

(72) Inventors: Tsutomu Murakawa, Isehara (JP); Toshihiko Takeuchi, Isehara (JP); Hiroki Komagata, Atsugi (JP); Hiromi Sawai, Atsugi (JP); Yasumasa Yamane, Atsugi (JP); Shota Sambonsuge, Isehara (JP); Kazuya Sugimoto, Atsugi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/732,686

(22) Filed: Jan. 2, 2020

(65) Prior Publication Data

US 2020/0135867 A1 Apr. 30, 2020

Related U.S. Application Data

(62) Division of application No. 15/628,945, filed on Jun. 21, 2017, now Pat. No. 10,600,875.

(30) Foreign Application Priority Data

Jul. 1, 2016 (JP) .................................. 2016-131997

(51) Int. Cl.
*H01L 29/786* (2006.01)
*H01L 27/105* (2006.01)
(Continued)

(52) U.S. Cl.
CPC .......... *H01L 29/24* (2013.01); *H01L 27/1225* (2013.01); *H01L 29/66969* (2013.01);
(Continued)

(58) Field of Classification Search
CPC . H01L 27/04; H01L 27/1218; H01L 27/1251; H01L 27/108; H01L 27/10805;
(Continued)

(56) References Cited

U.S. PATENT DOCUMENTS

| 7,674,650 B2 | 3/2010 | Akimoto et al. |
| 7,732,819 B2 | 6/2010 | Akimoto et al. |

(Continued)

FOREIGN PATENT DOCUMENTS

| JP | 2007-096055 A | 4/2007 |
| JP | 2007-123861 A | 5/2007 |

(Continued)

OTHER PUBLICATIONS

Murakami.M et al., "Theoretical Examination on a Significantly Low Off-State Current of a Transistor Using Crystalline In—Ga—Zn-Oxide", AM-FPD '12 Digest of Technical Papers, Jul. 4, 2012, pp. 171-174.

(Continued)

*Primary Examiner* — Mary A Wilczewski
*Assistant Examiner* — Tsz K Chiu
(74) *Attorney, Agent, or Firm* — Robinson Intellectual Property Law Office; Eric J. Robinson

(57) ABSTRACT

A semiconductor device includes a first conductor; a first insulator thereover; a first oxide thereover; a second oxide thereover; a second conductor and a third conductor that are separate from each other thereover; a third oxide over the first insulator, the second oxide, the second conductor, and the third conductor; a second insulator thereover; a fourth conductor thereover; and a third insulator over the first insulator, the second insulator, and the fourth conductor. The second oxide includes a region where the energy of the conduction band minimum of an energy band is low and a region where the energy of the conduction band minimum of (Continued)

the energy band is high. The energy of the conduction band minimum of the third oxide is higher than that of the region of the second oxide where the energy of the conduction band minimum is low. Side surfaces of the first oxide and the second oxide are covered with the third oxide.

13 Claims, 16 Drawing Sheets

(51) Int. Cl.
| | |
|---|---|
| H01L 29/51 | (2006.01) |
| H01L 29/66 | (2006.01) |
| H01L 27/12 | (2006.01) |
| H01L 29/49 | (2006.01) |
| H01L 29/24 | (2006.01) |
| H01L 29/788 | (2006.01) |

(52) U.S. Cl.
CPC ...... *H01L 29/7869* (2013.01); *H01L 29/7881* (2013.01); *H01L 29/78648* (2013.01); *H01L 29/78696* (2013.01)

(58) Field of Classification Search
CPC ......... H01L 29/78696; H01L 27/14634; H01L 27/10814; H01L 29/66818; H01L 29/7853; H01L 27/1225; H01L 29/24; H01L 29/7869; H01L 21/0234; H01L 21/02337; H01L 29/78693; H01L 29/7881; H01L 29/78648; H01L 29/66969
See application file for complete search history.

(56) References Cited

U.S. PATENT DOCUMENTS

| | | | |
|---|---|---|---|
| 7,910,490 B2 | 3/2011 | Akimoto et al. | |
| 7,932,521 B2 | 4/2011 | Akimoto et al. | |
| 8,274,077 B2 | 9/2012 | Akimoto et al. | |
| 8,426,868 B2 | 4/2013 | Akimoto et al. | |
| 8,466,463 B2 | 6/2013 | Akimoto et al. | |
| 8,629,069 B2 | 1/2014 | Akimoto et al. | |
| 8,669,550 B2 | 3/2014 | Akimoto et al. | |
| 8,748,886 B2 | 6/2014 | Yamazaki et al. | |
| 8,785,240 B2* | 7/2014 | Watanabe ........... | H01L 29/7869 438/104 |
| 8,790,959 B2 | 7/2014 | Akimoto et al. | |
| 8,796,069 B2 | 8/2014 | Akimoto et al. | |
| 8,847,220 B2 | 9/2014 | Yamazaki | |
| 8,860,108 B2 | 10/2014 | Yamazaki et al. | |
| 8,907,336 B2 | 12/2014 | Shieh et al. | |
| 8,921,853 B2 | 12/2014 | Yamazaki | |
| 8,952,377 B2 | 2/2015 | Yamazaki et al. | |
| 8,952,381 B2 | 2/2015 | Yamazaki | |
| 9,099,562 B2 | 8/2015 | Akimoto et al. | |
| 9,099,563 B2 | 8/2015 | Shieh et al. | |
| 9,190,525 B2 | 11/2015 | Yamazaki | |
| 9,214,474 B2 | 12/2015 | Yamazaki | |
| 9,245,958 B2 | 1/2016 | Yamazaki | |
| 9,306,078 B2 | 4/2016 | Shieh et al. | |
| 9,412,877 B2 | 8/2016 | Tanaka et al. | |
| 9,449,853 B2 | 9/2016 | Yamamoto et al. | |
| 9,496,376 B2 | 11/2016 | Yamazaki et al. | |
| 9,570,627 B2* | 2/2017 | Zhuang ............. | H01L 29/42384 |
| 10,236,390 B2* | 3/2019 | Yamane .............. | H01L 27/1052 |
| 2006/0231882 A1* | 10/2006 | Kim .................. | H01L 21/02266 257/310 |
| 2007/0252928 A1* | 11/2007 | Ito ......................... | G02F 1/1362 349/106 |
| 2008/0083950 A1* | 4/2008 | Pan ................... | H01L 29/66969 257/347 |
| 2008/0258139 A1* | 10/2008 | Ito ....................... | H01L 29/7869 257/43 |
| 2008/0308805 A1 | 12/2008 | Akimoto et al. | |
| 2011/0104851 A1 | 5/2011 | Akimoto et al. | |
| 2011/0121290 A1 | 5/2011 | Akimoto et al. | |
| 2013/0292671 A1 | 11/2013 | Yamazaki et al. | |
| 2014/0008647 A1 | 1/2014 | Yamazaki | |
| 2014/0042434 A1 | 2/2014 | Yamazaki | |
| 2014/0048843 A1 | 2/2014 | Chen | |
| 2014/0225105 A1 | 8/2014 | Tanaka et al. | |
| 2014/0231798 A1 | 8/2014 | Ono et al. | |
| 2015/0340513 A1 | 11/2015 | Akimoto et al. | |
| 2015/0349128 A1 | 12/2015 | Miyairi | |
| 2016/0087085 A1 | 3/2016 | Yamazaki et al. | |
| 2016/0111545 A1 | 4/2016 | Tanaka et al. | |
| 2016/0149055 A1 | 5/2016 | Yamazaki et al. | |
| 2016/0172383 A1 | 6/2016 | Nagatsuka | |
| 2017/0309732 A1 | 10/2017 | Yamazaki et al. | |
| 2018/0012739 A1 | 1/2018 | Yamazaki et al. | |

FOREIGN PATENT DOCUMENTS

| | | |
|---|---|---|
| JP | 2011-119674 A | 6/2011 |
| JP | 2016-105474 A | 6/2016 |
| JP | 2016-115932 A | 6/2016 |
| KR | 2017-0086485 A | 7/2017 |
| TW | 201624708 | 7/2016 |
| WO | WO-2016/079650 | 5/2016 |
| WO | WO-2018/002767 | 1/2018 |

OTHER PUBLICATIONS

Wager.J, "Oxide TFTs: A Progress Report", Information Display, 2016, vol. 32, No. 1, pp. 16-21.
Xiao.T et al., "Metal Oxide TFT Turnkey Manufacturing Solutions for a-Si TFT Lines", SID Digest '16 : SID International Symposium Digest of Technical Papers, 2016, pp. 318-321.
Nomura.K et al., "Local coordination structure and electronic structure of the large electron mobility amorphous oxide semiconductor In—Ga—Zn—O: Experiment and ab initio calculations", Phys. Rev. B (Physical Review. B), Jan. 18, 2007, vol. 75, No. 3, pp. 035212-1-035212-5.
Kurosawa.Y et al., "The crystallinity of nano-crystalline IGZO thin films", Extended Abstracts (The 75th Autumn Meeting 2014), The Japan Society of Applied Physics and Related Societies, Sep. 18, 2014, pp. 21-033.
Yamazaki.S et al., "Future Possibilities of Crystalline Oxide Semiconductor, Especially C-Axis-Aligned Crystalline IGZO", SID Digest '15 : SID International Symposium Digest of Technical Papers, Jun. 1, 2015, pp. 673-676.
Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.
Matsubayashi.D et al., "20-nm-node trench-gate-self-aligned crystalline In—Ga—Zn-Oxide FET with high frequency and low off-state current", IEDM 15: Technical Digest of International Electron Devices Meeting, Dec. 7, 2015, pp. 141-144.
Yamazaki.S et al., "Achievement of a high-mobility FET with a cloud-aligned composite oxide semiconductor", Jpn. J. Appl. Phys. (Japanese Journal of Applied Physics) , Oct. 13, 2016, vol. 55, pp. 115504-1-115504-7.
International Search Report (Application No. PCT/IB2017/053619) dated Oct. 17, 2017.
Written Opinion (Application No. PCT/IB2017/053619) dated Oct. 17, 2017.
Yamazaki.S, "Discovery of Indium Gallium Zinc Oxide (CAAC/CAC-OS) and Application to Next-generation Display Devices", 9th HTCMC & GFMAT, Jun. 27, 2016, pp. 1-55.
WO2018002767(ISA/237) Written Opinion of the International Searching Authority(Year:dated 2018).
Taiwanese Office Action (Application No. 105142758) dated Sep. 22, 2020.

* cited by examiner $$\Delta CB_{001} > \Delta CB_{002}$$
$$CB_{001} \approx CB_{002}$$

$$CB_{001} > CB_{002}$$

$$\Delta CB_{001} > \Delta CB_{002} > 0$$

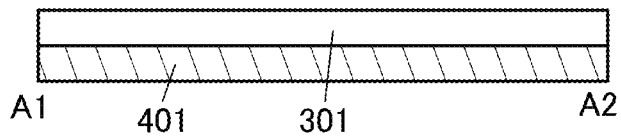
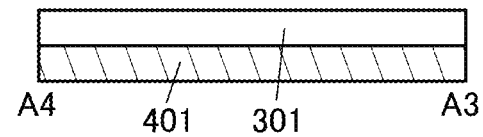
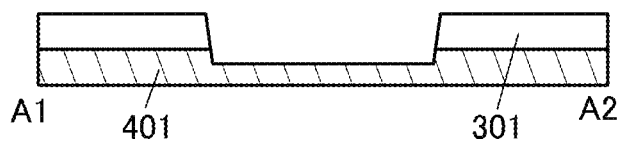
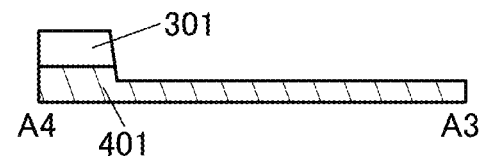
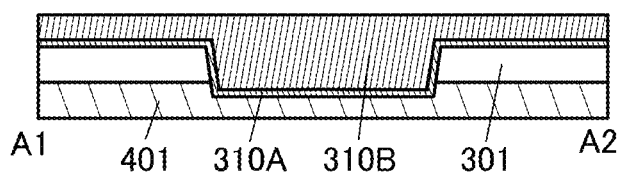
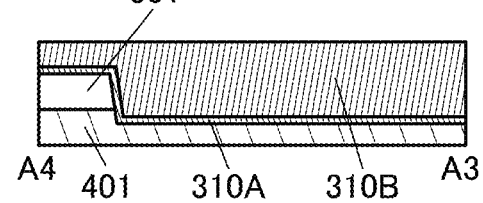
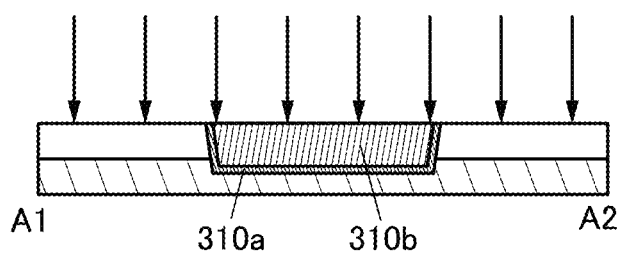
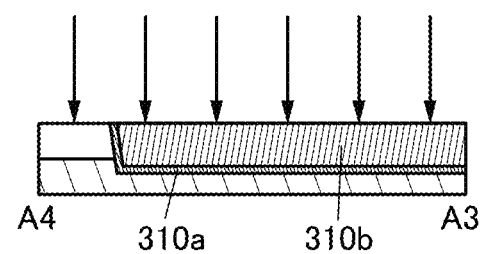
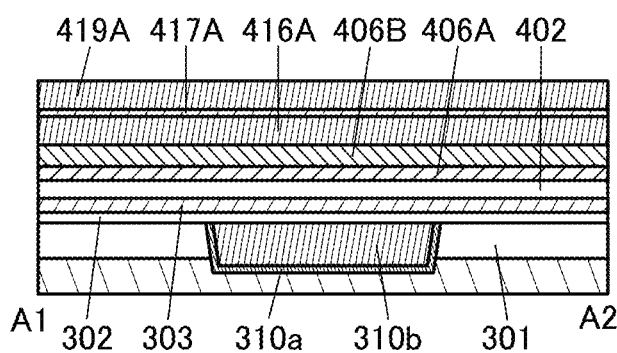
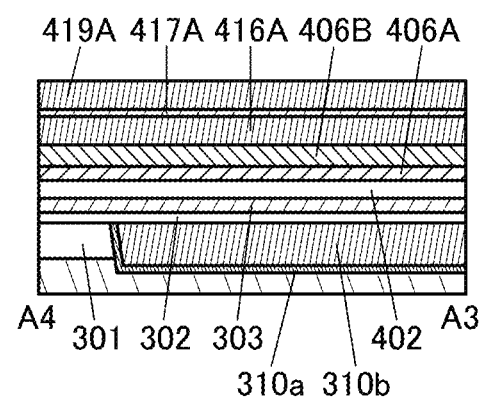

SEMICONDUCTOR DEVICE AND METHOD FOR MANUFACTURING SEMICONDUCTOR DEVICE

TECHNICAL FIELD

One embodiment of the present invention relates to a semiconductor device and a driving method thereof. Another embodiment of the present invention relates to an electronic device.

Note that one embodiment of the present invention is not limited to the above technical field. One embodiment of the invention disclosed in this specification and the like relates to an object, a method, or a manufacturing method. Another embodiment of the present invention relates to a process, a machine, manufacture, or a composition of matter.

In this specification and the like, a semiconductor device generally means a device that can function by utilizing semiconductor characteristics. A semiconductor element such as a transistor, a semiconductor circuit, an arithmetic device, a memory device, a display device (e.g., a liquid crystal display device and a light-emitting display device), a projection device, a lighting device, an electro-optical device, a power storage device, an imaging device, an electronic device, and the like may include a semiconductor device.

BACKGROUND ART

A technique in which a transistor is formed using a semiconductor thin film has attracted attention. Such a transistor is applied to a wide range of electronic devices such as an integrated circuit (IC) and an image display device (also simply referred to as a display device). A silicon-based semiconductor material is widely known as a material for a semiconductor thin film applicable to a transistor. As another material, an oxide semiconductor has been attracting attention.

For example, a technique in which a display device is formed using a transistor including an oxide semiconductor (a zinc oxide or an In—Ga—Zn-based oxide) as an active layer is disclosed (see Patent Documents 1 and 2).

Moreover, in recent years, a technique in which an integrated circuit of a memory device is fabricated using a transistor including an oxide semiconductor has been disclosed (see Patent Document 3). In addition, not only the memory device but also an arithmetic device or other devices have been fabricated using a transistor including an oxide semiconductor.

However, it is known that a transistor including an oxide semiconductor as an active layer has a problem in that the electrical characteristics are easily changed by impurities and oxygen vacancies in the oxide semiconductor and thus the reliability is low. For example, the threshold voltage of the transistor is changed in some cases after a bias temperature stress test (BT test).

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2011-119674

DISCLOSURE OF INVENTION

An object of one embodiment of the present invention is to provide a semiconductor device having favorable electrical characteristics. Another object of one embodiment of the present invention is to provide a highly reliable semiconductor device. Another object of one embodiment of the present invention is to provide a semiconductor device that can be miniaturized or highly integrated. Another object of one embodiment of the present invention is to provide a semiconductor device with high productivity.

Another object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a low-power semiconductor device. Another object of one embodiment of the present invention is to provide a novel semiconductor device.

Note that the descriptions of these objects do not disturb the existence of other objects. In one embodiment of the present invention, there is no need to achieve all the objects. Other objects are apparent from and can be derived from the description of the specification, the drawings, the claims, and the like.

One embodiment of the present invention is a semiconductor device including a first conductor; a first insulator over the first conductor; a first oxide over the first insulator; a second oxide over the first oxide; a second conductor and a third conductor that are separate from each other over the second oxide; a third oxide over the first insulator, the second oxide, the second conductor, and the third conductor; a second insulator over the third oxide; a fourth conductor at least part of which overlaps with the second oxide and which is over the second insulator; and a third insulator over the first insulator, the second insulator, and the fourth conductor. The second oxide includes a region where the energy of the conduction band minimum of an energy band is low and a region where the energy of the conduction band minimum of the energy band is high. The region where the energy of the conduction band minimum is low includes more carriers than the region where the energy of the conduction band minimum is high. The energy of the conduction band minimum of the third oxide is higher than that of the region of the second oxide where the energy of the conduction band minimum is low. Side surfaces of the first oxide and the second oxide are covered with the third oxide.

Another embodiment of the present invention is a semiconductor device including a first conductor; a first insulator over the first conductor; a first oxide over the first insulator; a second oxide over the first oxide; a second conductor and a third conductor that are separate from each other over the second oxide; a third oxide over the first insulator, the second oxide, the second conductor, and the third conductor; a second insulator over the third oxide; a fourth conductor at least part of which overlaps with the second oxide and which is over the second insulator; and a third insulator over the first insulator, the second insulator, and the fourth conductor. The second oxide includes a first region and a second region. The first region includes an element M (M is one or more of Al, Ga, Si, B, Y, Ti, Fe, Ni, Ge, Zr, Mo, La, Ce, Nd, Hf, Ta, W, Mg, V, Be, and Cu). The second region includes one or both of In and Zn. The first region and the second region are positioned in a mosaic pattern. The third oxide includes In, Zn, and the element M The third oxide has a higher atomic ratio of the element M to In than the second oxide. Side surfaces of the first oxide and the second oxide are covered with the third oxide.

In the semiconductor device, it is preferable that the first region or the second region have a blurred periphery and a cloud-like composition.

In the semiconductor device, the atomic ratio of In to the element M and Zn in the second oxide is preferably 4:2:3 or in the neighborhood thereof. In the semiconductor device, the atomic ratio of In to the element M and Zn in the third oxide is preferably 1:1:1 or in the neighborhood thereof.

In the semiconductor device, the second oxide preferably includes a first crystal part and a second crystal part. The first crystal part preferably includes a region having c-axis alignment. The second crystal part preferably includes a nanocrystalline region.

In the semiconductor device, the third oxide preferably has higher crystallinity than the second oxide. In the semiconductor device, the third oxide preferably includes a region having c-axis alignment.

In the semiconductor device, part of the third oxide is preferably in contact with the top surface of the first insulator. In the semiconductor device, part of the third insulator is preferably in contact with the top surface of the first insulator.

In the semiconductor device, it is preferable that one side end portion of the second conductor be substantially aligned with one side end portion of the first oxide and one side end portion of the second oxide, and one side end portion of the third conductor be substantially aligned with the other side end portion of the first oxide and the other side end portion of the second oxide.

In the semiconductor device, it is preferable that part of the third oxide be in contact with the top surface of the second oxide in a region where the second conductor and the third conductor do not overlap with the second oxide, the second insulator be in contact with the top surface of the third oxide, and part of the third insulator be in contact with the top surface of the second insulator in a region where the fourth conductor does not overlap with the second insulator.

Another embodiment of the present invention is a method for manufacturing a transistor including the following steps: forming a first conductor; forming a first insulator over the first conductor; performing first heat treatment after the first insulator is formed; forming a first oxide over the first insulator; forming a second oxide over the first oxide at a substrate temperature of higher than or equal to 100° C. and lower than 140° C. with a proportion of an oxygen gas of higher than or equal to 0% and lower than or equal to 30%; forming a second conductor and a third conductor over the second oxide so that the second conductor and the third conductor are separate from each other; forming a third oxide over the first insulator, the second oxide, the second conductor, and the third conductor at a substrate temperature of higher than or equal to room temperature and lower than 200° C. with a proportion of an oxygen gas of higher than or equal to 70% to cover the first oxide and the second oxide; forming a second insulator over the third oxide; performing second heat treatment after the second insulator is formed; forming a fourth conductor over the second insulator; performing third heat treatment after the fourth conductor is formed; etching part of the fourth conductor selectively after the third heat treatment to form a fifth conductor at least part of which overlaps with the second oxide; and forming a third insulator over the first insulator, the second insulator, and the fifth conductor.

In the method, the first heat treatment, the second heat treatment, and the third heat treatment are preferably performed in a nitrogen gas atmosphere.

According to one embodiment of the present invention, a semiconductor device having favorable electrical characteristics can be provided. According to one embodiment of the present invention, a highly reliable semiconductor device can be provided. According to one embodiment of the present invention, a semiconductor device that can be miniaturized or highly integrated can be provided. According to one embodiment of the present invention, a semiconductor device with high productivity can be provided.

According to one embodiment of the present invention, a semiconductor device capable of retaining data for a long time can be provided. According to one embodiment of the present invention, a semiconductor device having a high data writing speed can be provided. According to one embodiment of the present invention, a semiconductor device having a high degree of design flexibility can be provided. According to one embodiment of the present invention, a semiconductor device capable of suppressing power consumption can be provided. According to one embodiment of the present invention, a novel semiconductor device can be provided.

Note that the descriptions of these effects do not disturb the existence of other effects. One embodiment of the present invention does not have to have all the effects listed above. Other effects are apparent from and can be derived from the description of the specification, the drawings, the claims, and the like.

BRIEF DESCRIPTION OF DRAWINGS

FIGS. 7A to 7J are cross-sectional views illustrating a method for manufacturing a transistor of one embodiment of the present invention.

BEST MODE FOR CARRYING OUT THE INVENTION

Figure 1A:
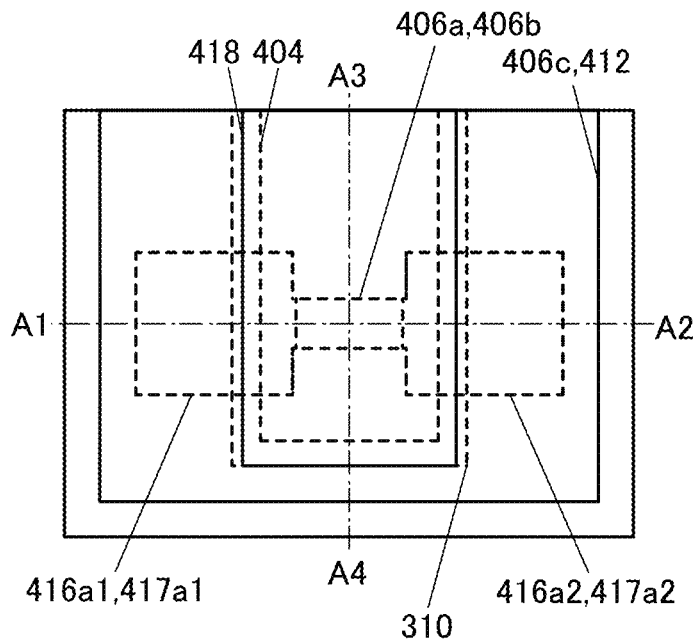
FIGS. 1A to 1C are a top view and cross-sectional views illustrating a structure of a transistor of one embodiment of the present invention.

Hereinafter, embodiments are described with reference to drawings. Note that the embodiments can be implemented with various modes, and it is readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. In the drawings, the same portions or portions having similar functions are denoted by the same reference numerals in different drawings, and explanation thereof is not repeated. Furthermore, the same hatching pattern is applied to portions having similar functions, and the portions are not especially denoted by reference numerals in some cases.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those that specify one embodiment of the present invention.

In this specification and the like, terms for describing arrangement, such as "over", "above", "under", and "below", are used for convenience in describing a positional relation between components with reference to drawings. Furthermore, the positional relationship between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. The transistor has a channel region between a drain (a drain terminal, a drain region, or a drain electrode) and a source (a source terminal, a source region, or a source electrode), and current can flow through the drain, the channel region, and the source. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an "effective channel width") is different from a channel width shown in a top view of a transistor (hereinafter referred to as an "apparent channel width") in some cases. For example, in a transistor having a gate electrode covering a side surface of a semiconductor, an effective channel width is greater than an apparent channel width, and its influence cannot be ignored in some cases. For example, in a miniaturized transistor having a gate electrode covering a side surface of a semiconductor, the proportion of a channel region formed in a side surface of a semiconductor is increased. In that case, an effective channel width is greater than an apparent channel width.

In such a case, an effective channel width is difficult to measure in some cases. For example, to estimate an effective channel width from a design value, it is necessary to assume that the shape of a semiconductor is known. Therefore, in the case where the shape of a semiconductor is not known accurately, it is difficult to measure an effective channel width accurately.

Therefore, in this specification, an apparent channel width is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width in some cases. Note that a channel length, a channel width, an effective channel width, an apparent channel width, a surrounded channel width, and the like can be determined by analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

Note that in this specification and the like, the term "electrically connected" includes the case where components are connected through an object having any electric function. There is no particular limitation on the "object having any electric function" as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

Note that in this specification and the like, a nitride oxide refers to a substance that contains more nitrogen than oxygen. An oxynitride refers to a compound that includes more oxygen than nitrogen. The content of each element can be measured by Rutherford backscattering spectrometry (RBS), for example.

In this specification and the like, the terms "film" and "layer" can be interchanged with each other. For example, the term "conductive layer" can be changed into the term "conductive film" in some cases. In addition, the term "insulating film" can be changed into the term "insulating layer" in some cases.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The terms "perpendicular" indicates that the angle formed between two straight lines is greater than or equal to 80° and less than or equal to 100°. Thus, the case where the angle is greater than or equal to 85° and less than or equal to 95° is also included. In addition, the term "substantially perpendicular" indicates that the angle formed between two straight lines is greater than or equal to 60° and less than or equal to 120°.

In this specification and the like, trigonal and rhombohedral crystal systems are included in a hexagonal crystal system.

Note that in this specification and the like, a barrier film is a film having a function of inhibiting penetration of oxygen and impurities such as hydrogen. When the barrier film has conductivity, the barrier film may be referred to as a conductive barrier film.

In this specification and the like, a transistor having normally-on characteristics means a transistor is on when a potential is not applied to the gate by a power source (e.g., a voltage ($V_g$) supplied to the gate of the transistor is 0 V). For example, when a transistor has normally-on characteristics, its threshold voltage might be a negative value.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS FET is a transistor including a metal oxide or an oxide semiconductor.

Embodiment 1

<Structure of Transistor>

Figure 1C:
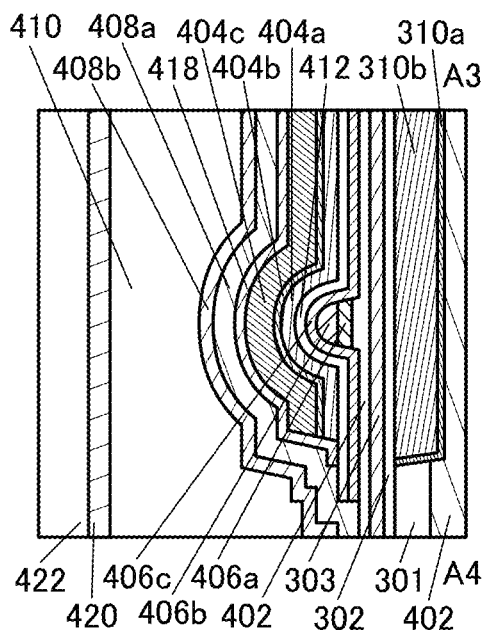
Figure 1B:
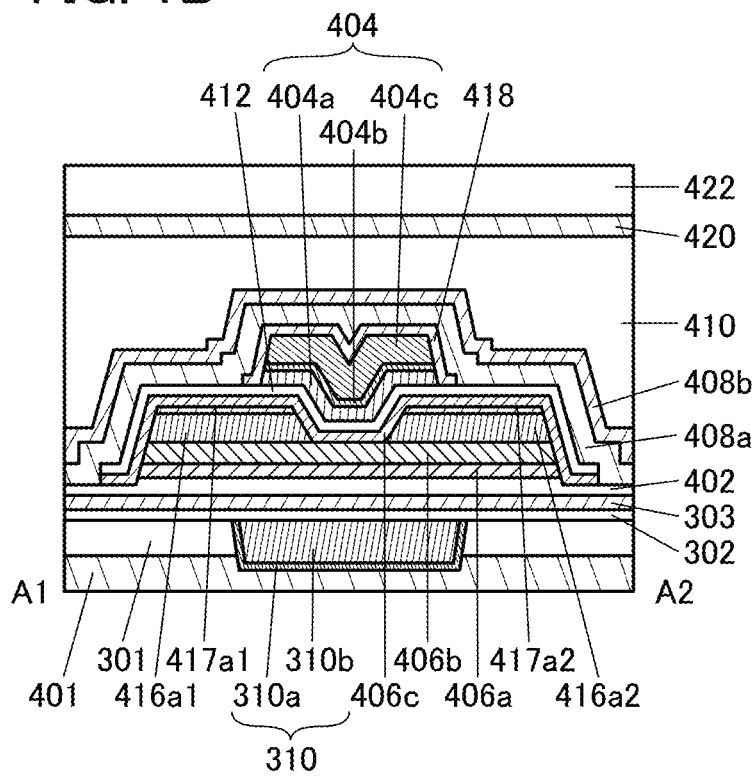

FIG. 1A is a top view of a transistor of an embodiment of the present invention. FIG. 1B is a cross-sectional view taken along dashed-dotted line A1-A2 in FIG. 1A. That is, FIG. 1B is a cross-sectional view in a channel length direction in a channel formation region of the transistor. FIG. 1C is a cross-sectional view taken along dashed-dotted line A3-A4 in FIG. 1A. That is, FIG. 1C is a cross-sectional view in a channel width direction of the transistor. Note that for simplification of the drawing, some components are not illustrated in the top view in FIG. 1A. Note that the channel length direction of a transistor means the direction in which carriers move between a source (source region or source electrode) and a drain (drain region or drain electrode) in a plane parallel to the substrate, and the channel width direction means the direction perpendicular to the channel length direction in the plane parallel to a substrate.

As illustrated in FIGS. 1A to 1C, the transistor includes a conductor 310 (a conductor 310a and a conductor 310b); an insulator 302, an insulator 303, and an insulator 402 over the conductor 310; an oxide 406a over the insulator 302, the insulator 303, and the insulator 402; an oxide 406b over the oxide 406a; a conductor 416a1 and a conductor 416a2 that are separate from each other over the oxide 406b; an oxide 406c over the insulator 402, the oxide 406b, and the conductors 416a1 and 416a2; an insulator 412 over the oxide 406c; a conductor 404 (a conductor 404a, a conductor 404b, and a conductor 404c) at least part of which overlaps with the oxide 406b and which is over the insulator 412; and an insulator 408a and an insulator 408b over the insulator 402, the insulator 412, and the conductor 404.

The conductor 310 is provided in an opening formed in an insulator 301. The conductor 310a is formed in contact with an inner wall of the opening in the insulator 301, and the conductor 310b is formed on the inner side. Here, the top surfaces of the conductors 310a and 310b can have substantially the same level as the top surface of the insulator 301. The conductor 310 functions as one gate electrode.

Here, a conductive material that is less likely to transmit impurities such as water and hydrogen is preferably used for the conductor 310a. Furthermore, the conductor 310a is preferably formed using tantalum, tantalum nitride, ruthenium, ruthenium oxide, or the like, and may be a single layer or a stack. This can suppress diffusion of impurities such as hydrogen and water from a layer below an insulator 401 to an upper layer through the conductor 310. Note that it is preferable that at least one of impurities such as a hydrogen atom, a hydrogen molecule, a water molecule, an oxygen atom, an oxygen molecule, a nitrogen atom, a nitrogen molecule, a nitrogen oxide molecule (e.g., $N_2O$, NO, and $NO_2$), and a copper atom be less likely to penetrate the conductor 310a. Furthermore, hereinafter, the same applies to the description of a conductive material that is less likely to transmit impurities. When the conductor 310a has a function of inhibiting penetration of oxygen, the conductivity of the conductor 310b can be prevented from being lowered because of oxidation.

The insulator 301 is positioned over the insulator 401 that is over a substrate (not illustrated). The insulator 401 can function as a barrier insulating film for preventing impurities such as water and hydrogen from entering the transistor from a lower layer. The insulator 401 is preferably formed using an insulating material that is less likely to transmit impurities such as water and hydrogen, and for example, is preferably formed using aluminum oxide or the like. This can suppress diffusion of impurities such as hydrogen and water to a layer positioned over the insulator 401. Note that it is preferable that at least one of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom be less likely to penetrate the insulator 401. Furthermore, hereinafter, the same applies to the description of an insulating material that is less likely to transmit impurities.

Moreover, the insulator 401 is preferably formed using an insulating material that is less likely to transmit oxygen (e.g., an oxygen atom or an oxygen molecule). With this material, oxygen contained in the insulator 402 or the like can be prevented from being diffused to lower layers. Thus, oxygen can be supplied to the oxide 406b effectively.

The insulator 303 is preferably formed using an insulating material that is less likely to transmit oxygen and impurities such as water and hydrogen, and for example, is preferably formed using aluminum oxide or hafnium oxide. This can suppress diffusion of impurities such as hydrogen and water from a layer positioned below the insulator 303 to a layer positioned over the insulator 303. Furthermore, oxygen contained in the insulator 402 or the like can be prevented from being diffused to lower layers.

The insulator 402 is preferably formed using an insulator from which oxygen is released by heating. Specifically, it is preferable to use an insulator with the following characteristics:

the amount of oxygen that is released from the insulator in thermal desorption spectroscopy (TDS) and converted into oxygen atoms is $1.0 \times 10^{18}$ atoms/cm$^3$ or more, preferably $3.0 \times 10^{20}$ atoms/cm$^3$ or more. Note that oxygen released by heating is also referred to as excess oxygen. When the insulator 402 formed using the insulator is formed in contact with the oxide 406a, oxygen can be supplied to the oxide 406b effectively.

Furthermore, the concentration of impurities such as water, hydrogen, and nitrogen oxide in the insulator 402 is preferably lowered. The amount of hydrogen released from the insulator 402 that is converted into hydrogen molecules per area of the insulator 402 is less than or equal to $2 \times 10^{15}$ molecules/cm$^2$, preferably less than or equal to $1 \times 10^{15}$ molecules/cm$^2$, further preferably less than or equal to $5 \times 10^{14}$ molecules/cm$^2$ in TDS analysis in the range of 50° C. to 500° C., for example.

The insulators 302, 303, and 402 serve as a gate insulating film.

Next, metal oxides that can be used as the oxides 406a to 406c are described.

The metal oxides used as the oxides 406a to 406c preferably include at least indium. In particular, indium and zinc are preferably contained. In addition, the element M (M is one or more of gallium, aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) is preferably contained.

The metal oxide, for example, the oxide 406b may contain nitrogen. Specifically, the nitrogen concentration in the metal oxide measured by secondary ion mass spectrometry (SIMS) may be $1 \times 10^{16}$ atoms/cm$^3$ or higher, preferably $1 \times 10^{17}$ atoms/cm$^3$ or higher and $2 \times 10^{22}$ atoms/cm$^3$ or lower. Note that a metal oxide to which nitrogen is added tends to have a smaller band gap and thus have improved conductivity. Thus, the metal oxide in this specification and the like includes a metal oxide to which nitrogen or the like is added. Moreover, a metal oxide containing nitrogen may be referred to as metal oxynitride.

The energy gap of the metal oxide is 2 eV or more, preferably 2.5 eV or more. In this manner, the off-state current of the transistor can be reduced by using a metal oxide having a wide energy gap.

The metal oxide preferably has a non-single-crystal structure. The non-single-crystal structure includes, for example, a c-axis aligned crystalline oxide semiconductor (CAAC-OS) that is described later, a polycrystalline structure, a microcrystalline structure, or an amorphous structure. Among the non-single-crystal structure, the amorphous structure has the highest density of defect states.

Here, the case where the metal oxide contains indium, the element M, and zinc is considered. The terms of the atomic ratio of indium to the element M and zinc contained in the metal oxide are denoted by [In], [M], and [Zn], respectively.

Preferred ranges of the atomic ratio of indium to the element M and zinc contained in the metal oxide that can be used for the oxides 406a to 406c are described below with reference to FIGS. 6A to 6C. Note that the proportion of oxygen atoms is not shown in FIGS. 6A to 6C. The terms of the atomic ratio of indium to the element M and zinc contained in the metal oxide are denoted by [In], [M], and [Zn], respectively.

Figure 6A:
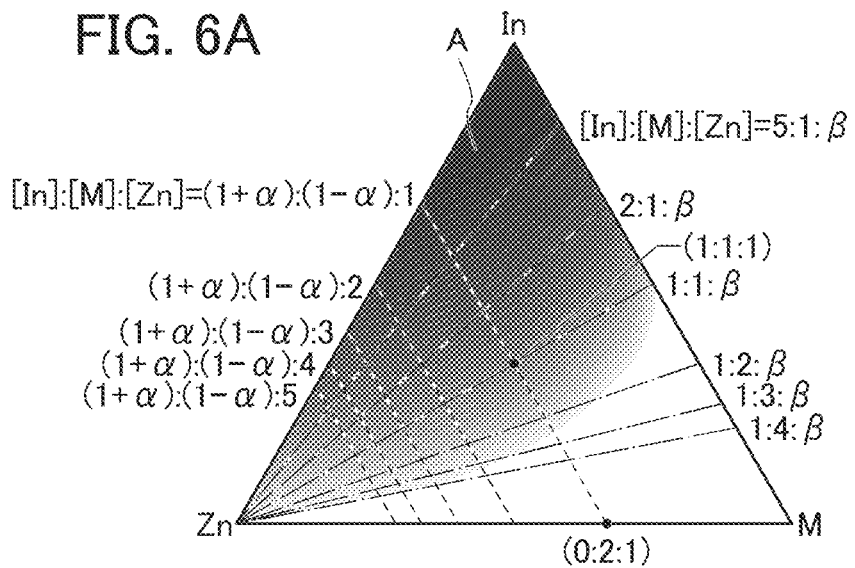
FIGS. 6A to 6C each illustrate an atomic ratio range of a metal oxide of the present invention.
Figure 6B:
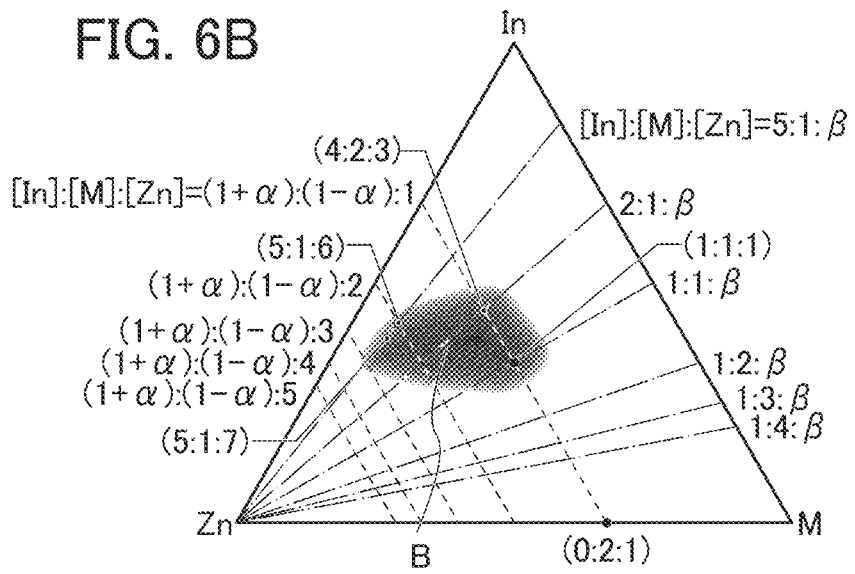
Figure 6C:
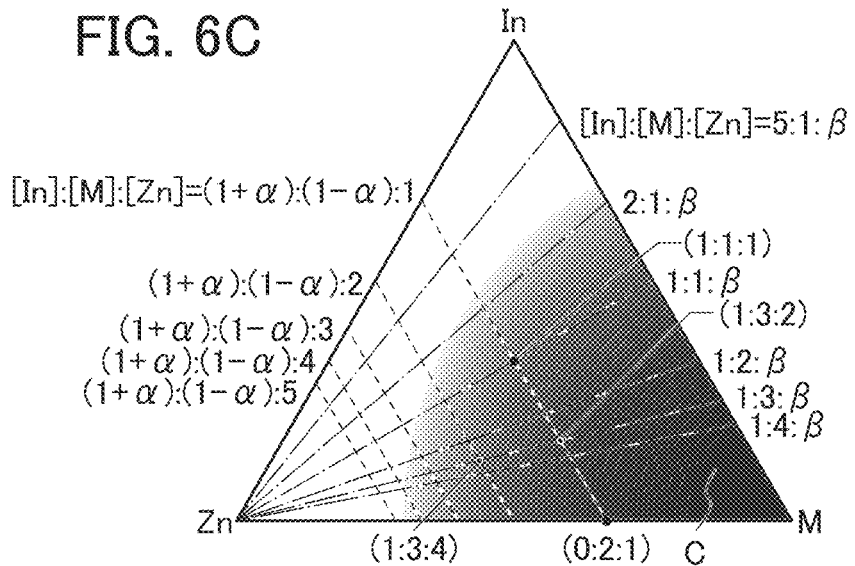

In FIGS. 6A to 6C, broken lines indicate a line where the atomic ratio [In]:[M]:[Zn] is $(1+\alpha):(1-\alpha):1$, where $-1 \leq \alpha \leq 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $5:1:\beta$, where $\beta \geq 0$, a line where the atomic ratio [In]:[M]:[Zn] is $2:1:\beta$, a line where the atomic ratio [In]:[M]:[Zn] is $1:1:\beta$, a line where the atomic ratio [In]:[M]:[Zn] is $1:2:\beta$, a line where the atomic ratio [In]:[M]:[Zn] is $1:3:\beta$, and a line where the atomic ratio [In]:[M]:[Zn] is $1:4:\beta$.

The metal oxides shown in FIGS. 6A to 6C with an atomic ratio of [In]:[M]:[Zn]=0:2:1 and the vicinity thereof are likely to have a spinel crystal structure.

A plurality of phases (e.g., two phases or three phases) exist in the metal oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the metal oxide, a grain boundary might be formed between different crystal structures.

A region A in FIG. 6A shows an example of the preferred ranges of the atomic ratio of indium to the element M and zinc contained in a metal oxide.

In addition, the metal oxide containing indium in a higher proportion can have high carrier mobility (electron mobility). Thus, a metal oxide having a high content of indium has higher carrier mobility than a metal oxide having a low content of indium.

In contrast, when the indium content and the zinc content in a metal oxide become lower, carrier mobility becomes lower. Thus, with an atomic ratio of [In]:[M]:[Zn]=0:1:0 and the vicinity thereof (e.g., a region C in FIG. 6C), insulation performance becomes better.

For example, the metal oxide used as the oxide 406b preferably has an atomic ratio represented by the region A in FIG. 6A. The metal oxide with the atomic ratio has high carrier mobility. In contrast, the metal oxides used as the oxides 406a and 406c preferably have atomic ratios represented by the region C in FIG. 6C. The metal oxides with the atomic ratios have relatively high insulating properties.

A metal oxide having an atomic ratio in the region A, particularly in a region B in FIG. 6B, has high carrier mobility and high reliability and is excellent.

Note that the region B includes an atomic ratio of [In]:[M]:[Zn]=4:2:3 to 4.1 and the vicinity thereof. The vicinity includes an atomic ratio of [In]:[M]:[Zn]=5:3:4. Note that the region B includes an atomic ratio of [In]:[M]:[Zn]=5:1:6 and the vicinity thereof and an atomic ratio of [In]:[M]:[Zn] =5:1:7 and the vicinity thereof.

In the case where the metal oxide is formed of an In-M-Zn oxide, it is preferable to use a target including a polycrystalline In-M-Zn oxide as the sputtering target. Note that the atomic ratio of the formed metal oxide varies from the above atomic ratios of metal elements of the sputtering targets in a range of ±40%. For example, when a sputtering target with an atomic ratio of In:Ga:Zn=4:2:4.1 is used for forming the metal oxide, the atomic ratio of In to Ga and Zn in the formed metal oxide may be 4:2:3 or in the neighborhood of 4:2:3. When a sputtering target with an atomic ratio of In:Ga:Zn=5:1:7 is used for forming the metal oxide, the atomic ratio of In to Ga and Zn in the formed metal oxide may be 5:1:6 or in the neighborhood of 5:1:6.

Note that the property of a metal oxide is not uniquely determined by an atomic ratio. Even with the same atomic ratio, the property of a metal oxide might be different depending on a formation condition. For example, in the case where the metal oxide is deposited with a sputtering apparatus, a film having an atomic ratio deviated from the atomic ratio of a target is formed. In particular, [Zn] in the film might be smaller than [Zn] in the target depending on the substrate temperature in deposition. Thus, the illustrated regions each represent an atomic ratio with which a metal oxide tends to have specific characteristics, and boundaries of the regions A to C are not clear.

An oxide semiconductor with low carrier density is preferably used for the transistor. A highly purified intrinsic or substantially highly purified intrinsic metal oxide has few carrier generation sources and thus can have a low carrier density. The highly purified intrinsic or substantially highly purified intrinsic metal oxide has a low density of defect states and accordingly has a low density of trap states in some cases.

Charge trapped by the trap states in the metal oxide takes a long time to be released and may behave like fixed charge. Thus, a transistor whose channel region is formed in a metal oxide having a high density of trap states has unstable electrical characteristics in some cases.

In order to obtain stable electrical characteristics of the transistor, it is effective to reduce the concentration of impurities in the metal oxide. In addition, in order to reduce the concentration of impurities in the metal oxide, the concentration of impurities in a film that is adjacent to the metal oxide is preferably reduced. Examples of impurities include hydrogen, an alkali metal, an alkaline earth metal, and silicon.

Here, the influence of impurities in the metal oxide is described.

When silicon or carbon that is one of Group 14 elements is contained in the metal oxide, defect states are formed. Thus, the concentration of silicon or carbon in the metal oxide and around an interface with the metal oxide measured by SIMS is set lower than or equal to $2 \times 10^{18}$ atoms/cm$^3$, preferably lower than or equal to $2 \times 10^{17}$ atoms/cm$^3$.

When the metal oxide contains an alkali metal or an alkaline earth metal, defect states are formed and carriers are generated, in some cases. Thus, a transistor including a metal oxide that contains an alkali metal or an alkaline earth metal is likely to be normally-on. Therefore, it is preferable to reduce the concentration of an alkali metal or an alkaline earth metal in the metal oxide. Specifically, the concentration of an alkali metal or an alkaline earth metal in the metal oxide measured by SIMS is set lower than or equal to $1 \times 10^{18}$ atoms/cm$^3$, preferably lower than or equal to $2 \times 10^{16}$ atoms/cm$^3$.

Hydrogen contained in a metal oxide reacts with oxygen bonded to a metal atom to be water, and thus causes an oxygen vacancy (Vo), in some cases. Due to entry of hydrogen into the oxygen vacancy (Vo), an electron serving as a carrier is generated in some cases. Furthermore, in some cases, bonding of part of hydrogen to oxygen bonded to a metal atom causes generation of an electron serving as a carrier. Thus, a transistor including a metal oxide that contains hydrogen is likely to be normally-on. Accordingly, it is preferable that hydrogen in the metal oxide be reduced as much as possible. Specifically, the hydrogen concentration of the metal oxide measured by SIMS is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, and still further preferably lower than $1 \times 10^{18}$ atoms/cm$^3$.

The oxygen vacancies ($V_o$) in the metal oxide can be reduced by introduction of oxygen into the metal oxide. That is, the oxygen vacancies ($V_o$) in the metal oxide disappear when the oxygen vacancies ($V_o$) are filled with oxygen. Accordingly, diffusion of oxygen in the metal oxide can reduce the oxygen vacancies ($V_o$) in a transistor and improve the reliability of the transistor.

As a method for introducing oxygen into the metal oxide, for example, an oxide in which oxygen content is higher than that in the stoichiometric composition is provided in contact with the metal oxide. That is, in the oxide, a region including oxygen in excess of that in the stoichiometric composition (hereinafter also referred to as an excess oxygen region) is preferably formed. In particular, in the case of using a metal oxide in a transistor, an oxide including an excess oxygen region is provided in a base film, an interlayer film, or the like in the vicinity of the transistor, whereby oxygen vacancies in the transistor are reduced, and the reliability can be improved.

When a metal oxide with sufficiently reduced impurity concentration is used for a channel formation region or the like in a transistor, the transistor can have stable electrical characteristics.

Figure 2:
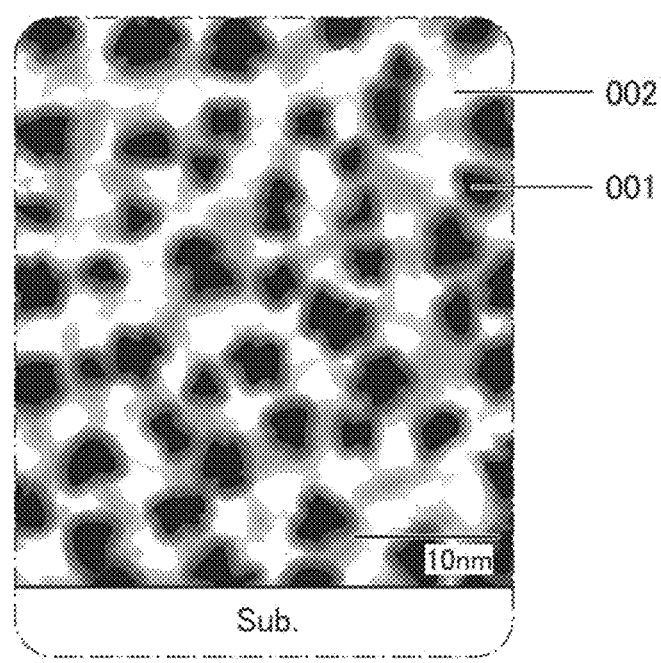
FIG. 2 is a conceptual diagram of a composition of a metal oxide.

The metal oxide used as the oxide 406b preferably has a cloud-aligned composite (CAC) composition. Here, FIG. 2 shows a conceptual diagram of the metal oxide having the CAC composition. Note that in this specification and the like, in the case where the metal oxide used as the oxide 406b functions as a semiconductor, the metal oxide is defined as a cloud-aligned composite oxide semiconductor (CAC-OS).

For example, in the CAC-OS, as illustrated in FIG. 2, elements included in the metal oxide are unevenly distributed, and regions 001 mainly including an element and regions 002 mainly including another element are formed. The regions 001 and 002 are mixed to form a mosaic pattern. In other words, the CAC-OS has a composition in which elements included in a metal oxide are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed and regions including the metal element(s) are mixed is referred to as a mosaic pattern or a patch-like pattern. The regions each have a size of greater than or equal to 0.5 nm and less than or equal to 10 nm, preferably greater than or equal to 1 nm and less than or equal to 2 nm, or a similar size.

For example, an In-M-Zn oxide with the CAC composition has a composition in which materials are separated into an indium oxide (InO$_{X1}$, where X1 is a real number greater than 0) or an indium zinc oxide ($In_{X2}Zn_{Y2}O_{Z2}$, where X2, Y2, and Z2 are real numbers greater than 0), and an oxide including the element M, and a mosaic pattern is formed. Then, $InO_{X1}$ or $In_{X2}Zn_{Y2}O_{Z2}$ forming the mosaic pattern is distributed in the film. This composition is also referred to as a cloud-like composition.

In other words, the metal oxide used for the oxide 406b includes at least two oxides or materials selected from an In oxide, an In-M oxide, an M oxide, an M-Zn oxide, an In—Zn oxide, and In-M-Zn oxide.

Typically, the metal oxide used as the oxide 406b includes at least two or more oxides selected from an In oxide, an In—Zn oxide, an In—Al—Zn oxide, an In—Ga—Zn oxide, an In—Y—Zn oxide, an In—Cu—Zn oxide, an In—V—Zn oxide, an In—Be—Zn oxide, an In—B—Zn oxide, an In—Si—Zn oxide, an In—Ti—Zn oxide, an In—Fe—Zn oxide, an In—Ni—Zn oxide, an In—Ge—Zn oxide, an In—Zr—Zn oxide, an In-Mo—Zn oxide, an In—La—Zn oxide, an In—Ce—Zn oxide, an In—Nd—Zn oxide, an In—Hf—Zn oxide, an In—Ta—Zn oxide, an In—W—Zn oxide, and an In—Mg—Zn oxide. That is, the metal oxide used as the oxide 406b can be referred to as a composite metal oxide including a plurality of materials or a plurality of components.

Here, let a concept in FIG. 2 illustrate an In-M-Zn oxide with the CAC composition. In this case, it can be said that the region 001 is a region including an oxide including the element M as a main component and the region 002 is a region including $In_{X2}Zn_{Y2}O_{Z2}$ or $InO_{X1}$ as a main component. Surrounding portions of the region including an oxide including the element M as a main component and the region including $In_{X2}Zn_{Y2}O_{Z2}$ or $InO_{X1}$ as a main component, and a region including at least zinc are unclear (blurred), so that boundaries are not clearly observed in some cases.

In other words, an In-M-Zn oxide with the CAC composition is a metal oxide in which a region including an oxide including the element M as a main component and a region including $In_{X2}Zn_{Y2}O_{Z2}$ or $InO_{X1}$ as a main component are mixed. Accordingly, the metal oxide is referred to as a composite metal oxide in some cases. Note that in this specification and the like, for example, when the atomic ratio of In to the element M in the region 002 is greater than the atomic ratio of In to the element M in the region 001, the region 002 has higher In concentration than the region 001.

Note that in the metal oxide having the CAC composition, a stacked-layer structure including two or more films with different atomic ratios is not included. For example, a two-layer structure of a film including In as a main component and a film including the oxide including the element M as a main component is not included.

The crystal structure is a secondary element for the CAC composition. In the In-M-Zn oxide with the CAC composition, crystal structures of the region 001 and the region 002 are not particularly limited. The region 001 and the region 002 may have different crystal structures.

For example, the In-M-Zn oxide with the CAC composition is preferably an oxide semiconductor having a non-single-crystal structure. Examples of a non-single-crystal structure include a CAAC-OS, a polycrystalline oxide semiconductor, a nanocrystalline oxide semiconductor (nc-OS), an amorphous-like oxide semiconductor (a-like OS), and an amorphous oxide semiconductor.

For example, the metal oxide used as the oxide 406b preferably has one or both of the nc structure and the CAAC structure.

The CAAC-OS has a CAAC structure. An oxide semiconductor having a CAAC structure has c-axis alignment, its nanocrystals are connected in the a-b plane direction, and the crystal structure has distortion. Note that the distortion is a portion where the direction of a lattice arrangement changes between a region with a regular lattice arrangement and another region with a regular lattice arrangement in a region in which nanocrystals are connected.

The shape of the nanocrystal is basically hexagon. However, the shape is not always a regular hexagon and is a non-regular hexagon in some cases. A pentagonal lattice arrangement, a heptagonal lattice arrangement, and the like are included in the distortion in some cases. Accordingly, in the CAAC-OS, a grain boundary cannot be clearly observed also in the vicinity of the distortion. That is, formation of a grain boundary is inhibited due to the distortion of lattice arrangement. This is probably because the CAAC-OS can tolerate distortion owing to a low density of the atomic arrangement in the a-b plane direction, the interatomic bond distance changed by substitution of a metal element, and the like.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, the nc-OS cannot be distinguished from an a-like OS or an amorphous oxide semiconductor, depending on an analysis method.

The a-like OS is an oxide semiconductor having a structure between the nc-OS and the amorphous oxide semiconductor. The a-like OS includes a void or a low-density region. That is, the a-like OS has an unstable structure, compared to the nc-OS and the CAAC-OS.

For example, the CAC-OS preferably has the CAAC structure. The CAAC structure is formed in a region including the region 001 or the region 002 in some cases. That is, in the CAC-OS, a region to be the CAAC-OS is formed in a several-nanometer to several-tens of nanometer region.

The CAAC-OS is an oxide semiconductor with high crystallinity. In contrast, in the CAAC-OS, a reduction in electron mobility due to the grain boundary is less likely to occur because a clear grain boundary cannot be observed. Thus, with the CAAC-OS, a metal oxide is physically stable; thus, a metal oxide that is resistant to heat and has high reliability can be provided.

Specifically, of the CAC-OS, an In—Ga—Zn oxide with the CAC composition (such an In—Ga—Zn oxide may be particularly referred to as CAC-IGZO) is described. In the CAC-OS of an In—Ga—Zn oxide, materials are separated into $InO_{X1}$ or $In_{X2}Zn_{Y2}O_{Z2}$, and indium gallium zinc oxide (hereinafter $In_aGa_bZn_cO_d$, where a, b, c, and d are real numbers greater than 0) for example, and a mosaic pattern is formed. Then, $InO_{X1}$ or $In_{X2}Zn_{Y2}O_{Z2}$ forming the mosaic pattern is a cloud-like metal oxide.

In other words, an In—Ga—Zn oxide including a CAC-OS is a composite metal oxide having a composition in which a region including $In_aGa_bZn_cO_d$ as a main component and a region including $In_{X2}Zn_{Y2}O_{Z2}$ or $InO_{X1}$ as a main component are mixed. Surrounding portions of the region including $In_aGa_bZn_cO_d$ as a main component and the region including $In_{X2}Zn_{Y2}O_{Z2}$ or $InO_{X1}$ as a main component are unclear (blurred), so that a boundary is not clearly observed in some cases.

For example, in the conceptual view in FIG. 2, the region 001 corresponds to the region including $In_aGa_bZn_cO_d$ as a main component, and the region 002 corresponds to the region including $In_{X2}Zn_{Y2}O_{Z2}$ or $InO_{X1}$ as a main component. The region including $In_aGa_bZn_cO_d$ as a main component and the region including $In_{X2}Zn_{Y2}O_{Z2}$ or $InO_{X1}$ as a main component may each be referred to as a nanoparticle. The diameter of the nanoparticle is greater than or equal to 0.5 nm and less than or equal to 10 nm, typically greater than or equal to 1 nm and less than or equal to 2 nm. Surrounding portions of the nanoparticles are unclear (blurred), so that a boundary is not clearly observed in some cases.

The sizes of the region 001 and the region 002 can be measured with energy dispersive X-ray spectroscopy (EDX) mapping images obtained by EDX. For example, the diameter of the region 001 is greater than or equal to 0.5 nm and less than or equal to 10 nm, or greater than or equal to 1 nm and less than or equal to 2 nm in the EDX mapping image of a cross-sectional photograph in some cases. The density of an element that is a main component is gradually lowered from the central portion of the region toward the surrounding portion. For example, when the number (abundance) of atoms of an element countable in an EDX mapping image gradually changes from the central portion toward the surrounding portion, the surrounding portion of the region is unclear (blurred) in the EDX mapping of the cross-sectional photograph. For example, from the central portion toward the surrounding portion in the region including $In_aGa_bZn_cO_d$ as a main component, the number of Ga atoms gradually reduces and the numbers of In atoms and Zn atoms gradually increase, so that the region including $In_{X2}Zn_{Y2}O_{Z2}$ as a main component gradually appears. Accordingly, the surrounding portion of the region including $In_aGa_bZn_cO_d$ as a main component is unclear (blurred) in the EDX mapping image.

A crystal structure of the In—Ga—Zn oxide with the CAC composition is not particularly limited. The region 001 and the region 002 may have different crystal structures.

Here, an In—Ga—Zn—O-based metal oxide is referred to as IGZO in some cases, and a compound including In, Ga, Zn, and O is also known as IGZO. A crystalline compound can be given as an example of the In—Ga—Zn—O-based metal oxide. The crystalline compound has a single crystal structure, a polycrystalline structure, or a c-axis aligned crystalline (CAAC) structure. Note that the CAAC structure is a layered crystal structure in which a plurality of IGZO nanocrystals have c-axis alignment and are connected in the a-b plane direction without alignment.

For example, the In—Ga—Zn oxide with the CAC composition is preferably an oxide semiconductor having a non-single-crystal structure. In particular, the In—Ga—Zn oxide having the CAC composition preferably includes a CAAC-IGZO. Moreover, an area of the CAAC-IGZO preferably includes the region 001. When the In—Ga—Zn oxide includes the CAAC-IGZO, the In—Ga—Zn oxide is physically stable as a metal oxide, and thus a highly reliable In—Ga—Zn oxide resistant to heat can be provided.

The crystallinity of the In—Ga—Zn oxide including a CAC-OS can be analyzed by electron diffraction. For example, a region with high luminance in a ring pattern and a plurality of spots in the region with high luminance in a ring pattern are observed in some cases in an electron diffraction pattern image.

Here, the conductivity of the region including $In_{X2}Zn_{Y2}O_{Z2}$ or $InO_{X1}$ as a main component is higher than that of the region including $In_aGa_bZn_cO_d$ as a main component. In other words, when carriers flow through the regions including $In_{X2}Zn_{Y2}O_{Z2}$ or $InO_{X1}$ as a main component, the conductivity of an oxide semiconductor is exhibited. Accordingly, when the regions including $In_{X2}Zn_{Y2}O_{Z2}$ or $InO_{X1}$ as a main component are distributed in an oxide semiconductor like a cloud, high field-effect mobility (μ) can be achieved. The region including $In_{X2}Zn_{Y2}O_{Z2}$ or $InO_{X1}$ as a main component can be said to be a semiconductor region whose properties are close to those of a conductor.

In contrast, the conductivity of the region including $In_aGa_bZn_cO_d$ or the like as a main component is lower than that of the region including $In_{X2}Zn_{Y2}O_{Z2}$ or $InO_{X1}$ as a main component. In other words, when the regions including InaGabZncOd or the like as a main component are distributed in a metal oxide, leakage current can be suppressed and favorable switching operation can be achieved. The region including $In_aGa_bZn_cO_d$ or the like as a main component can be said to be a semiconductor region whose properties are close to those of an insulator.

Accordingly, when the In—Ga—Zn oxide including an CAC-OS is used for a semiconductor element, the property derived from $In_aGa_bZn_cO_d$ or the like and the property derived from $In_{X2}Zn_{Y2}O_{Z2}$ or $InO_{X1}$ complement each other, whereby high on-state current ($I_{on}$), high field-effect mobility (μ) and low off-state current ($I_{off}$) can be achieved.

A semiconductor element including the In—Ga—Zn oxide including an CAC-OS has high reliability. Thus, the In—Ga—Zn oxide including an CAC-OS is suitably used in a variety of semiconductor devices typified by a memory device.

Next, the case where the metal oxide is used as a semiconductor in a transistor is described.

With the use of the metal oxide as a semiconductor in a transistor, the transistor can have high field-effect mobility and high switching characteristics. In addition, the transistor can have high reliability.

Figure 3A:
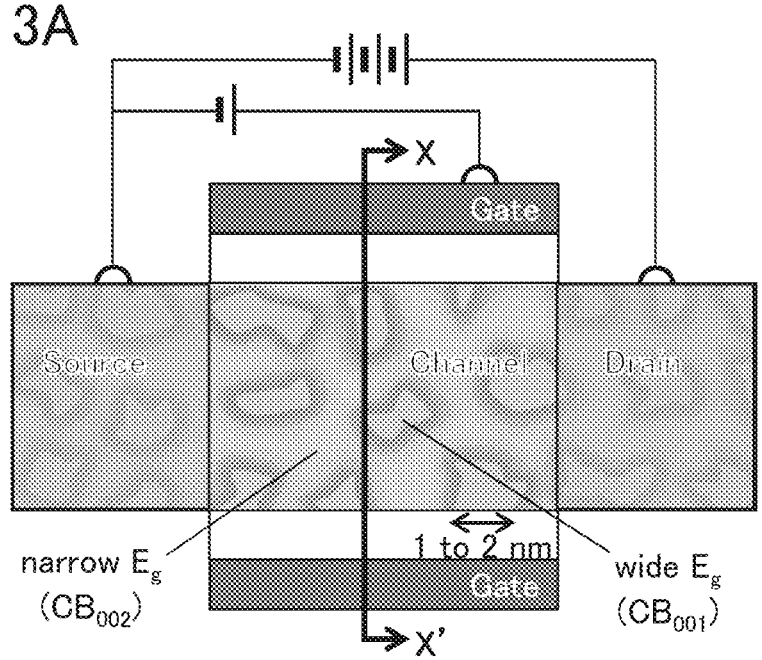
FIGS. 3A to 3C are schematic diagrams for a transistor and the distribution of an energy level of the transistor.

FIG. 3A is a schematic view of a transistor including the metal oxide in a channel region. The transistor in FIG. 3A includes a source, a drain, a first gate, a second gate, a first gate insulating portion, a second gate insulating portion, and a channel portion. The resistance of a channel portion of a transistor can be controlled by application of a potential to a gate. That is, conduction (the on state of the transistor) or non-conduction (the off state of the transistor) between the source and the drain can be controlled by a potential applied to the first gate or the second gate.

The channel portion includes a CAC-OS in which the regions 001 having a first band gap and the regions 002 having a second band gap are distributed like a cloud. The first band gap is larger than the second band gap.

For example, the case where the In—Ga—Zn oxide having the CAC composition is used as the CAC-OS in the channel portion is described. The In—Ga—Zn oxide having the CAC composition has a composition in which materials are separated into, as the region 001, a region including $In_aGa_bZn_cO_d$ as a main component and having higher Ga concentration than the region 002, and, as the region 002, a region including $In_{X2}Zn_{Y2}O_{Z2}$ or $InO_{X1}$ as a main component and having higher In concentration than the region 001, and a mosaic pattern is formed. $InO_{X1}$ or $In_{X2}Zn_{Y2}O_{Z2}$, and $In_aGa_bZn_cO_d$ are distributed in the film. This composition is also referred to as a cloud-like composition. The region 001 including $In_aGa_bZn_cO_d$ as a main component has a band gap larger than that of the region 002 including $In_{X2}Zn_{Y2}O_{Z2}$ or $InO_{X1}$ as a main component.

Figure 3B:
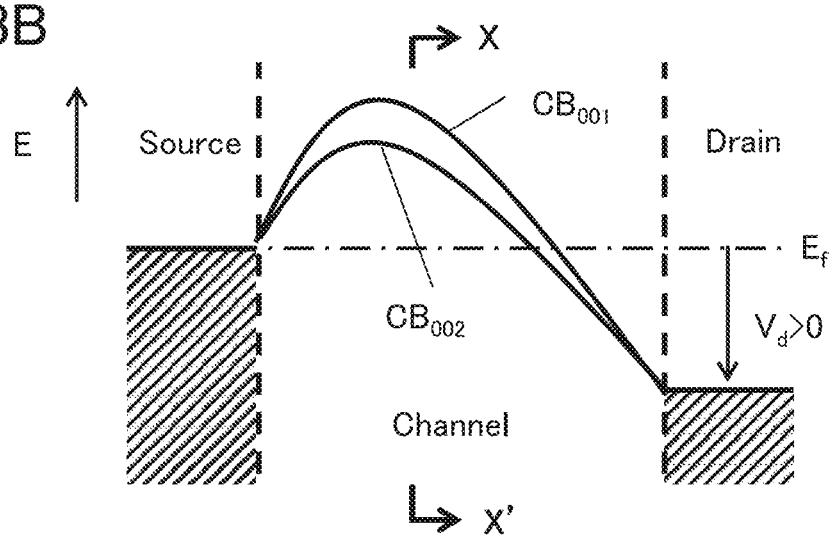
Figure 3C:
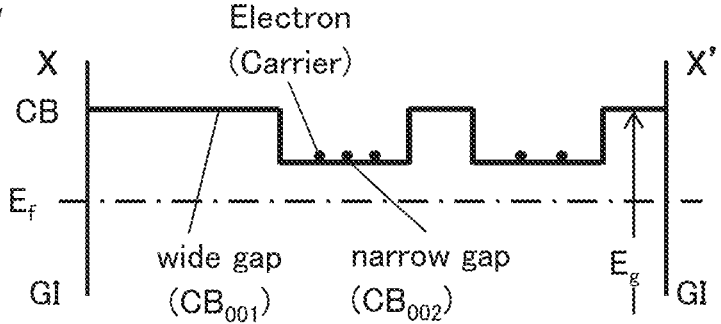

A conduction model of the transistor including the CAC-OS in the channel portion illustrated in FIG. 3A is described. FIG. 3B is a schematic view showing distribution of energy levels between the source and the drain of the transistor illustrated in FIG. 3A. FIG. 3C is a conduction band diagram on the solid line X-X' in the transistor illustrated in FIG. 3A. Note that in each conduction band diagram, a solid line indicates the energy of the conduction band minimum. A dashed line Ef indicates the energy of the quasi-Fermi level of electrons. Here, a negative voltage is applied between the gate and the source as a first gate voltage and a drain voltage ($V_d>0$) is applied between the source and the drain.

When a negative gate voltage is applied to the transistor illustrated in FIG. 3A, an energy of a conduction band minimum $CB_{001}$ derived from the region 001 and an energy of a conduction band minimum $CB_{002}$ derived from the region 002 are formed between the source and the drain as illustrated in FIG. 3B. Since the first band gap is larger than the second band gap, the potential barrier of the energy of the conduction band minimum $CB_{001}$ is higher than the potential barrier of the energy of the conduction band minimum $CB_{002}$. That is, the maximum value of the potential barrier in the channel portion is a value derived from the region 001. Thus, the use of the CAC-OS in the channel portion in a transistor can suppress leakage current and achieve high switching characteristics.

As illustrated in FIG. 3C, the band gap of the region 001 having the first band gap is relatively wider than the band gap of the region 002 having the second band gap; thus, the energy of the conduction band minimum derived from the region 001 having the first band gap can exist at a relatively higher level than the energy of the conduction band minimum derived from the region 002 having the second band gap.

For example, it is assumed that a component of the region 001 having the first band gap is derived from the In—Ga—Zn oxide (In:Ga:Zn=1:1:1[atomic ratio]), and a component of the region 002 having the second band gap is derived from an In—Zn oxide (In:Zn=2:3[atomic ratio]). In this case, the first band gap is 3.3 eV or a value in the vicinity thereof, and the second band gap is 2.4 eV or a value in the vicinity thereof. Values obtained by measurement of single films of respective materials with an ellipsometer are used as the values of the band gaps.

In the above assumption, the difference between the first band gap and the second band gap is 0.9 eV. In one embodiment of the present invention, the difference between the first band gap and the second band gap is at least 0.1 eV or more. Note that the position of the energy of the valence band maximum derived from the region 001 having the first band gap is different from the position of the energy of the valence band maximum derived from the region 002 having the second band gap in some cases; thus, the difference between the first band gap and the second band gap is preferably 0.3 eV or more, further preferably 0.4 eV or more.

In the case of the above assumption, when carriers flow through the CAC-OS, the carriers flow owing to an In—Zn oxide that has the second band gap, i.e., a narrow gap. At this time, the carriers overflow the second band gap into the In—Ga—Zn oxide side that has the first band gap, i.e., a wide gap. In other words, carriers are easily generated in the In—Zn oxide that has a narrow gap, and the carriers move to the In—Ga—Zn oxide that has a wide gap.

In the metal oxide where the channel portion is formed, the regions 001 and the regions 002 form a mosaic pattern and are irregularly unevenly distributed. For this reason, the conduction band diagram on the solid line X-X' is merely an example.

Figure 4A:
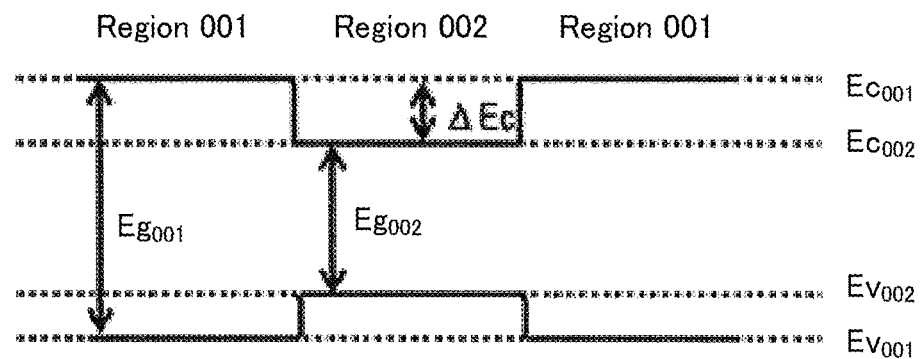
FIGS. 4A to 4C show models of schematic band diagrams of the transistor.

It is basically acceptable as long as a band in which the region 002 is between the regions 001 is formed as shown in FIG. 4A. Alternatively, a band in which the region 001 is between the regions 002 is formed.

Figure 4B:
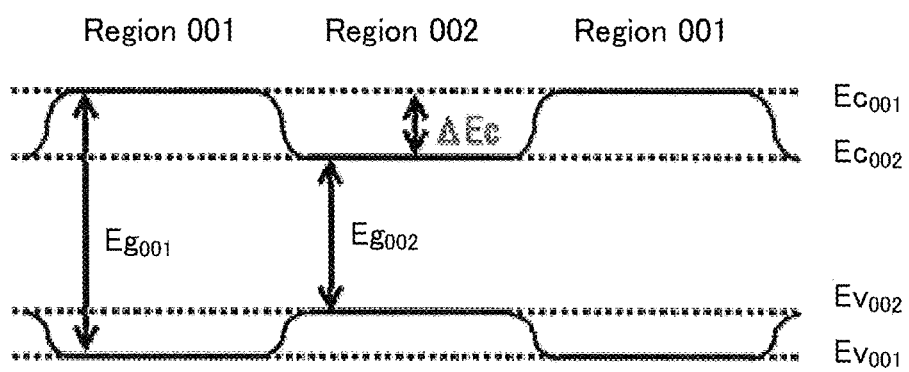
Figure 4C:
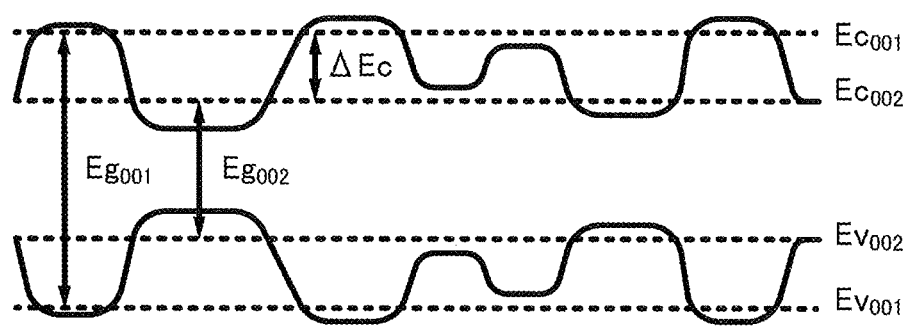

In a connection portion of the region 001 having the first band gap and the region 002 having the second band gap in the actual CAC-OS, an aggregation state and the composition of the regions probably become unstable. Accordingly, as illustrated in FIGS. 4B and 4C, the bands change not discontinuously but continuously in some cases. In other words, the first band gap and the second band gap work together when carriers flow through the CAC-OS.

Figure 5A:
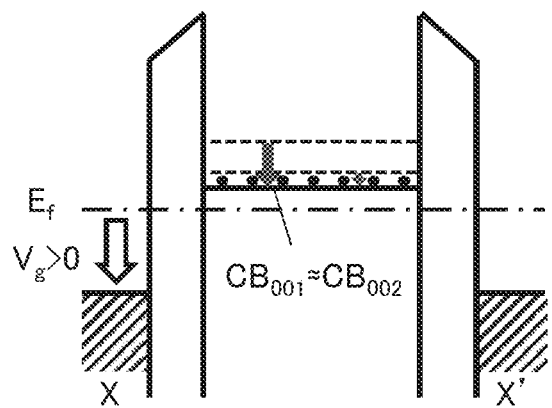
FIGS. 5A to 5C show models of schematic band diagrams of the transistor.
Figure 5B:
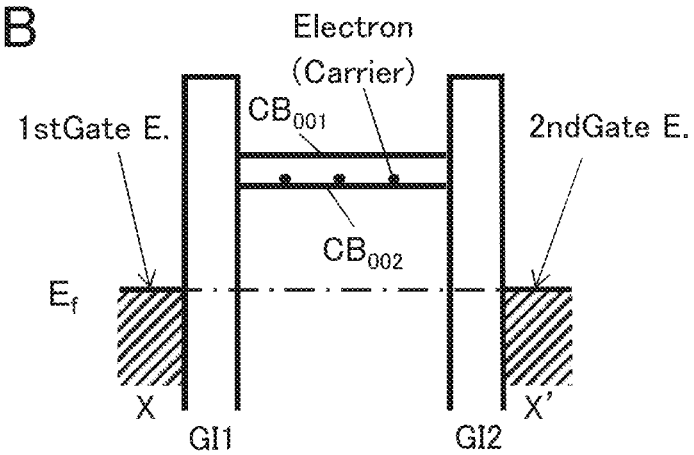
Figure 5C:
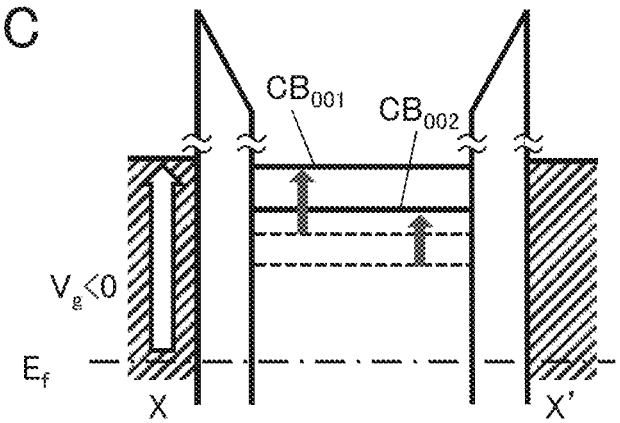

FIGS. 5A to 5C are schematic model diagrams of band diagrams on the solid line X-X' in the transistor illustrated in FIG. 3A. When a voltage is applied to the first gate, the same voltage is simultaneously applied to the second gate. FIG. 5A shows a state (on state) in which, as a first gate voltage $V_g$, a positive voltage ($V_g>0$) is applied between each of the gates and the source. FIG. 5B shows a state in which the first gate voltage $V_g$ is not applied ($V_g=0$). FIG. 5C shows a state (off state) in which, as the first gate voltage $V_g$, a negative voltage ($V_g<0$) is applied between each of the gates and the source. Note that in each conduction band diagram, a solid line indicates the energy of the conduction band minimum. A dashed line $E_f$ indicates the energy of the quasi-Fermi level of electrons.

In a transistor including the CAC-OS in a channel portion, the region 001 having the first band gap and the region 002 having the second band gap electrically interact with each other. In other words, the region 001 having the first band gap and the region 002 having the second band gap function complementarily.

As illustrated in FIG. 5A, when a potential at which the transistor is turned on ($V_g>0$) is applied to the first gate, electrons flow in the region 002 having the second band gap with the low energy of the conduction band minimum and serving as a main conduction path. At the same time, electrons also flow in the region 001 having the first band gap. This enables high current drive capability in the on state of the transistor, i.e., high on-state current and high field-effect mobility.

In contrast, as illustrated in FIGS. 5B and 5C, when a voltage lower than or equal to the threshold voltage ($V_g \leq 0$) is applied to the first gate, the region 001 having the first band gap serves as a dielectric (insulator), so that the conduction path in the region 001 is blocked. The region 002 having the second band gap is in contact with the region 001 having the first band gap. Consequently, the region 001 having the first band gap electrically interact with each other and also with the region 002 having the second band gap, and thus, even the conduction path in the region 002 having the second band gap is blocked. Accordingly, the whole channel portion is brought into a non-conductive state, and the transistor is turned off.

As described above, with the use of the CAC-OS in a transistor, it is possible to reduce or prevent leakage current between a gate and a source or a drain, which is generated when the transistor operates, for example, when a potential difference is generated between the gate and the source or the drain.

The metal oxides used as the oxides 406a and 406c are each an oxide containing the element M (the element M is one or more of Al, Ga, Si, B, Y, Ti, Fe, Ni, Ge, Zr, Mo, La, Ce, Nd, Hf, Ta, W, Mg, V, Be, and Cu). For the oxides 406a and 406c, for example, an In—Ga—Zn oxide, gallium oxide, barium oxide, or the like can be used.

Here, the atomic ratio of the element M to constituent elements in the metal oxide used as the oxides 406a and 406c is preferably greater than that in the metal oxide used as the oxide 406b. Moreover, the atomic ratio of the element M to In in the metal oxide used as the oxides 406a and 406c is preferably greater than that in the metal oxide used as the oxide 406b.

Furthermore, the metal oxide used as the oxides 406a and 406c preferably has a non-single-crystal structure. The non-single-crystal structure includes, for example, a CAAC-OS that is described later, a polycrystalline structure, a microcrystalline structure, or an amorphous structure. The metal oxide used as the oxides 406a and 406c preferably has a CAAC structure. Thus, the metal oxide used as the oxides 406a and 406c has a layered crystal structure in which a plurality of IGZO nanocrystals have c-axis alignment and are connected in the a-b plane direction without alignment.

Furthermore, the metal oxide used as the oxides 406a and 406c preferably has higher crystallinity than the metal oxide used as the oxide 406b. Here, the metal oxide used as the oxides 406a and 406c is preferably formed using an oxide formed under an oxygen atmosphere, for example. With the oxide, the oxides 406a and 406c can have high crystallinity. In addition, the shapes of the oxides 406a and 406c can be more stable.

By using the above metal oxide as the oxide 406c, it is preferable that the energy of the conduction band minimum of the oxide 406c be higher than the energy of the conduction band minimum of a region of the CAC-OS of the oxide 406b where the energy of the conduction band minimum is low. In other words, the electron affinity of the oxide 406c is preferably smaller than the electron affinity of the region of the CAC-OS of the oxide 406b where the energy of the conduction band minimum is low. Here, the electron affinity means a difference between a vacuum level and an energy level of the conduction band minimum.

Similarly, by using the above metal oxide as the oxide 406a, it is preferable that the energy of the conduction band minimum of the oxide 406a be higher than the energy of the conduction band minimum of the region of the CAC-OS of the oxide 406b where the energy of the conduction band minimum is low. In other words, the electron affinity of the oxide 406a is preferably smaller than the electron affinity of the region of the CAC-OS of the oxide 406b where the energy of the conduction band minimum is low.

Here, the energy level of the conduction band minimum is gradually varied in the oxides 406a to 406c. In other words, the energy level of the conduction band minimum is continuously varied or continuously connected. To vary the energy level gradually, the density of defect states in a mixed layer formed at the interface between the oxides 406a and 406b or the interface between the oxides 406b and 406c is decreased.

Specifically, when the oxides 406a and 406b or the oxides 406b and 406c contain the same element (as a main component) in addition to oxygen, a mixed layer with a low density of defect states can be formed. For example, in the case where the oxide 406b is an In—Ga—Zn oxide, it is preferable to use an In—Ga—Zn oxide, a Ga—Zn oxide, gallium oxide, or the like as each of the oxides 406a and 406c.

At this time, a narrow-gap portion formed in the oxide 406b serves as a main carrier path. Since the density of defect states at the interface between the oxides 406a and 406b and the interface between the oxides 406b and 406c can be decreased, the influence of interface scattering on carrier conduction is small, and high on-state current can be obtained.

When an electron is trapped in a trap state, the trapped electron behaves like fixed charge; thus, the threshold voltage of the transistor is shifted in a positive direction. The oxides 406a and 406c can make the trap state apart from the oxide 406b. This structure can prevent the positive shift of the threshold voltage of the transistor.

Note that the metal oxide used for the transistor has the above-described three layer structure in this embodiment; however, one embodiment of the present invention is not limited thereto. For example, a two-layer structure without the oxide 406a or the oxide 406c may be employed. Alternatively, a four-layer structure in which any one of the above-described semiconductors is provided below or over the oxide 406a or below or over the oxide 406c may be employed. Alternatively, an n-layer structure (n is an integer of 5 or more) may be employed in which any one of the semiconductors described as examples of the oxides 406a to 406c is provided in two or more of the following positions: over the oxide 406a, under the oxide 406a, over the oxide 406c, and under the oxide 406c.

The transistor described in this embodiment includes the above-described oxides 406a to 406c.

The oxide 406a is preferably positioned in contact with the top surface of the insulator 402. The oxide 406b is preferably positioned in contact with the top surface of the oxide 406a.

The oxide 406b includes a first region, a second region, and a third region. In the top view, the third region is positioned between the first region and the second region. The transistor described in this embodiment includes the conductor 416a1 over and in contact with the first region of the oxide 406b. The transistor described in this embodiment includes the conductor 416a2 over and in contact with the second region of the oxide 406b. One of the first and second regions of the oxide 406b can function as a source region, and the other can function as a drain region. The third region of the oxide 406b can function as a channel formation region.

The oxide 406c is preferably formed to be in contact with the third region of the oxide 406b and cover the oxides 406a and 406b, the conductors 416a1 and 416a2, and barrier films 417a1 and 417a2. In particular, the oxide 406c preferably covers side surfaces of the oxides 406a and 406b. As illustrated in FIG. 1B, side surfaces of the oxides 406a and 406b in the channel length direction are preferably in contact with the oxide 406c. Furthermore, as illustrated in FIG. 1C, side surfaces of the oxides 406a and 406b in the channel width direction are preferably in contact with the oxide 406c. The oxide 406c is preferably in contact with the top surface of the insulator 402 in a region outward from the oxides 406a and 406b.

With the structure in which the oxide 406b is formed in contact with the top surface of the oxide 406a and is covered with the oxide 406c, impurities such as water and hydrogen from the insulator 402, the insulator 412, or the like and metal elements from the conductor 404 can be prevented from directly entering the oxide 406b.

As illustrated in FIG. 1A, the oxide 406c is provided to cover the oxide 406b entirely. In addition, the conductor 404 functioning as a first gate electrode is provided to cover the third region of the oxide 406b entirely with the insulator 412 functioning as a first gate insulator interposed therebetween.

The conductors 416a1 and 416a2 are preferably provided to be separate from each other and in contact with the top surface of the oxide 406b. Here, the conductor 416a1 can function as one of source and drain electrodes, and the conductor 416a2 can function as the other.

As illustrated in FIGS. 1A and 1B, one side end portion of the conductor 416a1 is preferably substantially aligned with one side end portion of the oxide 406a and one side end portion of the oxide 406b. Similarly, one side end portion of the conductor 416a2 is preferably substantially aligned with the other side end portion of the oxide 406a and the other side end portion of the oxide 406b. With such a structure, the side surfaces of the oxides 406a and 406b are not in contact with the conductors 416a1 and 416a2; thus, extraction of oxygen, which causes oxygen vacancies to be formed in the side surfaces of the oxides 406a and 406b, can be prevented. Furthermore, since the side surfaces of the oxides 406a and 406b are not in contact with the conductors 416a1 and 416a2, impurities derived from the conductors 416a1 and 416a2 can be prevented from entering from the side surfaces of the oxides 406a and 406b.

Here, the distance between the side end portion of the conductor 416a1 and the side end portion of the conductor 416a2 that face each other, that is, the channel length of the transistor is 10 nm or greater and 300 nm or less, typically, 20 nm or greater and 180 nm or less.

The angle formed between the side surface and the bottom surface of the conductor 416a1 and the angle formed between the side surface and the bottom surface of the conductor 416a2 are each preferably less than 90°, which is a taper angle. The angles are each preferably 45° or greater and 75° or less. Here, the side surface of the conductor 416a1 faces the side surface of the conductor 416a2. When the conductors 416a1 and 416a2 are formed to have such a structure, the oxide 406c can be formed with good coverage also in step portions formed by the conductors 416a1 and 416a2. Accordingly, for example, disconnection of the oxide 406c, which causes the oxide 406b to be in contact with the insulator 412 or another component, can be prevented.

The barrier film 417a1 is preferably provided in contact with the top surface of the conductor 416a1, and the barrier film 417a2 is preferably provided in contact with the top surface of the conductor 416a2. The barrier films 417a1 and 417a2 have a function of inhibiting penetration of oxygen and impurities such as hydrogen and water. Aluminum oxide or the like can be used for the barrier films 417a1 and 417a2, for example. The barrier films 417a1 and 417a2 formed using aluminum oxide or the like can prevent surrounding excess oxygen from being used for oxidation of the conductors 416a1 and 416a2. Furthermore, an increase in the electric resistance values of the conductors 416a1 and 416a2 due to the oxidation can be prevented. Note that the electric resistance values of the conductors can be measured by a two-terminal method or the like. Note that the barrier films 417a1 and 417a2 are not necessarily formed.

Moreover, since the barrier film 417a1 as well as the insulator 412 and the oxide 406c is positioned between the conductor 404 and the conductor 416a1, the parasitic capacitance between the conductor 404 and the conductor 416a1 can be small. Similarly, since the barrier film 417a2 as well as the insulator 412 and the oxide 406c is positioned between the conductor 404 and the conductor 416a2, the parasitic capacitance between the conductor 404 and the conductor 416a2 can be small. Thus, the transistor described in this embodiment has excellent frequency characteristics.

The insulator 412 can function as a gate insulating film and is preferably in contact with the top surface of the oxide 406c. Like the insulator 402, the insulator 412 is preferably formed using an insulator from which oxygen is released by heating. When the insulator 412 formed using the insulator is formed in contact with the top surface of the oxide 406c, oxygen can be supplied to the oxide 406b effectively. Furthermore, the concentration of impurities such as water and hydrogen in the insulator 412 is preferably lowered as in the insulator 402.

The conductor 404 preferably has a stack of the conductor 404a, the conductor 404b, and the conductor 404c. The conductor 404a is provided over the insulator 412, the conductor 404b is provided over the conductor 404a, and the conductor 404c is provided over the conductor 404b. The insulator 412 and the conductor 404 include regions overlapping with the oxide 406b. Side end portions of the conductors 404a to 404c are substantially aligned. Here, the conductor 404 functions as the other gate electrode. The width in the channel length direction of the conductor 404 functioning as the gate electrode is 10 nm or greater and 300 nm or less, preferably 20 nm or greater and 180 nm or less.

In other words, one of the conductors 310 and 404 can function as a gate electrode, and the other can function as a back gate electrode. The gate electrode and the back gate electrode are provided with the channel formation region in the semiconductor positioned therebetween. The potential of the back gate electrode may be the same as that of the gate electrode or may be a ground potential or an arbitrary potential. By changing a potential of the back gate electrode independently of the potential of the gate electrode, the threshold voltage of the transistor can be changed.

The conductor 404a is preferably an oxide having conductivity. For example, the metal oxide that can be used as the oxide 406a, 406b, or 406c can be used. In particular, an In—Ga—Zn-based oxide with an atomic ratio of In:Ga:Zn=4:2:3 to 4.1 or in the neighborhood thereof, which has high conductivity, is preferably used. When the conductor 404a is formed using such an oxide, oxygen can be prevented from entering the conductors 404b and 404c, and an increase in electric resistance value of the conductors 404b and 404c due to oxidation can be prevented. Moreover, excess oxygen can be supplied to the oxide 406b.

The conductor 404b is preferably a conductor that can add impurities such as nitrogen to the conductor 404a to improve the conductivity of the conductor 404a. For example, titanium nitride or the like is preferably used for the conductor 404b.

Here, the conductor 404 functioning as a gate electrode is provided to cover the top surface of the third region and its periphery and the side surface, which is in the channel width direction, of the oxide 406b with the insulator 412 and the oxide 406c interposed therebetween. Thus, the electric field of the conductor 404 functioning as a gate electrode can electrically surround the top surface of the third region and its periphery and the side surface, which is in the channel width direction, of the oxide 406b. The structure of the transistor in which the channel formation region is electrically surrounded by the electric field of the conductor 404 is referred to as a surrounded channel (s-channel) structure. Thus, a channel can be formed in the top surface of the third region and its periphery and the side surface, which is in the channel width direction, of the oxide 406b; therefore, a large amount of current can flow between the source and the drain, and a current in an on state (on-state current) can be large. Moreover, since the top surface of the third region and its periphery and the side surface, which is in the channel width direction, of the oxide 406b are surrounded by the electric field of the conductor 404, a current in an off state (off-state current) can be small.

A barrier film 418 is preferably provided over the conductor 404. Here, for the barrier film 418, a material that is less likely to transmit oxygen is preferably used, and aluminum oxide or the like can be used, for example. The barrier film 418 formed using such a material can prevent surrounding excess oxygen from being used for oxidation of the conductor 404. Thus, the barrier film 418 functions as a gate cap for protecting a gate. Note that the barrier film 418 is not necessarily formed.

The insulator 408a is provided to cover the oxides 406a to 406c, the conductors 416a1 and 416a2, the barrier films 417a1 and 417a2, the insulator 412, the conductor 404, and the barrier film 418. Part of the insulator 408a is preferably in contact with the top surface of the insulator 402. For example, part of the insulator 408a is preferably in contact with the top surface of the insulator 402 in a region outward from a region of the insulator 402 overlapping with the insulator 412. Furthermore, part of the insulator 408a is preferably in contact with the top surface of the insulator 412. For example, part of the insulator 408a is preferably in contact with the top surface of the insulator 412 in a region of the insulator 412 not overlapping with the conductor 404 or the barrier film 418. In addition, the insulator 408b is provided over the insulator 408a. Each of the insulators 408a and 408b can function as a barrier insulating film for preventing impurities such as water and hydrogen from entering the transistor and the like from an upper layer.

Here, for the insulator 408a, an oxide insulator that is formed by a sputtering method is preferably used, and for example, aluminum oxide is preferably used. With the insulator 408a formed using such an oxide insulator by a sputtering method, oxygen can be added to surfaces of the insulators 402 and 412 that are in contact with the insulator 408a, so that the insulators 402 and 412 can be in an oxygen excess state. As described above, when the insulator 408a is in contact with the top surface of the insulator 412 in a region of the insulator 412 not overlapping with the conductor 404 or the barrier film 418, oxygen can be added to a large area of the insulator 412 covering the oxides 406a to 406c. Accordingly, oxygen can be supplied to the oxides 406a to 406c effectively.

Furthermore, when an insulating material that is less likely to transmit oxygen such as aluminum oxide is used for the insulator 408a, oxygen added to the insulators 402 and 412 can be prevented from being diffused upward during the deposition. Accordingly, oxygen can be added to the insulators 402 and 412 efficiently.

Here, the insulator 412 and the oxide 406c are provided between the insulator 408a and the side surfaces of the oxides 406a and 406b. Thus, the side surfaces of the oxides 406a and 406b can be prevented from being damaged while the insulator 408a is formed by sputtering.

For the insulators 408a and 408b, an insulating material that is less likely to transmit impurities such as water and hydrogen is preferably used, and for example, aluminum oxide or the like is preferably used. With the insulators 408a and 408b including the insulating material, impurities such as hydrogen and water can be prevented from being diffused from a layer that is over the insulator 408b to a layer that is below the insulator 408a.

Moreover, for the insulator 408b, an oxide insulator formed by an atomic layer deposition (ALD) method is preferably used, and for example, an aluminum oxide is preferably used. The insulator 408b formed by an ALD method has good coverage, and is a film in which formation of cracks, pinholes, or the like are suppressed. Although the insulators 408a and 408b are provided over an uneven structure, the insulator 408b formed by an ALD method can cover the transistor without occurrence of disconnection, formation of cracks and pinholes, or the like. Thus, even when disconnection or the like occurs in the insulator 408a, it can be covered with the insulator 408b; therefore, the barrier property against impurities such as hydrogen and water of a stacked film of the insulators 408a and 408b can be improved noticeably.

In the case where the insulator 408a is formed by a sputtering method and the insulator 408b is formed by an ALD method, when the thickness of a portion over the top surface of the conductor 404c is referred to as a first thickness and the thickness of a portion over the side surfaces of the oxides 406a and 406b and the conductors 416a1 and 416a2 is referred to as a second thickness, the ratio of the first thickness to the second thickness in the insulator 408a might be different from that in the insulator 408b. In the insulator 408b, the first thickness and the second thickness can be approximately the same thickness. In contrast, in the insulator 408a, the first thickness tends to be greater than the second thickness; for example, the first thickness is approximately twice as large as the second thickness in some cases.

Furthermore, for the insulators 408a and 408b, an insulating material that is less likely to transmit oxygen is preferably used. The insulators 408a and 408b including the insulating material can prevent oxygen contained in the insulator 402, the insulator 412, or the like from being diffused upward.

As described above, the transistor is positioned between the insulator 401 and the insulators 408a and 408b; thus, outward diffusion of oxygen can be prevented, and a large amount of oxygen can be contained in the insulator 402, the oxides 406a to 406c, and the insulator 412. Furthermore, impurities such as hydrogen and water can be prevented from entering from an upper layer that is over the insulator 408b and a lower layer that is below the insulator 401, and thus the concentration of impurities in the insulator 402, the oxides 406a to 406c, and the insulator 412 can be lowered.

In this manner, oxygen vacancies in the oxide 406b functioning as an active layer of the transistor is reduced, and impurities such as hydrogen and water are reduced; accordingly, the electrical characteristics of the transistor is made stable, and the reliability can be improved.

An insulator 410 is preferably provided over the insulator 408b. The concentration of impurities such as water and hydrogen in the insulator 410 is preferably lowered as in the insulator 402 and the like.

Moreover, an insulator 420 is preferably provided over the insulator 410. The insulator 420 can function as a barrier insulating film for preventing impurities such as water and hydrogen from entering the transistor and the like from an upper layer. For the insulator 420, as well as the insulator 408a, an insulating material that is less likely to transmit oxygen and impurities such as water and hydrogen, e.g., an aluminum oxide, is preferably used.

An oxide insulator may be formed over the insulator 420 by an ALD method, which is the same method as that for the insulator 408b.

An insulator 422 is preferably provided over the insulator 420. The insulator 422 is preferably formed using an insulator similar to the insulator 410, for example.

<Substrate>

As a substrate over which the transistor described in this embodiment is provided, for example, an insulator substrate, a semiconductor substrate, or a conductor substrate may be used. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a single material semiconductor substrate of silicon, germanium, or the like, or a compound semiconductor substrate of silicon carbide, silicon germanium, gallium arsenide, indium phosphide, zinc oxide, or gallium oxide can be used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate. As a method for providing the transistor over a flexible substrate, there is a method in which the transistor is formed over a non-flexible substrate and then the transistor is separated and transferred to the flexible substrate. In that case, a separation layer is preferably provided between the non-flexible substrate and the transistor. As the substrate, a sheet, a film, or a foil containing a fiber may be used. The substrate may have elasticity. The substrate may have a property of returning to its original shape when bending or pulling is stopped. Alternatively, the substrate may have a property of not returning to its original shape. The substrate has a region with a thickness of, for example, greater than or equal to 5 μm and less than or equal to 700 μm, preferably greater than or equal to 10 μm and less than or equal to 500 μm, more preferably greater than or equal to 15 μm and less than or equal to 300 μm. When the substrate has a small thickness, the weight of the semiconductor device including the transistor can be reduced. When the substrate has a small thickness, even in the case of using glass or the like, the substrate may have elasticity or a property of returning to its original shape when bending or pulling is stopped. Therefore, an impact applied to the semiconductor device over the substrate due to dropping or the like can be reduced. That is, a durable semiconductor device can be provided.

For the flexible substrate, metal, an alloy, a resin, glass, or fiber thereof can be used, for example. The flexible substrate preferably has a lower coefficient of linear expansion because deformation due to an environment is suppressed. The flexible substrate is preferably formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, and acrylic. In particular, aramid is preferably used as the material of the flexible substrate because of its low coefficient of linear expansion.

<Insulator>

By surrounding a transistor with an insulator having a function of inhibiting penetration of oxygen and impurities such as hydrogen, the electrical characteristics of the transistor can be stable. For example, the insulator having a function of inhibiting penetration of oxygen and impurities such as hydrogen is used for the insulators 401, 408a, 408b, and 420. Furthermore, the insulator having a function of inhibiting penetration of oxygen and impurities such as hydrogen can be used for the insulator 303. Each of the insulators 401, 303, 408a, 408b, and 420 is preferably formed using an insulating material that is less likely to transmit impurities such as water and hydrogen than the insulator 402 and the like.

The insulator having a function of inhibiting penetration of oxygen and impurities such as hydrogen may have a single-layer structure or a stacked-layer structure including, for example, a metal oxide such as aluminum oxide, aluminum oxynitride, magnesium oxide, gallium oxide, germanium oxide, yttrium oxide, zirconium oxide, lanthanum oxide, neodymium oxide, hafnium oxide, or tantalum oxide, silicon nitride oxide, silicon nitride, aluminum nitride, or the like.

For example, when the insulator 408a is formed using plasma including oxygen, oxygen can be added to the insulators 402 and 412 serving as a base layer. The added oxygen is excess oxygen in the insulators 402 and 412. By heat treatment or the like, the excess oxygen is added to the oxides 406a to 406c through the insulator 402 or 412; accordingly, oxygen vacancies in the oxides 406a to 406c can be filled.

When the insulators 401, 408a, and 408b include aluminum oxide, entry of impurities such as hydrogen into the oxides 406a to 406c can be suppressed. Furthermore, for example, when the insulators 401, 408a, and 408b include aluminum oxide, outward diffusion of the above-described excess oxygen added to the oxides 406a to 406c can be suppressed.

The insulators 301, 302, 303, 402, and 412 may each be formed to have a single-layer structure or a stacked-layer structure including an insulator containing, for example, boron, carbon, nitrogen, oxygen, fluorine, magnesium, aluminum, silicon, phosphorus, argon, gallium, germanium, yttrium, zirconium, lanthanum, neodymium, hafnium, or tantalum. For example, the insulators 301, 302, 303, 402, and 412 preferably contain silicon oxide or silicon oxynitride.

Since the insulators 302, 303, 402, and 412 function as gate insulating films, each of the insulators 302, 303, 402, and 412 preferably includes an insulator with a high relative dielectric constant. For example, each of the insulators 302, 303, 402, and 412 preferably includes gallium oxide, hafnium oxide, oxide including aluminum and hafnium, oxynitride including aluminum and hafnium, oxide including silicon and hafnium, oxynitride including silicon and hafnium, or the like. Each of the insulators 302, 303, 402, and 412 preferably has a stacked structure including silicon oxide or silicon oxynitride and an insulator with a high relative dielectric constant. Because silicon oxide and silicon oxynitride have thermal stability, combination of silicon oxide or silicon oxynitride with an insulator with a high dielectric constant allows the stacked-layer structure to be thermally stable and have a high dielectric constant. For example, when aluminum oxide, gallium oxide, or hafnium oxide is on the oxide 406c side, entry of silicon included in the silicon oxide or the silicon oxynitride into the oxide 406b can be inhibited. When silicon oxide or silicon oxynitride is on the oxide 406c side, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

Each of the insulators 410 and 422 preferably includes an insulator with a low relative dielectric constant. For example, the insulator 410 preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator 410 preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. Because silicon oxide and silicon oxynitride have thermal stability, combination of silicon oxide or silicon oxynitride with a resin allows the stacked-layer structure to be thermally stable and have a low dielectric constant. Examples of the resin include polyester, polyolefin, polyamide (e.g., nylon or aramid), polyimide, polycarbonate, and acrylic.

For the barrier films 417a1 and 417a2, an insulator having a function of inhibiting penetration of oxygen and impurities such as hydrogen may be used. The barrier films 417a1 and 417a2 can prevent excess oxygen in the oxide 406c and the insulator 412 from being diffused to the conductors 416a1 and 416a2.

Furthermore, for example, the barrier films 417a1 and 417a2 may be formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride.

<Conductor>

As a conductive material for forming the conductors 404, 310, 416a1, and 416a2, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like can be used. Alternatively, a semiconductor having a high electric conductivity typified by polycrystalline silicon including an impurity element such as phosphorus, or silicide such as nickel silicide may be used.

A conductive material containing the above-described metal element and oxygen may be used. A conductive material containing the above-described metal element and nitrogen may be used. For example, a conductive material containing nitrogen such as titanium nitride or tantalum nitride may be used. Indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used.

A plurality of stacked conductive layers formed with the above-described materials may be used. A stacked-layer structure formed using a material containing the above-described metal element and a conductive material containing oxygen may be used. A stacked-layer structure formed using a material containing the above-described metal element and a conductive material containing nitrogen may be used. A stacked-layer structure formed using a material containing the above-described metal element, a conductive material containing oxygen, and a conductive material containing nitrogen may be used.

When oxide is used for the channel formation region of the transistor, a stacked-layer structure formed using a material containing the above-described metal element and a conductive material containing oxygen is preferably used for the gate electrode. In this case, the conductive material containing oxygen is preferably formed on the channel formation region side. When the conductive material containing oxygen is formed on the channel formation region side, oxygen released from the conductive material is likely to be supplied to the channel formation region.

For example, for the conductor 310b, a conductive material such as tungsten or polysilicon may be used. The conductor 310a in contact with the insulator 401 can have a single-layer structure or a stacked-layer structure including, for example, a barrier layer (a diffusion prevention layer) formed using titanium, titanium nitride, tantalum nitride, or the like.

When an insulating material that is less likely to transmit impurities is used for the insulator 401, and a conductive material that is less likely to transmit impurities is used for the conductor 310a in contact with the insulator 401, diffusion of impurities to the transistor can be further suppressed. Thus, the reliability of the transistor can be further increased.

For the barrier films 417a1, 417a2, and 418, the above-described conductive material that is less likely to transmit impurities may be used. When a conductive material is used for the barrier films 417a1, 417a2, and 418, a conductive material from which oxygen is less likely to be released and/or on which oxygen is less likely to be absorbed is preferably used.

As described above, one embodiment of the present invention can provide a semiconductor device having favorable electrical characteristics. Alternatively, one embodiment of the present invention can provide a highly reliable semiconductor device.

The structures, the methods, and the like described in this embodiment can be combined as appropriate with any of the structures, the methods, and the like described in the other embodiments.

Embodiment 2

<Method for Manufacturing Transistor>

A method for manufacturing the transistor of one embodiment of the present invention illustrated in FIGS. 1A to 1C is described below with reference to FIGS. 7A to 7J, FIGS. 8A to 8H, FIGS. 9A to 9H, and FIGS. 10A to 10D. In FIGS. 7A to 7J, FIGS. 8A to 8H, FIGS. 9A to 9H, and FIGS. 10A to 10D, cross-sectional views corresponding to a cross section along dashed-dotted line A1-A2 in FIG. 1B and cross-sectional views corresponding to a cross section along dashed-dotted line A3-A4 in FIG. 1C are illustrated.

Note that hereinafter, an insulating material for forming an insulator, a conductive material for forming a conductor, an oxide functioning as an oxide semiconductor, and the like can be formed by a sputtering method, a spin coating method, a chemical vapor deposition (CVD) method, an ALD method, a molecular beam epitaxy (MBE) method, or a pulsed laser deposition (PLD) method as appropriate.

Note that examples of the CVD method include a plasma enhanced CVD (PECVD) method using plasma, a high-density plasma CVD method, a thermal CVD (TCVD) method using heat, a photo CVD method using light, a metal CVD (MCVD) method, a metal organic CVD (MOCVD) method, a low pressure CVD (LPCVD) method, and an atmospheric pressure CVD (APCVD) method.

By using the PECVD method, a high-quality film can be formed at a relatively low temperature. Furthermore, a thermal CVD method does not use plasma and thus causes less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. By contrast, when a thermal CVD method not using plasma is employed, such plasma damage is not caused and the yield of the semiconductor device can be increased. A thermal CVD method does not cause plasma damage during deposition, so that a film with few defects can be obtained.

An ALD method also causes less plasma damage to an object. An ALD method does not cause plasma damage during deposition, so that a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by a CVD method or an ALD method, a film with a certain composition can be formed depending on a flow rate ratio of the source gases. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be reduced because time taken for transfer and pressure adjustment is omitted. Thus, semiconductor devices can be manufactured with improved productivity.

First, over a substrate, which is not illustrated, the insulator 401 and the insulator 301 are formed in this order (see FIGS. 7A and 7B). In this embodiment, a single crystal silicon substrate (including a p-type semiconductor substrate or an n-type semiconductor substrate) is used as the substrate. Furthermore, in this embodiment, an aluminum oxide film is formed by a sputtering method as the insulator 401, and a silicon oxynitride film is formed by a CVD method as the insulator 301.

Note that an insulator similar to the insulator 408b may be formed over or below the insulator 401. For example, an aluminum oxide film may be formed over or below the insulator 401 by an ALD method.

Next, an opening (including a groove, a trench, a hole, or the like) reaching the insulator 401 is formed in the insulator 301 (see FIGS. 7C and 7D). The opening may be formed by wet etching; however, dry etching is preferable for microfabrication. The insulator 401 is preferably an insulator that functions as an etching stopper film used in forming the opening by etching the insulator 301. For example, in the case where silicon oxide or silicon oxynitride is used as the insulator 301 in which the opening is to be formed, the insulator 401 is preferably formed using silicon nitride, aluminum oxide, hafnium oxide, or the like. At this time, because of the etching, a depression might be formed in part of the insulator 401 that overlaps with the opening in the insulator 301.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power source is applied to one of the parallel plate type electrodes. Alternatively, the capacitively coupled plasma etching apparatus may have a structure in which different high-frequency power sources are applied to one of the parallel plate type electrodes. Alternatively, the capacitively coupled plasma etching apparatus may have a structure in which high-frequency power sources with the same frequency are applied to the parallel plate type electrodes. Alternatively, the capacitively coupled plasma etching apparatus may have a structure in which high-frequency power sources with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

Next, a conductive film 310A to be the conductor 310a and a conductive film 310B to be the conductor 310b are formed (see FIGS. 7E and 7F). In this embodiment, a stacked film of tantalum nitride formed by a sputtering method and titanium nitride formed by an ALD method is used as the conductive film 310A. Furthermore, a tungsten film formed by a CVD method is used as the conductive film 310B.

Next, chemical mechanical polishing (CMP) treatment is performed to remove the conductive film 310A and the conductive film 310B over the insulator 301 (see FIGS. 7G and 7H). Consequently, the conductors 310a and 310b remain only in the opening, whereby the conductor 310 with a flat top surface can be formed.

Next, the insulator 302 is formed over the insulator 301 and the conductor 310. In this embodiment, a silicon oxynitride film is formed as the insulator 302 by a CVD method.

Then, the insulator 303 is formed over the insulator 302. In this embodiment, a hafnium oxide film is formed as the insulator 303 by an ALD method.

Next, the insulator 402 is formed over the insulator 303. In this embodiment, a silicon oxynitride film is formed as the insulator 402 by a CVD method.

Next, first heat treatment is preferably performed. The first heat treatment is performed at a temperature higher than or equal to 250° C. and lower than or equal to 650° C., preferably higher than or equal to 300° C. and lower than or equal to 500° C. In the case where a wiring or the like formed using copper is formed under the transistor described in this embodiment, the temperature of the first heat treatment is preferably 410° C. or lower. The first heat treatment is performed in an inert gas atmosphere. The first heat treatment may be performed under a reduced pressure. By the first heat treatment, impurities such as hydrogen and water included in the insulator 402 can be removed, for example. In this embodiment, the first heat treatment is performed in a nitrogen gas atmosphere at 400° C.

Next, an oxide film 406A to be the oxide 406a is formed over the insulator 402, and an oxide film 406B to be the oxide 406b is formed over the oxide film 406A.

The oxide films 406A and 406B are preferably formed by a sputtering method. This is because the oxide films 406A and 406B formed by a sputtering method can have a higher density. As the sputtering gas, a rare gas (typically argon), oxygen, or a mixed gas of a rare gas and oxygen is used as appropriate. As the sputtering gas, nitrogen may be contained. Deposition may be performed in the state where the substrate is heated.

Increasing the purity of a sputtering gas is preferred. For example, as an oxygen gas or an argon gas used for a sputtering gas, a gas that is highly purified to have a dew point of −40° C. or lower, preferably −80° C. or lower, further preferably −100° C. or lower, still further preferably −120° C. or lower is used, whereby entry of moisture or the like into the oxide films 406A and 406B can be minimized.

A chamber of a sputtering apparatus is preferably evacuated to a high vacuum (to the degree of approximately $5\times10^{-7}$ Pa to $1\times10^{-4}$ Pa) by an adsorption vacuum pump such as a cryopump so that water and the like acting as impurities for the oxide films 406A and 406B are removed as much as possible. Alternatively, a turbo molecular pump and a cold trap are preferably combined so as to prevent a backflow of a gas, especially a gas containing carbon or hydrogen from an exhaust system to the inside of the chamber.

As a power source of the sputtering apparatus, a DC power source, an AC power source, or an RF power source may be used.

In the sputtering apparatus, a target or a magnet may be rotated or moved. For example, the oxide films can be formed while a magnet unit is oscillated vertically or horizontally. For example, the target may be rotated or oscillated with a beat (also referred to as rhythm, pulse, frequency, period, cycle, or the like) greater than or equal to 0.1 Hz and less than or equal to 1 kHz. Alternatively, the magnet unit may be oscillated with a beat of greater than or equal to 0.1 Hz and less than or equal to 1 kHz.

The substrate temperature in forming the oxide film 406A is preferably higher than or equal to room temperature and lower than or equal to 400° C. For example, the substrate temperature is set as appropriate to a temperature that is higher than or equal to the evaporation temperature of water (for example, 100° C.) and maximizes the maintainability and throughput of the apparatus to the extent possible.

In formation of the oxide film 406A, a rare gas (typically, argon), oxygen, or a mixed gas of a rare gas and oxygen is used as a sputtering gas as appropriate. In the case of a mixed gas, the proportion of oxygen gas in a whole deposition gas is preferably 70% or higher, further preferably 80% or higher, still further preferably 100%. When oxide containing excess oxygen is used for the oxide film 406A, oxygen can be supplied to the oxide film 406B by later heat treatment.

As the deposition target of the oxide film 406A, the above-described In-M-Zn oxide target can be used. The atomic ratio of In to the element M in the In-M-Zn oxide target of the oxide film 406A is preferably lower than that in an In-M-Zn oxide target of the oxide film 406B. For example, a metal oxide target having an atomic ratio of [In]:[M]:[Zn]=1:3:4 or in the neighborhood thereof is preferably used.

In this embodiment, the oxide film 406A is formed in an atmosphere containing an oxygen gas at approximately 100% at a substrate temperature of 200° C. with an In—Ga—Zn oxide target having an atomic ratio of [In]:[Ga]:[Zn]=1:3:4.

The substrate temperature in forming the oxide film 406B is preferably higher than or equal to 100° C. and lower than or equal to 140° C. For example, the substrate temperature is set as appropriate to a temperature that is higher than or equal to the evaporation temperature of water (for example, 100° C.) and maximizes the maintainability and throughput of the apparatus to the extent possible.

In formation of the oxide film 406B, a rare gas (typically, argon), oxygen, or a mixed gas of a rare gas and oxygen is used as a sputtering gas as appropriate. In the case of a mixed gas, the proportion of oxygen gas in a whole deposition gas is 0% or higher and 30% or higher, preferably 5% or higher and 20% or higher.

As the deposition target of the oxide film 406B, the In-M-Zn oxide target can be used. The atomic ratio of In to the element M in the In-M-Zn oxide target of the oxide film 406B is preferably higher than that in an In-M-Zn oxide target of the oxide film 406A. For example, a metal oxide target having an atomic ratio of [In]:[M]:[Zn]=4:2:4.1 or 5:1:7, or in the neighborhood thereof is preferably used.

In this embodiment, the oxide film 406B is formed using a mixed gas of a rare gas and oxygen (the proportion of the oxygen gas is approximately 10%) at a substrate temperature of 130° C. with an In—Ga—Zn oxide target having an atomic ratio of [In]:[Ga]:[Zn]=4:2:4.1.

After that, second heat treatment may be performed. The second heat treatment is performed at a temperature higher than or equal to 250° C. and lower than or equal to 650° C., preferably higher than or equal to 300° C. and lower than or equal to 500° C. The second heat treatment is performed in an inert gas atmosphere or an atmosphere containing an oxidizing gas at 10 ppm or more, 1% or more, or 10% or more. The second heat treatment may be performed under a reduced pressure. Alternatively, the second heat treatment may be performed in such a manner that heat treatment is performed in an inert gas atmosphere, and then another heat treatment may be performed in an atmosphere containing an oxidizing gas at 10 ppm or more, 1% or more, or 10% or more in order to compensate desorbed oxygen. By the second heat treatment, the crystallinity of the oxide film 406B can be increased and impurities such as hydrogen and water can be removed, for example. In this embodiment, treatment is performed in a nitrogen atmosphere at 400° C. for one hour, and successively another treatment is performed in an oxygen atmosphere at 400° C. for one hour.

Next, a conductive film 416A to be the conductors 416a1 and 416a2 is formed over the oxide film 406B. In this embodiment, a tantalum nitride film is formed by a sputtering method as the conductive film 416A. Tantalum nitride has high oxidation resistance and thus is preferably used for heat treatment in a later step.

Next, a barrier film 417A to be the barrier films 417a1 and 417a2 is formed over the conductive film 416A. In this embodiment, an aluminum oxide film is formed by an ALD method for the barrier film 417A. A dense film including reduced defects such as cracks or pinholes can be formed thinly and uniformly by an ALD method.

Then, a conductive film 419A is formed over the barrier film 417A (see FIGS. 7I and 7J). The conductive film 419A serves as a hard mask for forming the conductors 416a1 and 416a2 and other components. In this embodiment, a tungsten film is formed by a sputtering method for the conductive film 419A.

Figure 8A:
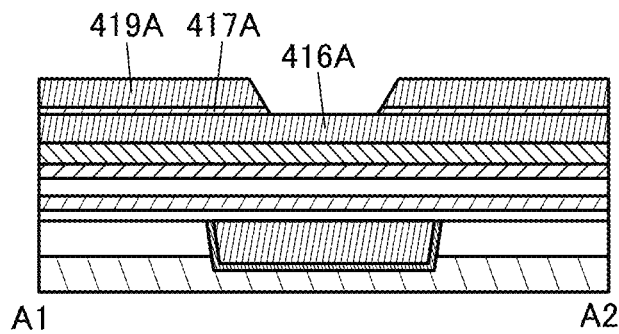
FIGS. 8A to 8H are cross-sectional views illustrating a method for manufacturing a transistor of one embodiment of the present invention.
Figure 8B:
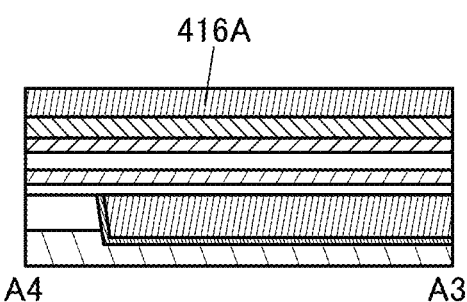

Next, an opening reaching the conductive film 416A is formed in the barrier film 417A and the conductive film 419A by a photolithography method (see FIGS. 8A and 8B). Note that when the opening is formed, the side surfaces on the opening side of the barrier film 417A and the conductive film 419A are preferably tapered to the top surface of the oxide film 406B. Note that the taper angle is 30° or more and 90° or less, preferably 45° or more and 80° or less.

When the width of an opening of a resist mask used for forming the barrier film 417A and the conductive film 419A is the minimum feature size, an opening whose width is the minimum feature size is formed in the barrier film 417A and the conductive film 419A. When the opening is formed in the barrier film 417A and the conductive film 419A in this manner, the channel length can be smaller than the minimum feature size.

The formation of the resist mask by a photolithography method is performed in such a manner that a photosensitive resist is irradiated with light through a photomask and a portion of the resist that has been exposed to light (or has not been exposed to light) is removed using a developing solution. Examples of light with which the photosensitive resist is irradiated include KrF excimer laser light, ArF excimer laser light, extreme ultraviolet (EUV) light, and the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a photomask is not necessary in the case of using an electron beam or an ion beam. Note that a dry etching method such as ashing or a wet etching method using a dedicated stripper or the like can be used for removal of the resist mask. Both the dry etching method and the wet etching method may be used.

Figure 8C:
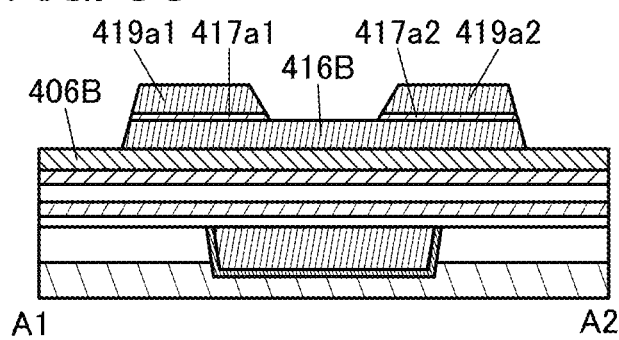
Figure 8D:
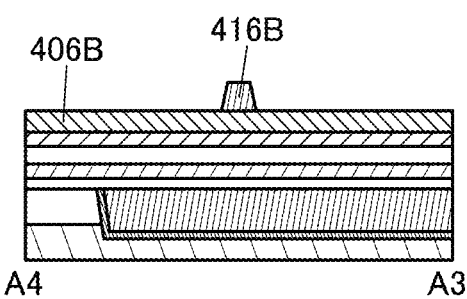

Next, parts of the conductive film 416A, the barrier film 417A, and the conductive film 419A are selectively removed by a photolithography method to be processed into island shapes (see FIGS. 8C and 8D). Thus, a conductive film 416B having an island shape is formed from the conductive film 416A, the barrier films 417a1 and 417a2 are formed from the barrier film 417A, and conductors 419a1 and 419a2 are formed from the conductive film 419A. Note that when the width of an opening of the barrier film 417A is the minimum feature size, the distance between the barrier films 417a1 and 417a2 is the minimum feature size.

Figure 8E:
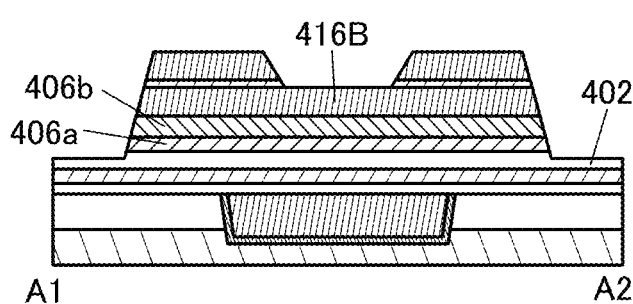
Figure 8F:
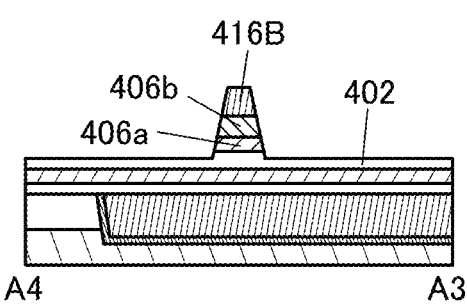
Figure 8G:
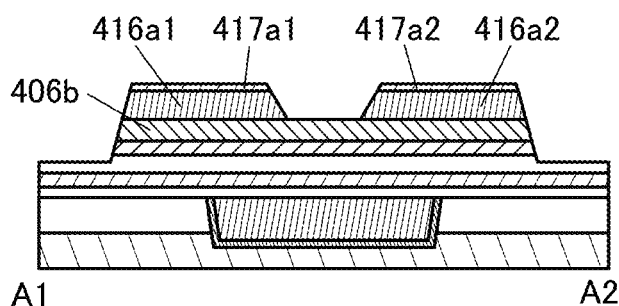
Figure 8H:
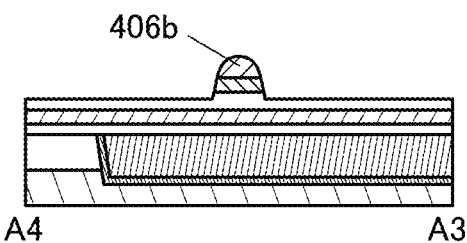

Subsequently, parts of the oxide films 406A and 406B are selectively removed using the conductors 419a1 and 419a2 and the conductive film 416B as masks (see FIGS. 8E and 8F). At this time, part of the insulator 402 might be also removed. After that, the resist mask is removed; accordingly, the oxide 406a having an island shape and the oxide 406b having an island shape can be formed.

Note that the removal of the parts of the oxide films 406A and 406B can be performed by a dry etching method, a wet etching method, or the like. Both the dry etching method and the wet etching method may be used.

Then, part of the conductive film 416B is selectively removed by a dry etching method using the barrier films 417a1 and 417a2 and the conductors 419a1 and 419a2 as masks. By the etching step, the conductive film 416B is divided into the conductors 416a1 and 416a2 (see FIGS. 8G and 8H).

As a gas for the dry etching, for example, any of a $C_4F_6$ gas, a $C_2F_6$ gas, a $C_4F_8$ gas, a $CF_4$ gas, a $SF_6$ gas, a $CHF_3$ gas, and the like can be used alone or in combination. Alternatively, an oxygen gas, a helium gas, an argon gas, a hydrogen gas, or the like can be added to any of the above gases as appropriate. In particular, a gas with which an organic substance can be generated by plasma is preferably used. For example, it is preferable to use a $C_4F_6$ gas, a $C_4F_8$ gas, or a $CHF_3$ gas to which a helium gas, an argon gas, a hydrogen gas, or the like is added as appropriate.

Here, the conductors 419a1 and 419a2 function as hard masks, and the conductors 419a1 and 419a2 are also removed as etching progresses.

Using a gas with which an organic substance can be generated, the conductive film 416B is etched while an organic substance is attached to the side surfaces of the barrier films 417a1 and 417a2 and the conductors 419a1 and 419a2, whereby side surfaces of the conductors 416a1 and 416a2 that face each other can be tapered.

The conductors 416a1 and 416a2 function as a source electrode and a drain electrode of the transistor described in this embodiment; thus, a length between the conductors 416a1 and 416a2 facing each other can be referred to as a channel length of the transistor. Here, when the width of an opening of the barrier film 417A is the minimum feature size, the distance between the barrier films 417a1 and 417a2 is the minimum feature size. The distance between the conductors 416a1 and 416a2 is smaller than that between the barrier films 417a1 and 417a2 by the width of the tapered shape of the side surfaces of the conductors 416a1 and 416a2; thus, the channel length can be smaller than the minimum feature size.

When the conductors 416a1 and 416a2 are formed by a dry etching method, an impurity element such as remaining components of an etching gas might be attached to an exposed part of the oxide 406b. For example, when a chlorine-based gas is used as an etching gas, chlorine and the like are attached in some cases. Furthermore, when a hydrocarbon-based gas is used as an etching gas, carbon, hydrogen, and the like are attached in some cases. The impurity elements attached to the exposed surface of the oxide 406b are preferably reduced. The impurity elements can be reduced by cleaning treatment using a solution in which hydrofluoric acid is diluted with pure water (diluted hydrofluoric acid), cleaning treatment using ozone or the like, cleaning treatment using ultra violet rays, or the like. Note that different types of cleaning treatment may be combined.

Plasma treatment using an oxidizing gas may be performed. For example, plasma treatment using a nitrous oxide gas is performed. By the plasma treatment, the concentration of fluorine in the oxide 406b can be lowered. Moreover, the plasma treatment is effective in removing an organic substance on the surface of a sample.

Oxygen doping treatment may be performed on the exposed oxide 406b. Furthermore, heat treatment that is described later may be performed.

Next, third heat treatment may be performed. The third heat treatment can be performed under conditions similar to those of the second heat treatment. By the third heat treatment, the crystallinity of the oxide 406b can be increased and impurities such as hydrogen and water can be removed, for example. In this embodiment, treatment is performed in a nitrogen atmosphere at 400° C. for 30 minutes, and successively another treatment is performed in an oxygen atmosphere at 400° C. for 30 minutes.

Next, an oxide film 406C to be the oxide 406c is formed over the insulator 402, the oxides 406a and 406b, the conductors 416a1 and 416a2, and the barrier films 417a1 and 417a2. The oxide film 406C formed in this manner can cover the side surfaces of the oxides 406a and 406b.

Like the oxide film 406A, the oxide film 406C is preferably formed by a sputtering method.

The substrate temperature in forming the oxide film 406C is preferably higher than or equal to room temperature and lower than 200° C. For example, the substrate temperature is room temperature during the deposition. The deposition is preferably performed while a substrate holder is cooled so that the substrate temperature does not exceed room temperature.

In formation of the oxide film 406C, a rare gas (typically, argon), oxygen, or a mixed gas of a rare gas and oxygen is used as a sputtering gas as appropriate. In the case of a mixed gas, the proportion of oxygen gas in a whole deposition gas is preferably 70% or higher, further preferably 80% or higher, still further preferably 100%. When oxide containing excess oxygen is used for the oxide film 406C, oxygen can be supplied to the oxide 406b by later heat treatment.

As the deposition target of the oxide film 406C, the In-M-Zn oxide target can be used. The atomic ratio of In to the element M in the In-M-Zn oxide target of the oxide film 406C is preferably lower than that in an In-M-Zn oxide target of the oxide film 406B. For example, a metal oxide target having an atomic ratio of [In]:[M]:[Zn]=1:1:1 or in the neighborhood thereof is preferably used.

In this embodiment, the oxide film 406C is formed in an atmosphere containing an oxygen gas at approximately 100% at a substrate temperature of room temperature with an In—Ga—Zn oxide target having an atomic ratio of [In]:[Ga]:[Zn]=1:1:1.

Next, an insulating film 412A is formed over the oxide film 406C. In this embodiment, a silicon oxynitride film is formed as the insulating film 412A by a CVD method.

Then, a fourth heat treatment may be performed. The fourth heat treatment can be performed under conditions similar to those of the first heat treatment. By the fourth heat treatment, impurities such as hydrogen and water included in the insulating film 412A can be removed, for example. In this embodiment, the fourth heat treatment is performed in a nitrogen gas atmosphere at 400° C.

Figure 9A:
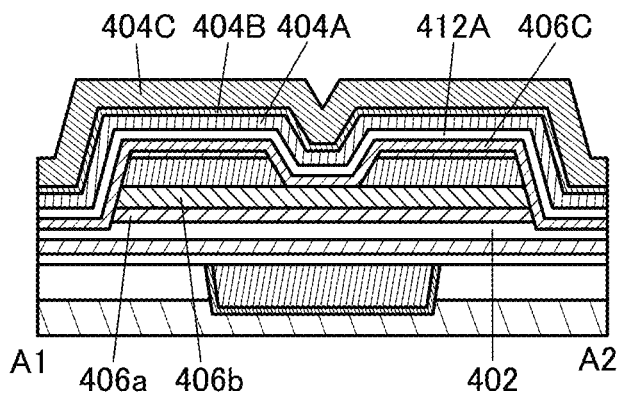
FIGS. 9A to 9H are cross-sectional views illustrating a method for manufacturing a transistor of one embodiment of the present invention.
Figure 9B:
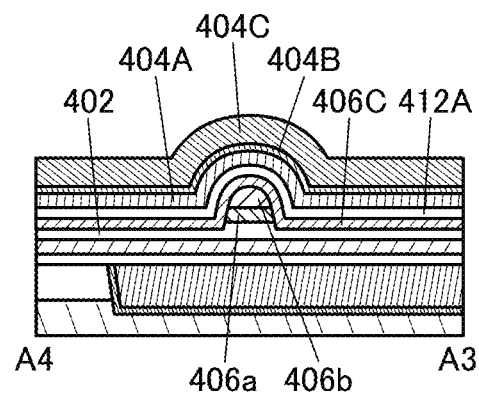

Next, a conductive film 404A to be the conductor 404a, a conductive film 404B to be the conductor 404b, and a conductive film 404C to be the conductor 404c are formed in this order (see FIGS. 9A and 9B). In this embodiment, a metal oxide formed by a sputtering method is used as the conductive film 404A, titanium nitride is used as the conductive film 404B, and tungsten is used as the conductive film 404C. The conductive film 404A formed by a sputtering method can add oxygen to the insulating film 412A, and the insulating film 412A can be in an oxygen excess state. In particular, since the conductive film 404A is provided over the third region of the oxide 406b that is to be a channel formation region, oxygen can be added to a portion of the insulating film 412A that is near the third region. Thus, oxygen can be supplied from the insulator 412 to the oxide 406b effectively.

Next, a fifth heat treatment may be performed. The fifth heat treatment can be performed under conditions similar to those of the first heat treatment. By the fifth heat treatment, the oxygen added to the insulating film 412A in forming the conductive film 404A by sputtering can be diffused. Thus, the oxygen vacancies in the oxides 406a to 406c can be reduced. Here, the conductive films 404A to 404C can prevent oxygen from being diffused over the transistor, and thus oxygen can be supplied to the oxide 406b effectively. In this embodiment, the fifth heat treatment is performed in a nitrogen gas atmosphere at 400° C.

Figure 9C:
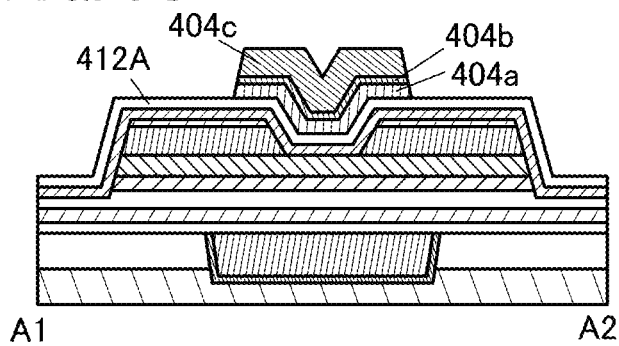
Figure 9D:
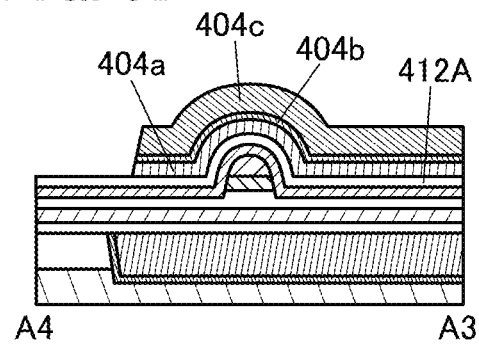

Next, parts of the conductive films 404A to 404C are selectively removed by a photolithography method, so that the conductor 404 including the conductors 404a to 404c and functioning as a gate is formed (see FIGS. 9C and 9D).

Figure 9E:
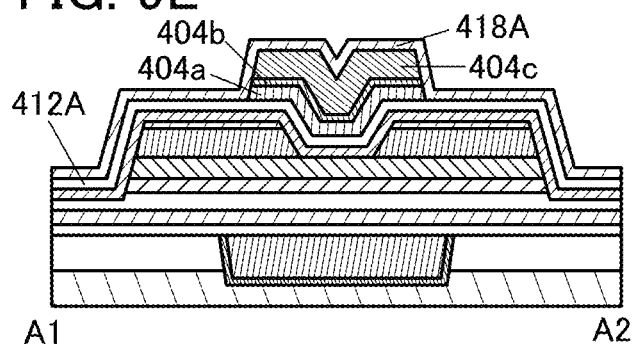
Figure 9F:
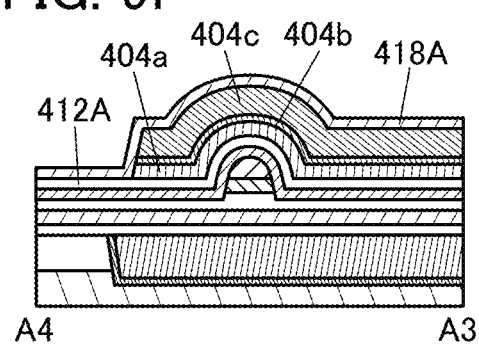

Next, a barrier film 418A that is to be processed into the barrier film 418 in a later step is formed over the insulating film 412A and the conductor 404 (see FIGS. 9E and 9F). The barrier film 418A functions as a gate cap, and in this embodiment, is formed using aluminum oxide formed by an ALD method.

Then, part of the barrier film 418A is selectively removed by a photolithography method, so that the barrier film 418 is formed. By forming the barrier film 418 to cover the conductor 404 in this manner, surrounding excess oxygen can be prevented from being used for oxidation of the conductor 404.

Figure 9G:
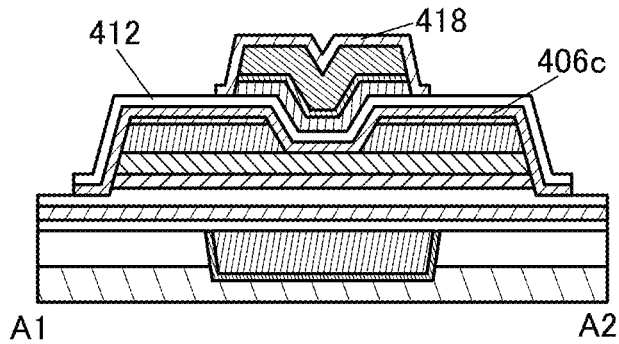
Figure 9H:
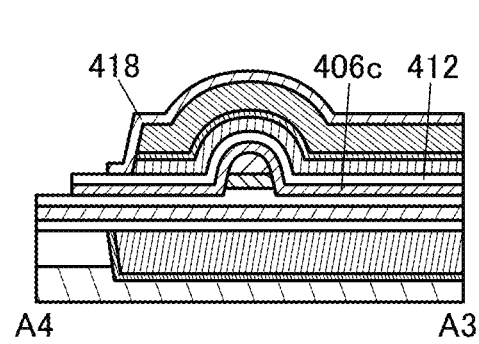

Next, parts of the oxide film 406C and the insulating film 412A are selectively removed by a photolithography method, so that the oxide 406c and the insulator 412 are formed (see FIGS. 9G and 9H). At this time, the oxide 406c is preferably in contact with the peripheries of the oxides 406a and 406b and the top surface of the insulator 402. The oxide 406c formed in this manner covers the side surfaces of the oxides 406a and 406b. Thus, the side surfaces of the oxides 406a and 406b can be prevented from being damaged while the insulator 408a is formed by a sputtering method in a later step.

It is preferable that the insulator 412 be formed in contact with the top surface of the oxide 406c, and the side end portion of the oxide 406c and the side end portion of the insulator 412 be substantially aligned with each other. With such a structure, the area of a region where the insulator 408a is to be in contact with the top surface of the insulator 412 can be large; thus, the amount of oxygen added to the insulator 412 by the formation of the insulator 408a can be increased. Thus, oxygen can be supplied from the insulator 412 to the oxide 406b more effectively.

Note that in this embodiment, the oxide 406c and the insulator 412 are completed after the barrier film 418 is formed; however, the method for manufacturing a transistor that is described in this embodiment is not limited thereto. For example, the conductor 404 or the barrier film 418 may be formed after the oxide 406c and the insulator 412 are completed.

Next, the insulator 408a is formed over the insulator 402, the insulator 412, and the barrier film 418 by a sputtering method. In this embodiment, the thickness of the insulator 408a is approximately 5 nm or greater and 100 nm or less, preferably 5 nm or greater and 20 nm or less.

The insulator 408a is preferably formed in an atmosphere containing oxygen by a sputtering method. In this embodiment, as the insulator 408a, an aluminum oxide film is formed in an atmosphere containing oxygen by a sputtering method. Accordingly, oxygen can be added to surfaces in contact with the insulator 408a (the top surface of the insulator 402, the top surface of the insulator 412, and the like) and the periphery, so that the insulators 402 and 412 can be in an oxygen excess state. Although the oxygen is added as an oxygen radical here, for example, the state of the oxygen at the time of being added is not limited thereto. The oxygen may be added as an oxygen atom, an oxygen ion, or the like. Heat treatment in a later step or the like can diffuse oxygen so that oxygen can be supplied to the oxide 406b effectively.

The insulator 408a is preferably formed while the substrate is being heated. The substrate is preferably heated to higher than 100° C. and lower than or equal to 300° C. By making the substrate temperature higher than 100° C., water in the oxide 406b can be removed. Furthermore, water can be prevented from adsorbing on the surface of the formed film. Moreover, by forming the insulator 408a while the substrate is being heated in this manner, oxygen can be diffused to the oxide 406b during the deposition.

As described above, in the structure described in this embodiment, the area of a region where the insulator 408a is in contact with the top surface of the insulator 412 can be large; thus, the amount of oxygen added to the insulator 412 by the formation of the insulator 408a can be increased. Thus, oxygen can be supplied from the insulator 412 to the oxide 406b more effectively.

Figure 10A:
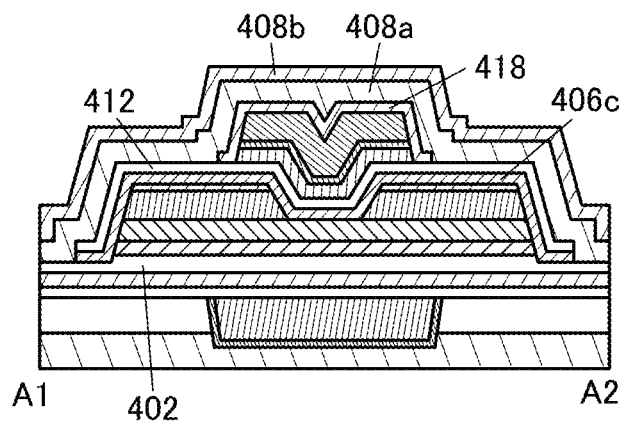
FIGS. 10A to 10D are cross-sectional views illustrating the method of manufacturing a transistor of one embodiment of the present invention.
Figure 10B:
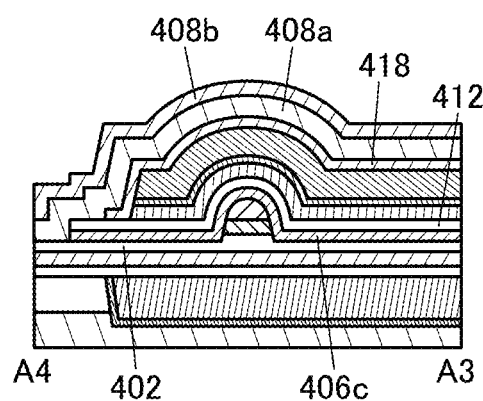

Next, the insulator 408b is formed over the insulator 408a by an ALD method (see FIGS. 10A and 10B). In this embodiment, the thickness of the insulator 408b is 5 nm or greater and 20 nm or less, preferably 5 nm or greater and 10 nm or less, further preferably 5 nm or greater and 7 nm or less.

The insulator 408b is preferably formed using an insulating material that is less likely to transmit impurities such as water and hydrogen, and for example, is preferably formed using aluminum oxide or the like. When the insulator 408b is formed by an ALD method, formation of cracks, pinholes, or the like can be suppressed, and the insulator 408b can be formed with good coverage. Although the insulators 408a and 408b are formed over an uneven structure, by forming the insulator 408b by an ALD method, disconnection, cracks, pinholes, or the like are not formed, and the transistor can be covered with the insulator 408b. Thus, the barrier property against impurities such as hydrogen and water can be improved noticeably.

As described above, the transistor is positioned between the insulator 401 and the insulators 408a and 408b; thus, outward diffusion of oxygen can be prevented, and a large amount of oxygen can be contained in the insulator 402, the oxides 406a to 406c, and the insulator 412. Furthermore, impurities such as hydrogen and water can be prevented from entering from an upper layer that is over the insulator 408b and a lower layer that is below the insulator 401, and thus the concentration of impurities in the insulator 402, the oxides 406a to 406c, and the insulator 412 can be lowered.

Then, the insulator 410 is formed over the insulator 408b. The insulator 410 can be formed by a sputtering method, a CVD method, an MBE method, a PLD method, an ALD method, or the like. Alternatively, the insulator 410 can be formed by a spin coating method, a dipping method, a droplet discharging method (such as an ink-jet method), a printing method (such as screen printing or offset printing), a doctor knife method, a roll coater method, a curtain coater method, or the like.

It is preferable that the insulator 410 be formed by a CVD method. It is further preferable that the insulator 410 be formed by a PECVD method.

The insulator 410 may be formed to have a flat top surface. For example, the top surface of the insulator 410 may have flatness immediately after the film formation. Alternatively, for example, the insulator 410 may have flatness by removing the insulator and the like from the top surface after the film formation so that the top surface becomes parallel to a reference surface such as a rear surface of the substrate. Such treatment is referred to as planarization treatment. As the planarization treatment, for example, CMP treatment, dry etching treatment, or the like can be performed. However, the top surface of the insulator 410 is not necessarily flat.

Next, the insulator 420 is formed over the insulator 410. As the insulator 420, an insulator similar to that of the insulator 408a can be provided.

Next, sixth heat treatment may be performed. The sixth heat treatment can be performed under conditions similar to those of the second heat treatment. By the sixth heat treatment, the oxygen added to the insulators 402 and 412 in forming the insulator 408a by sputtering can be diffused. Thus, the oxygen vacancies in the oxides 406a to 406c can be reduced. Here, the insulators 408a, 408b and 401 can prevent oxygen from being diffused over and under the transistor, and thus oxygen can be supplied to the oxide 406b effectively. By the sixth heat treatment, impurities such as hydrogen and water included in the insulator 410 can be removed, for example. In this embodiment, treatment is performed in a nitrogen atmosphere at 400° C. for one hour, and successively another treatment is performed in an oxygen atmosphere at 400° C. for one hour.

Here, the oxide 406b preferably contains the above-described nc-OS. In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement; thus, oxygen is likely to be diffused in heat treatment. Thus, by the heat treatment, unevenness diffused oxygen in the substrate can be reduced. When the transistor is manufactured using the oxide 406b, variations in electrical characteristics of transistors on one substrate can be reduced.

Note that, the sixth heat treatment does not have to be performed after the insulator 420 is formed, and may be performed after the insulator 410 is formed, after the insulator 408b is formed, or after the insulator 408a is formed.

Figure 10C:
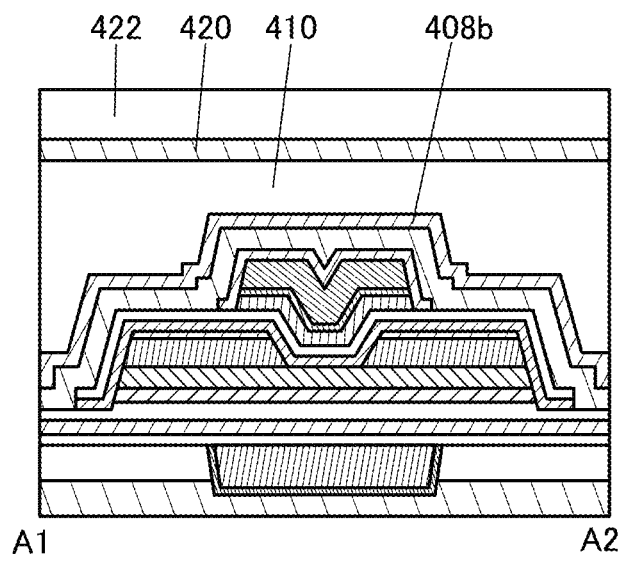
Figure 10D:
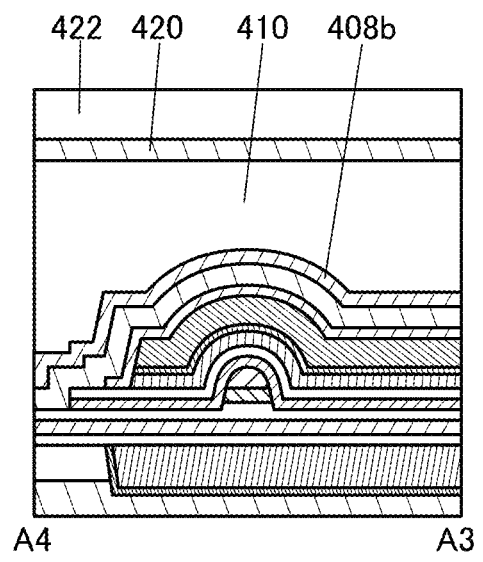

Next, the insulator 422 is formed over the insulator 420 (see FIGS. 10C and 10D). As the insulator 422, an insulator similar to that of the insulator 410 can be provided.

Through the above steps, the transistor in FIGS. 1A to 1C can be formed (see FIGS. 1A to 1C).

The structures, the methods, and the like described in this embodiment can be combined as appropriate with any of the structures, the methods, and the like described in the other embodiments.

Embodiment 3

In this embodiment, embodiments of semiconductor devices are described with reference to FIG. 11, FIG. 12, and FIG. 13.

[Memory Device]

Figure 11:
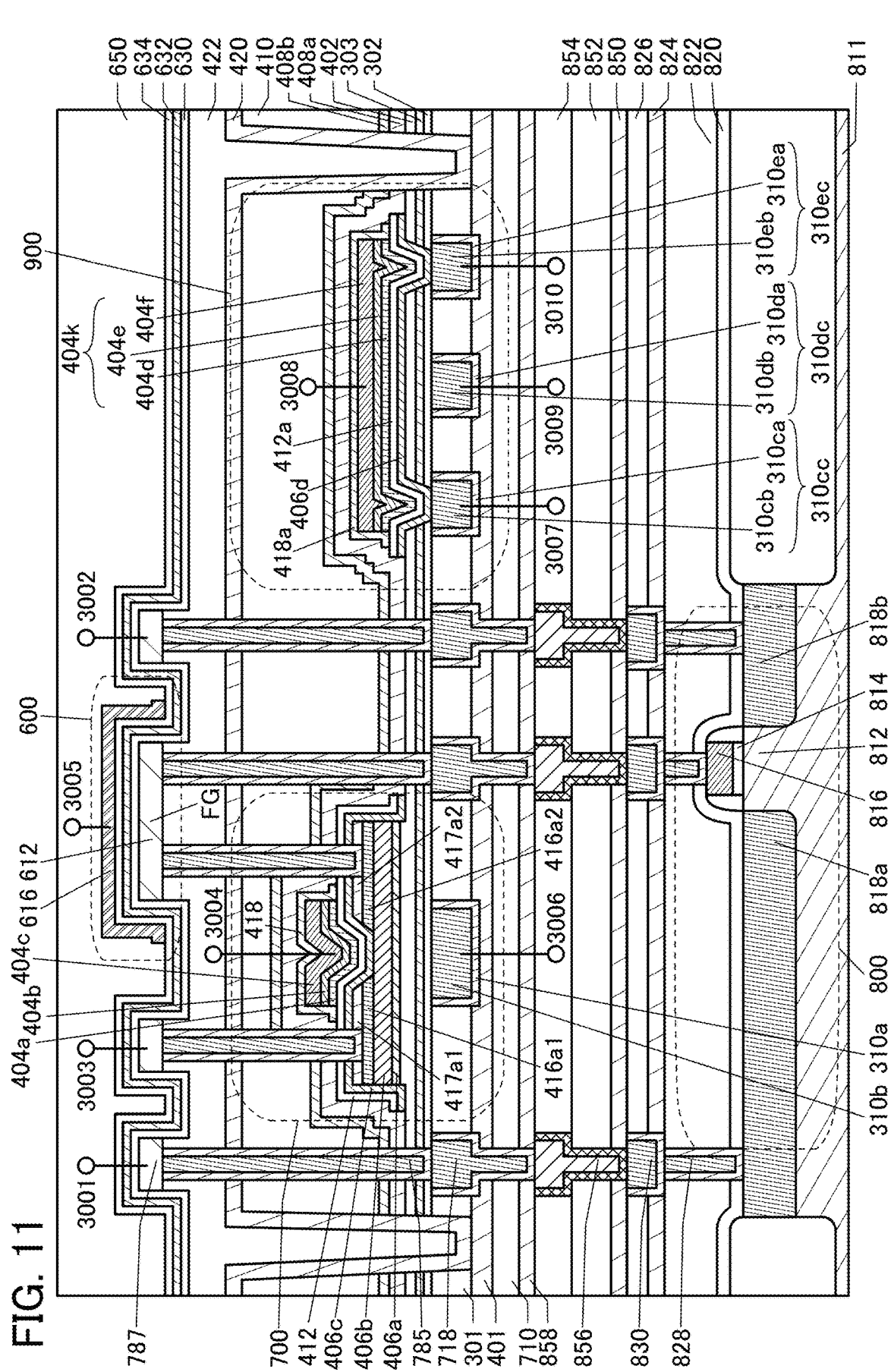
FIG. 11 is a cross-sectional view of a semiconductor device of one embodiment of the present invention.

FIG. 11 illustrates an example of a memory device using the semiconductor device of one embodiment of the present invention.

The memory device in FIG. 11 includes a transistor 900, a transistor 800, a transistor 700, and a capacitor 600.

Here, the transistor 700 is similar to the transistor of FIGS. 1A to 1C described in the above embodiments. The insulator 401, the insulator 301, the conductor 310, the insulator 302, the insulator 303, the insulator 402, the oxide 406a, the oxide 406b, the conductors 416a1 and 416a2, the barrier films 417a1 and 417a2, the oxide 406c, the insulator 412, the conductor 404, the barrier film 418, the insulator 408a, the insulator 408b, the insulator 410, the insulator 420, and the insulator 422 are provided in and near the transistor 700 illustrated in FIG. 11, as in the transistor illustrated in FIGS. 1A to 1C.

The transistor 700 is a transistor in which a channel is formed in a semiconductor layer including an oxide semiconductor. Since the off-state current of the transistor 700 is small, by using the transistor 700 in a memory device, stored data can be retained for a long time. In other words, such a memory device does not require refresh operation or has an extremely low frequency of the refresh operation, which leads to a sufficient reduction in power consumption.

Moreover, supplying a negative potential to a back gate of the transistor 700 can further reduce the off-state current of the transistor 700. In that case, with a structure capable of maintaining the back gate voltage of the transistor 700, stored data can be retained for a long time without power supply.

The transistor 900 and the transistor 700 are formed over the same layer, and thus, the transistor 900 can be fabricated in parallel with the transistor 700. The transistor 900 includes the insulator 301 having openings; a conductor 310cc, a conductor 310dc, and a conductor 310ec in the openings; the insulator 302, the insulator 303 and the insulator 402 over the conductor 310cc, the conductor 310dc, the conductor 310ec, and the insulator 301; an oxide 406d over the insulator 402; an insulator 412a over the oxide 406d; and a conductor 404k over the insulator 412a. Here, the conductor 310cc is a stack of a conductor 310ca and a conductor 310cb, the conductor 310dc is a stack of a conductor 310da and a conductor 310db, and the conductor 310ec is a stack of a conductor 310ea and a conductor 310eb. The conductors 310ca, 310da, and 310ea are the same layer as the conductor 310a. The conductors 310cb, 310db, and 310eb are the same layer as the conductor 310b. The conductor 404k is a stack of a conductor 404d, a conductor 404e, and a conductor 404f. The conductor 404d is the same layer as the conductor 404a, the conductor 404e is the same layer as the conductor 404b, and the conductor 404f is the same layer as the conductor 404c.

The conductors 310cc and 310ec are in contact with the oxide 406d through openings formed in the insulators 302, 303, and 402. Thus, the conductors 310cc and 310ec can function as source and drain electrodes. One of the conductors 404k and 310dc can function as a gate electrode, and the other can function as a back gate electrode.

In the oxide 406d functioning as an active layer of the transistor 900, oxygen vacancies and impurities such as hydrogen and water are reduced as in the oxide 406c or the like. Thus, the threshold voltage of the transistor 900 can be higher than 0 V, the off-state current can be reduced, and Icut can be noticeably reduced. Note that Icut refers to a drain current when the back gate voltage and the top gate voltage are each 0 V.

The back gate voltage of the transistor 700 is controlled by the transistor 900. For example, a top gate and a back gate of the transistor 900 are diode-connected to a source thereof, and the source of the transistor 900 and the back gate of the transistor 700 are connected to each other. When the negative potential of the back gate of the transistor 700 is held in the structure, the top gate-source voltage and the back gate-source voltage of the transistor 900 are each 0 V. Since the Icut of the transistor 900 is extremely small, the structure allows the negative potential of the back gate of the transistor 700 to be held for a long time without power supply to the transistors 700 and 900. Accordingly, the memory device including the transistors 700 and 900 can retain stored data for a long time.

In FIG. 11, a wiring 3001 is electrically connected to a source of the transistor 800, and a wiring 3002 is electrically connected to a drain of the transistor 800. A wiring 3003 is electrically connected to one of a source and a drain of the transistor 700, a wiring 3004 is electrically connected to a top gate of the transistor 700, and a wiring 3006 is electrically connected to the back gate of transistor 700. A gate of the transistor 800 and the other of the source and the drain of the transistor 700 are electrically connected to one electrode of the capacitor 600. A wiring 3005 is electrically connected to the other electrode of the capacitor 600. A wiring 3007 is electrically connected to the source of the transistor 900, a wiring 3008 is electrically connected to the top gate of the transistor 900, a wiring 3009 is electrically connected to the back gate of the transistor 900, and a wiring 3010 is electrically connected to the drain of the transistor 900. The wirings 3006, 3007, 3008, and 3009 are electrically connected to each other.

<Memory Device Configuration 1>

The memory device in FIG. 11 has a feature that the potential of the gate of the transistor 800 can be held, and thus enables writing, retaining, and reading of data as follows.

Writing and retaining of data are described. First, the potential of the wiring 3004 is set to a potential at which the transistor 700 is on, so that the transistor 700 is turned on. Accordingly, the potential of the wiring 3003 is supplied to a node FG where the gate of the transistor 800 and the one electrode of the capacitor 600 are electrically connected to each other. That is, predetermined charge is supplied to the gate of the transistor 800 (writing). Here, one of two kinds of charge that provide different potential levels (hereinafter referred to as low-level charge and high-level charge) is supplied. After that, the potential of the wiring 3004 is set to a potential at which the transistor 700 is off, so that the transistor 700 is turned off. Thus, the charge is retained in the node FG (retaining).

Since the off-state current of the transistor 700 is small, the charge of the node FG is retained for a long time.

Next, reading of data is described. An appropriate potential (reading potential) is supplied to the wiring 3005 while a predetermined potential (constant potential) is supplied to the wiring 3001, whereby the potential of the wiring 3002 varies depending on the amount of charge retained in the node FG. This is because in the case of using an n-channel transistor as the transistor 800, an apparent threshold voltage $V_{th\_H}$ at the time when the high-level charge is given to the gate of the transistor 800 is lower than an apparent threshold voltage $V_{th\_L}$ at the time when the low-level charge is given to the gate of the transistor 800. Here, an apparent threshold voltage refers to the potential of the wiring 3005 that is needed to turn on the transistor 800. Thus, the potential of the wiring 3005 is set to a potential $V_0$ that is between $V_{th\_H}$ and $V_{th\_L}$, whereby charge supplied to the node FG can be determined. For example, in the case where the high-level charge is supplied to the node FG, the transistor 800 is turned on when the potential of the wiring 3005 becomes $V_0$ ($>V_{th\_H}$). In the case where the low-level charge is supplied to the node FG in writing, the transistor 800 still remains off even when the potential of the wiring 3005 becomes $V_0$ ($<V_{th\_L}$). Thus, the data retained in the node FG can be read by determining the potential of the wiring 3002.

By arranging the memory devices illustrated in FIG. 11 in a matrix, a memory cell array can be formed.

Note that in the case where memory cells are arrayed, it is necessary that data of a desired memory cell be read in read operation. For example, in the case of a NOR-type memory cell array, only data of a desired memory cell can be read by turning off the transistors 800 of memory cells from which data is not read. In this case, a potential at which the transistor 800 is turned off regardless of the charge supplied to the node FG, that is, a potential lower than Vth_H is supplied to the wiring 3005 connected to the memory cells from which data is not read. Alternatively, in the case of a NAND-type memory cell array, for example, only data of a desired memory cell can be read by turning on the transistors 800 of memory cells from which data is not read. In this case, a potential at which the transistor 800 is turned on regardless of the charge supplied to the node FG, that is, a potential higher than $V_{th\_L}$ is supplied to the wiring 3005 connected to the memory cells from which data is not read.

<Memory Device Configuration 2>

The memory device illustrated in FIG. 11 does not necessarily include the transistor 800. Also in that case, data can be written and retained in a manner similar to that of the memory device described above.

For example, data reading in the memory device without the transistor 800 is described. When the transistor 700 is turned on, the wiring 3003 that is in a floating state and the capacitor 600 are brought into conduction, and the charge is redistributed between the wiring 3003 and the capacitor 600. As a result, the potential of the wiring 3003 is changed. The amount of change in the potential of the wiring 3003 varies depending on the potential of the one electrode of the capacitor 600 (or the charge accumulated in the capacitor 600).

For example, the potential of the wiring 3003 after the charge redistribution is $(C_B \times V_{B0} + C \times V)/(C_B + C)$, where V is the potential of the one electrode of the capacitor 600, C is the capacitance of the capacitor 600, $C_B$ is the capacitance component of the wiring 3003, and $V_{B0}$ is the potential of the wiring 3003 before the charge redistribution. Thus, it can be found that, assuming that the memory cell is in either of two states in which the potential of the one electrode of the capacitor 600 is $V_1$ and $V_0$ ($V_1 > V_0$), the potential of the wiring 3003 when the potential $V_1$ is retained ($=(C_B \times V_{B0} + C \times V_1)/(C_B + C)$) is higher than the potential of the wiring 3003 when the potential $V_0$ is retained ($=(C_B \times V_{B0} + C \times V_0)/(C_B + C)$).

Then, by comparing the potential of the wiring 3003 with a predetermined potential, data can be read.

In the case of employing the configuration, a transistor using silicon may be used for a driver circuit for driving a memory cell, and a transistor using an oxide semiconductor may be stacked as the transistor 700 over the driver circuit.

When including a transistor using an oxide semiconductor and having a small off-state current, the memory device described above can retain stored data for a long time. In other words, power consumption of the memory device can be reduced because refresh operation becomes unnecessary or the frequency of refresh operation can be extremely low. Moreover, stored data can be retained for a long time even when power is not supplied (note that a potential is preferably fixed).

In the memory device, a high voltage is not needed for data writing and deterioration of elements is unlikely to occur. Unlike in a conventional nonvolatile memory, for example, it is not necessary to inject and extract electrons into and from a floating gate; thus, a problem such as deterioration of an insulator is not caused. That is, unlike a conventional nonvolatile memory, the memory device of one embodiment of the present invention does not have a limit on the number of times data can be rewritten and the reliability thereof is drastically improved. Furthermore, data is written depending on the on/off state of the transistor, whereby high-speed operation can be achieved.

Furthermore, the transistor 700 includes the CAC-OS as an active layer as described in the above embodiment; thus, a large on-state current can be obtained. This contributes to enhancement of data writing speed and operation speed.

<Memory Device Structure 1>

FIG. 11 illustrates an example of the memory device of one embodiment of the present invention. The memory device includes the transistor 900, the transistor 800, the transistor 700, and the capacitor 600. The transistor 700 is provided over the transistor 800, and the capacitor 600 is provided over the transistor 800 and the transistor 700.

The transistor 800 is provided over a substrate 811 and includes a conductor 816, an insulator 814, a semiconductor region 812 that is a part of the substrate 811, and low-resistance regions 818a and 818b functioning as source and drain regions.

The transistor 800 is either a p-channel transistor or an n-channel transistor.

It is preferable that a region of the semiconductor region 812 where a channel is formed, a region in the vicinity thereof, the low-resistance regions 818a and 818b functioning as source and drain regions, and the like include a semiconductor such as a silicon-based semiconductor, more preferably single crystal silicon. Alternatively, a material including germanium (Ge), silicon germanium (SiGe), gallium arsenide (GaAs), gallium aluminum arsenide (GaAlAs), or the like may be included. Silicon whose effective mass is controlled by applying stress to the crystal lattice and thereby changing the lattice spacing may be included. Alternatively, the transistor 800 may be a high-electron-mobility transistor (HEMT) with GaAs, GaAlAs, or the like.

The low-resistance regions 818a and 818b include an element that imparts n-type conductivity, such as arsenic or phosphorus, or an element that imparts p-type conductivity, such as boron, in addition to a semiconductor material used for the semiconductor region 812.

The conductor 816 functioning as a gate electrode can be formed using a semiconductor material such as silicon including an element that imparts n-type conductivity, such as arsenic or phosphorus, or an element that imparts p-type conductivity, such as boron, or a conductive material such as a metal material, an alloy material, or a metal oxide material.

Note that the work function of a conductor is determined by a material of the conductor, whereby the threshold voltage can be adjusted. Specifically, it is preferable to use titanium nitride, tantalum nitride, or the like as the conductor. Furthermore, in order to ensure the conductivity and embeddability of the conductor, it is preferable to use a laminated layer of metal materials such as tungsten and aluminum as the conductor. In particular, tungsten is preferable in terms of heat resistance.

Note that the transistor 800 shown in FIG. 11 is just an example and is not limited to the structure shown therein; an appropriate transistor may be used in accordance with a circuit configuration or a driving method. When the memory device has the structure described in <Structure 2 of memory device>, the transistor 800 is not necessarily provided.

An insulator 820, an insulator 822, an insulator 824, and an insulator 826 are stacked in this order so as to cover the transistor 800.

The insulator 820, the insulator 822, the insulator 824, and the insulator 826 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 822 functions as a planarization film for eliminating a level difference caused by the transistor 800 or the like underlying the insulator 822. The top surface of the insulator 822 may be planarized by planarization treatment using a CMP method or the like to increase the level of planarity.

The insulator 824 is preferably formed using a film with a barrier property that prevents hydrogen and impurities from diffusing from the substrate 811, the transistor 800, or the like into regions where the transistors 700 and 900 are provided. A barrier property refers to a function of inhibiting the diffusion of impurities typified by hydrogen and water. For example, the diffusion length of hydrogen in the film with a barrier property at 350° C. or at 400° C. is less than or equal to 50 nm per hour, preferably less than or equal to 30 nm per hour, more preferably less than or equal to 20 nm per hour.

As an example of the film having a barrier property with respect to hydrogen, silicon nitride formed by a CVD method can be given. The diffusion of hydrogen into a semiconductor element including an oxide semiconductor, such as the transistor 700, degrades the characteristics of the semiconductor element in some cases. Therefore, a film that inhibits the diffusion of hydrogen is preferably provided between the transistors 700 and 900 and the transistor 800. Specifically, the film that inhibits the diffusion of hydrogen is a film from which hydrogen is unlikely to be released.

The released amount of hydrogen can be measured by TDS, for example. The amount of hydrogen released from the insulator 824 that is converted into hydrogen molecules per unit area of the insulator 824 is less than or equal to $2\times10^{15}$ molecules/cm$^2$, preferably less than or equal to $1\times10^{15}$ molecules/cm$^2$, more preferably $5\times10^{14}$ molecules/cm$^2$ in TDS analysis in the range from 50° C. to 500° C., for example.

Note that the dielectric constant of the insulator 826 is preferably lower than that of the insulator 824. For example, the relative dielectric constant of the insulator 826 is preferably lower than 4, more preferably lower than 3. For example, the relative dielectric constant of the insulator 824 is preferably 0.7 times or less that of the insulator 826, more preferably 0.6 times or less that of the insulator 826. In the case where a material with a low dielectric constant is used for an interlayer film, the parasitic capacitance between wirings can be reduced.

A conductor 828, a conductor 830, and the like that are electrically connected to the capacitor 600 or the transistor 700 are embedded in the insulators 820, 822, 824, and 826. Note that the conductors 828 and 830 each function as a plug or a wiring. Note that a plurality of structures of conductors functioning as plugs or wirings are collectively denoted by the same reference numeral in some cases, as described later. Furthermore, in this specification and the like, a wiring and a plug electrically connected to the wiring may be a single component. That is, there are cases where a part of a conductor functions as a wiring and a part of a conductor functions as a plug.

As a material of each of plugs and wirings (e.g., the conductors 828 and 830), a conductive material such as a metal material, an alloy material, a metal nitride material, or a metal oxide material can be used in a single-layer structure or a layered structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance. Each of the plugs and wirings may be formed of a plurality of layers. For example, a conductive material is further formed after a seed layer or a barrier layer formed of a conductive material or a layer for improving the adhesion between a conductive material that is formed later and an insulator is formed to form a conductor. For example, a material selected from titanium, titanium nitride, tantalum, and tantalum nitride is formed as a first layer, and then tungsten, molybdenum, aluminum, or copper is formed, so that a conductor can be formed.

A wiring layer may be provided over the insulator 826 and the conductor 830. For example, in FIG. 11, an insulator 850, an insulator 852, and an insulator 854 are stacked in this order. Furthermore, a conductor 856 is formed in the insulator 850, the insulator 852, and the insulator 854. The conductor 856 functions as a plug or a wiring. Note that the conductor 856 can be formed using a material similar to that for the conductors 828 and 830. Note that the conductor 856 may be formed using a material that is the same as or different from that used for forming the conductors 828 and 830.

Note that for example, the insulator 850 is preferably formed using an insulator having a barrier property with respect to hydrogen, like the insulator 824. Furthermore, the conductor 856 preferably includes a conductor having a barrier property with respect to hydrogen. The conductor having a barrier property with respect to hydrogen is formed particularly in an opening portion of the insulator 850 having a barrier property with respect to hydrogen. In such a structure, the transistor 800 can be separated from the transistors 700 and 900 by a barrier layer, so that the diffusion of hydrogen from the transistor 800 to the transistors 700 and 900 can be inhibited.

Note that as the conductor having a barrier property with respect to hydrogen, tantalum nitride is preferably used, for example. By stacking tantalum nitride and tungsten, which has high conductivity, diffusion of hydrogen from the transistor 800 can be inhibited while the conductivity of a wiring is ensured. In this case, a tantalum nitride layer having a barrier property with respect to hydrogen is preferably in contact with the insulator 850 having a barrier property with respect to hydrogen.

An insulator 858, an insulator 710, the insulator 401, and the insulator 301 are stacked in this order over the insulator 854. A material having a barrier property with respect to oxygen or hydrogen is preferably used for any of the insulator 858, the insulator 710, the insulator 401, and the insulator 301.

The insulator 858 and the insulator 401 are each preferably formed using, for example, a film having a barrier property that prevents hydrogen or impurities from diffusing from the substrate 811, a region where the transistor 800 is provided, or the like into the regions where the transistors 700 and 900 are provided. Therefore, the insulator 858 and the insulator 401 can be formed using a material similar to that for the insulator 824.

As an example of the film having a barrier property with respect to hydrogen, silicon nitride deposited by a CVD method can be given. The diffusion of hydrogen into a semiconductor element including an oxide semiconductor, such as the transistor 700, degrades the characteristics of the semiconductor element in some cases. Therefore, a film that inhibits the diffusion of hydrogen is preferably provided between the transistors 700 and 900 and the transistor 800. Specifically, the film that inhibits the diffusion of hydrogen is a film from which hydrogen is unlikely to be released.

As the film having a barrier property with respect to hydrogen, for example, as the insulator 401, a metal oxide such as aluminum oxide, hafnium oxide, or tantalum oxide is preferably used.

In particular, aluminum oxide has an excellent blocking effect that prevents the passage of oxygen and impurities such as hydrogen and moisture that cause a change in electrical characteristics of the transistor. Accordingly, the use of aluminum oxide can prevent entry of impurities such as hydrogen and moisture into the transistors 700 and 900 in and after a manufacturing process of the transistor. In addition, release of oxygen from the oxide in the transistor 700 can be prevented. Therefore, aluminum oxide is suitably used as a protective film for the transistors 700 and 900.

In addition, the insulator 710 and the insulator 301 can be formed using a material similar to that for the insulator 820. The use of a material with a relatively low dielectric constant for the insulators can reduce the parasitic capacitance between wirings. For example, a silicon oxide film, a silicon oxynitride film, or the like can be used as the insulator 301.

A conductor 718, conductors (the conductor 310, the conductor 310cc, the conductor 310dc, and the conductor 310ec) included in the transistors 700 and 900, and the like are embedded in the insulator 858, the insulator 710, the insulator 401 and the insulator 301. Note that the conductor 718 functions as a plug or a wiring that is electrically connected to the capacitor 600 or the transistor 800. The conductor 718 can be formed using a material similar to that for the conductors 828 and 830.

In particular, the conductor 718 in a region in contact with the insulator 858 and the insulator 401 is preferably a conductor having a barrier property with respect to oxygen, hydrogen, and water. In such a structure, the transistor 800 and the transistor 700 can be completely separated by the layer having a barrier property with respect to oxygen, hydrogen, and water, so that the diffusion of hydrogen from the transistor 800 into the transistors 700 and 900 can be prevented.

The transistors 700 and 900 are provided over the insulator 301. The insulator 420 is provided over the transistors 700 and 900. The insulator 420 can be formed using a material similar to that for the insulator 401. Thus, the insulator 420 functions as protective films for the transistors 700 and 900. Furthermore, as illustrated in FIG. 11, it is preferable that openings be formed in the insulators 301, 302, 303, 402, 408a, 408b, and 410 and the insulators 401 and 420 be in contact with each other. In such a structure, the transistors 700 and 900 can be sealed with the insulators 401 and 420, preventing entry of impurities such as hydrogen and water.

The insulator 422 is provided over the insulator 420. The insulator 422 can be formed using a material similar to that for the insulator 820. The use of a material with a relatively low dielectric constant for the insulators can reduce the parasitic capacitance between wirings. For example, a silicon oxide film, a silicon oxynitride film, or the like can be used as the insulator 422.

A conductor 785 and the like are embedded in the insulators 302, 303, 402, 408a, 408b, and 422.

Note that the conductor 785 functions as a plug or a wiring that is electrically connected to the capacitor 600, the transistor 700, or the transistor 800. The conductor 785 can be formed using a material similar to that for the conductors 828 and 830.

For example, in the case where the conductor 785 is formed to have a layered structure, the conductor 785 preferably includes a conductor that is unlikely to be oxidized (that has high oxidation resistance). It is particularly preferable that a conductor having high oxidation resistance be provided so as to be in contact with the insulator 402 including an excess oxygen region. Such a structure permits inhibition of absorption of excess oxygen from the insulator 402 by the conductor 785. Furthermore, the conductor 785 preferably includes a conductor having a barrier property with respect to hydrogen. In particular, when a conductor having a barrier property with respect to impurities such as hydrogen is provided in contact with the insulator 402 including an excess oxygen region, the diffusion of impurities in the conductor 785 and part of the conductor 785 and the diffusion of impurities from the outside through the conductor 785 can be inhibited.

A conductor 787, the capacitor 600, and the like are provided over the insulator 422 and the conductor 785. The capacitor 600 includes a conductor 612, an insulator 630, an insulator 632, an insulator 634, and a conductor 616. The conductors 612 and 616 function as the electrodes of the capacitor 600, and the insulators 630, 632, and 634 function as dielectrics of the capacitor 600.

Note that the conductor 787 functions as a plug or a wiring that is electrically connected to the capacitor 600, the transistor 700, or the transistor 800. The conductor 612 functions as the one electrode of the capacitor 600. The conductor 787 and the conductor 612 can be formed at the same time.

For the conductor 787 and the conductor 612, a metal film containing an element selected from molybdenum, titanium, tantalum, tungsten, aluminum, copper, chromium, neodymium, and scandium; a metal nitride film containing any of the above elements as its component (e.g., a tantalum nitride film, a titanium nitride film, a molybdenum nitride film, or a tungsten nitride film); or the like can be used. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added may be used.

The insulators 630, 632, and 634 can each be formed to have a single-layer structure or a layered structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, the use of a high dielectric constant (high-k) material, such as aluminum oxide, for the insulator 632 can increase the capacitance per unit area of the capacitor 600. Furthermore, a material having high dielectric strength, such as silicon oxynitride, is preferably used for the insulators 630 and 634. When a ferroelectric is located between insulators with high dielectric strength, electrostatic breakdown of the capacitor 600 can be suppressed and the capacitor can have large capacitance.

The conductor 616 is provided so as to cover the top and side surfaces of the conductor 612 with the insulator 630, the insulator 632, and the insulator 634 therebetween. In the structure where the side surfaces of the conductor 612 are wrapped by the conductor 616 with the insulators therebetween, capacitance is also formed on the side surfaces of the conductor 612, resulting in an increase in the capacitance per unit projected area of the capacitor. Thus, the memory device can be reduced in area, highly integrated, and miniaturized.

Note that the conductor 616 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 616 is formed concurrently with another component such as a conductor, Cu, Al, or the like, which is a low-resistance metal material, may be used.

An insulator 650 is provided over the conductor 616 and the insulator 634. The insulator 650 can be formed using a material similar to that for the insulator 820. The insulator 650 may function as a planarization film that covers roughness due to underlying layers.

The above is the description of the structure example. With the use of the structure, a change in electrical characteristics can be suppressed and reliability can be improved in a memory device including a transistor including an oxide semiconductor. Alternatively, a transistor including an oxide semiconductor with a large on-state current can be provided. A transistor including an oxide semiconductor with a small off-state current can be provided. Alternatively, a memory device with low power consumption can be provided.

Modification Example 1

Figure 12:
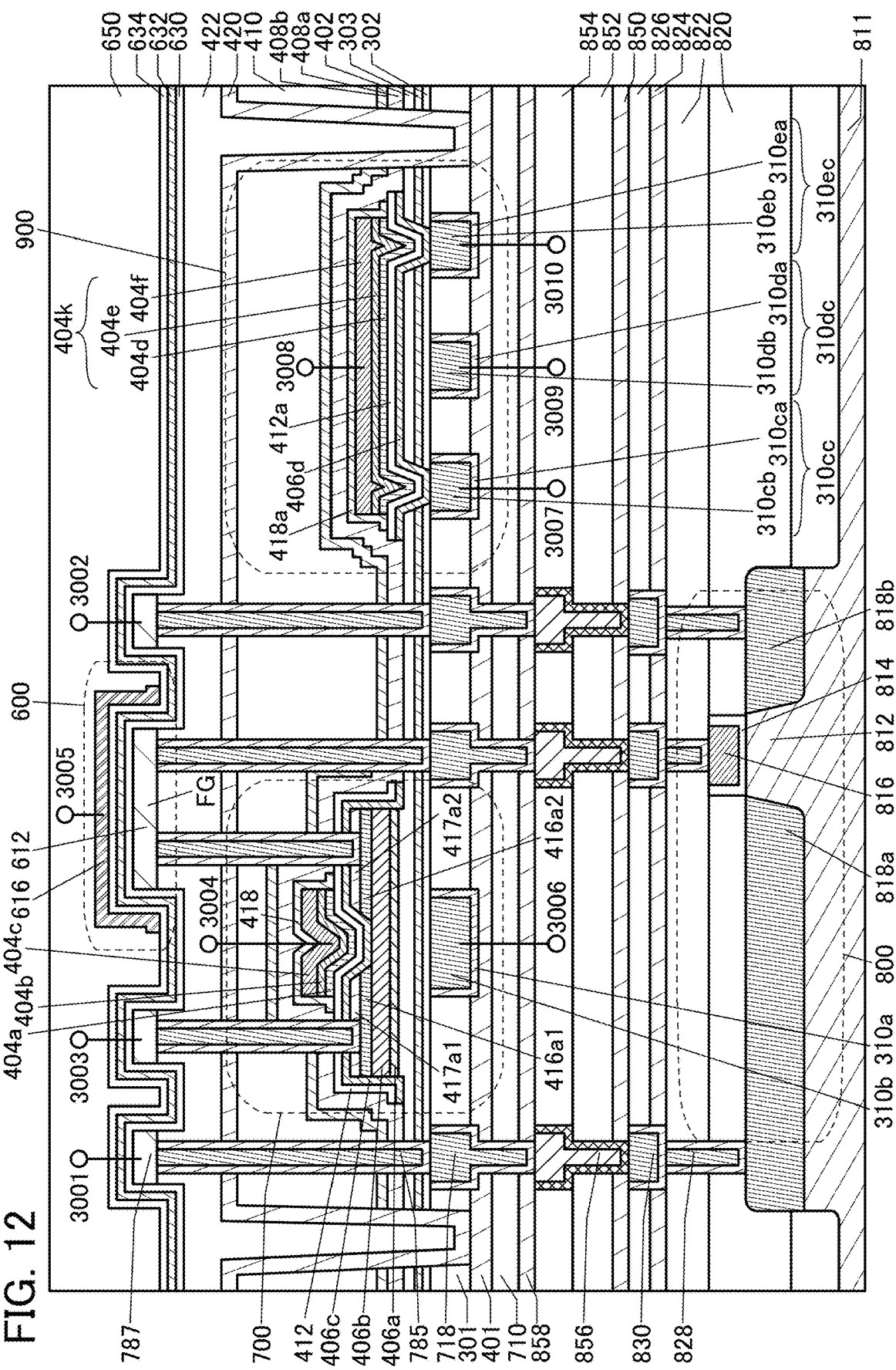
FIG. 12 is a cross-sectional view of a semiconductor device of one embodiment of the present invention.

FIG. 12 illustrates a modification example of the memory device. FIG. 12 is different from FIG. 11 in the structure of the transistor 800.

In the transistor 800 illustrated in FIG. 12, the semiconductor region 812 (part of the substrate 811) in which a channel is formed includes a protruding portion. Furthermore, the conductor 816 is provided so as to cover the top and side surfaces of the semiconductor region 812 with the insulator 814 therebetween. Note that the conductor 816 may be formed using a material for adjusting the work function. The transistor 800 is also referred to as a FIN transistor because it utilizes a protruding portion of the semiconductor substrate. An insulator functioning as a mask for forming the protruding portion may be provided in contact with the top surface of the protruding portion. Although the case where the protruding portion is formed by processing part of the semiconductor substrate is described here, a semiconductor film having a protruding portion may be formed by processing an SOI substrate.

Modification Example 2

Figure 13:
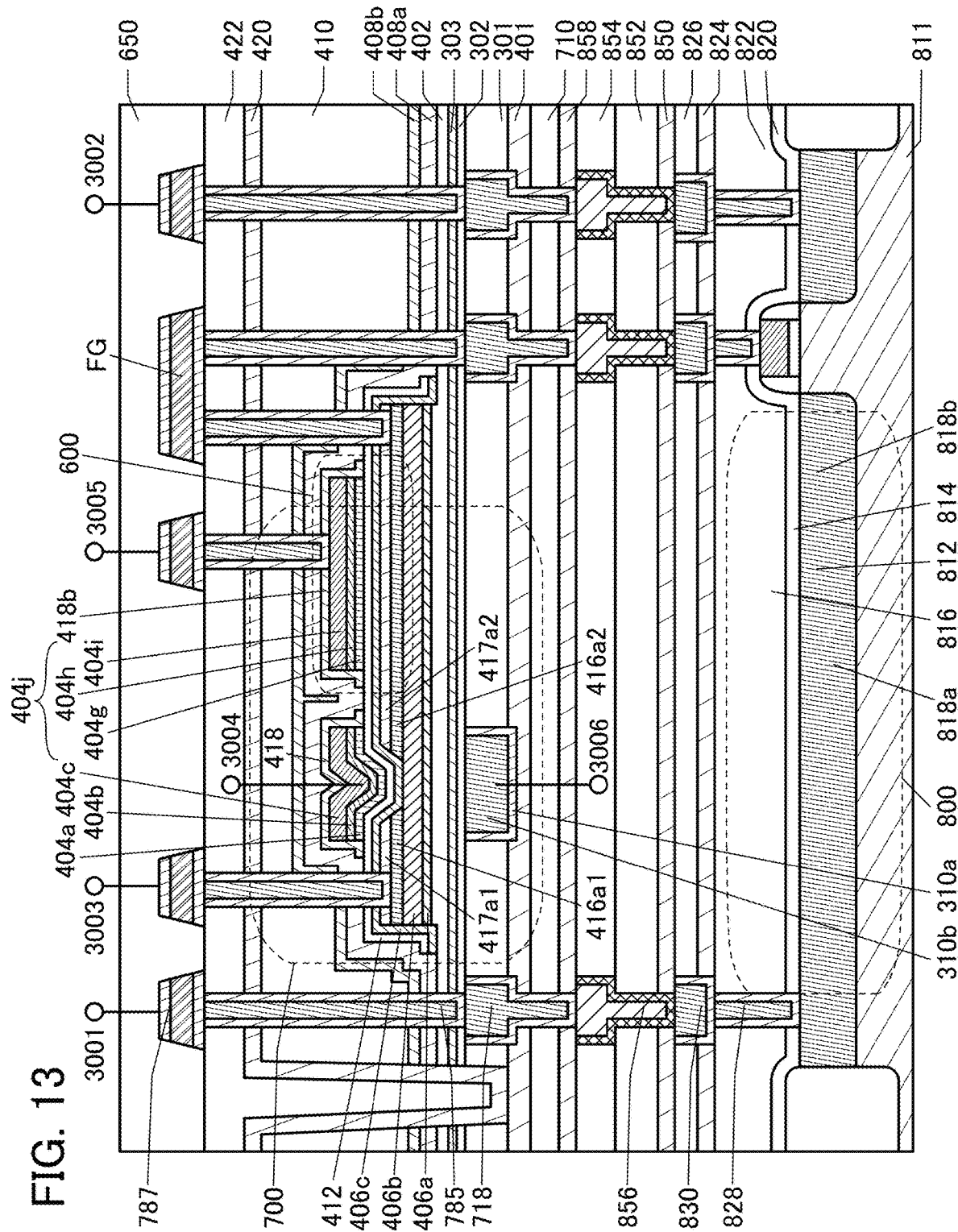
FIG. 13 is a cross-sectional view of a semiconductor device of one embodiment of the present invention.

FIG. 13 illustrates another modification example of the memory device. FIG. 13 differs from FIG. 11 in the placement of the capacitor 600, and the like. Note that the transistor 900 is not illustrated in FIG. 13.

The capacitor 600 illustrated in FIG. 13 differs from that in FIG. 11 in that the capacitor 600 and the transistor 700 are formed over the same layer. The capacitor 600 illustrated in FIG. 13 includes the conductor 416a2, the barrier film 417a2, the oxide 406c, the insulator 412, and a conductor 404j. The conductor 416a2 and the conductor 404j serve as the electrodes of the capacitor 600. The barrier film 417a2, the oxide 406c, and the insulator 412 function as a dielectric of the capacitor 600.

The conductor 404j is a stack of a conductor 404g, a conductor 404h, and a conductor 404i. The conductor 404g is the same layer as the conductor 404a, the conductor 404h is the same layer as the conductor 404b, and the conductor 404i is the same layer as the conductor 404c.

The use of a combination of the transistor 800 and the transistor 700 that have the structures enables a reduction in area, high integration, and miniaturization.

With the use of the structure, a change in electrical characteristics can be suppressed and reliability can be improved in a memory device including a transistor including an oxide semiconductor. Furthermore, a transistor including an oxide semiconductor with a large on-state current can be provided. Furthermore, a transistor including an oxide semiconductor with a small off-state current can be provided. Furthermore, a memory device with low power consumption can be provided.

At least part of this embodiment can be implemented in combination with any of the other embodiments described in this specification as appropriate.

Example 1

In this example, the transistor 700 and the capacitor 600 that are each one embodiment of the present invention illustrated in FIG. 13 were formed as Sample 1A, and tests of electrical characteristics and a reliability test were conducted. Furthermore, as Sample 1B for comparison, a transistor was fabricated by a conventional manufacturing method, and a reliability test was conducted.

Note that the channel length of the transistor 700 was 0.18 μm, and the channel width of the transistor 700 was 0.35 μm.
<Method for Manufacturing Sample 1A>

A method for manufacturing Sample 1A is described below.

First, as the insulator 710, a 400 nm-thick silicon oxide film was formed over a p-type silicon single crystal wafer by a thermal oxidation method. Subsequently, as the insulator 401, a 40 nm-thick aluminum oxide film was formed over the insulator 710 by a sputtering method. Moreover, as the insulator 301, a 160 nm-thick silicon oxynitride film was formed over the insulator 401 by a CVD method.

Next, a 35 nm-thick tungsten film was formed over the insulator 301 by a sputtering method. Then, the tungsten film was processed by a lithography method, and a hard mask including the tungsten film was formed.

Next, the insulator 401 and the insulator 301 were processed by a damascene method to form an opening and a groove in which a wiring was provided. A tantalum nitride film was formed in the opening and the groove by a sputtering method. A titanium nitride film was formed over the tantalum nitride film by an ALD method. A tungsten film was formed over the titanium nitride film by a CVD method. Then, the tungsten film, the titanium nitride film, and the tantalum nitride film were polished by CMP treatment until the top surface of the silicon oxynitride film is reached so that the tungsten, the titanium nitride, and the tantalum nitride were embedded in the opening and the groove; accordingly, conductors corresponding to the conductors 310 and 718 were formed.

Next, a silicon oxynitride film, a hafnium oxide film, and a silicon oxynitride film were formed in this order as the insulator 302, the insulator 303, and the insulator 402. The silicon oxynitride film corresponding to the insulator 302 was formed by a CVD method to have a thickness of 10 nm. The hafnium oxide film corresponding to the insulator 303 was formed by an ALD method to have a thickness of 20 nm. The silicon oxynitride film corresponding to the insulator 402 was formed by a CVD method to have a thickness of 30 nm.

Then, heat treatment was performed. The heat treatment was performed in an atmosphere containing nitrogen at 400° C. for one hour.

Next, as a first oxide to be the oxide 406a, a 5 nm-thick In—Ga—Zn oxide film was formed by a sputtering method. The first oxide was formed under the following conditions: a target having an atomic ratio of In:Ga:Zn=1:3:4 was used, the oxygen gas flow rate was 45 sccm, the pressure was 0.7 Pa, and the substrate temperature was 200° C.

Then, as a second oxide to be the oxide 406b, a 20 nm-thick In—Ga—Zn oxide film was formed over the first oxide by a sputtering method. The second oxide was formed under the following conditions: a target having an atomic ratio of In:Ga:Zn=4:2:4.1 was used, the argon gas flow rate was 40 sccm, the oxygen gas flow rate was 5 sccm, the pressure was 0.7 Pa, and the substrate temperature was 130° C. Note that the first oxide and the second oxide were successively formed.

Then, heat treatment was performed. As the heat treatment, treatment was performed in an atmosphere containing nitrogen at 400° C. for one hour, and subsequently another treatment was performed in an oxygen atmosphere at 400° C. for one hour.

Next, a 30 nm-thick tantalum nitride film was formed over the second oxide by a sputtering method. Then, a 5 nm-thick aluminum oxide film was formed over the tantalum nitride film by an ALD method. Next, a 15 nm-thick tungsten film was formed over the aluminum oxide film by a sputtering method.

Then, the tungsten film and the aluminum oxide film in a region where a channel was formed were etching by a lithography method. A dry etching method was used for the etching.

Next, by a lithography method, unnecessary parts of the tungsten film, the aluminum oxide film, the tantalum nitride film, the second oxide, and the first oxide were etched in this order. A dry etching method was used for the etching. By the processing, the oxides 406a and 406b and the barrier films 417a1 and 417a2 were formed.

Next, the tantalum nitride film in the region where a channel was formed was etched using the tungsten film and the aluminum oxide film from which the region where a channel was formed was removed as masks. A dry etching method was used for the etching. By the processing, the conductor 416a1 and the conductor 416a2 were formed. Note that by the etching, the tungsten film used as a mask was eliminated.

Then, heat treatment was performed. As the heat treatment, treatment was performed in an atmosphere containing nitrogen at 400° C. for 30 minutes, and subsequently another treatment was performed in an oxygen atmosphere at 400° C. for 30 minutes.

Next, as a third oxide to be the oxide 406c, a 5 nm-thick In—Ga—Zn oxide film was formed by a sputtering method. The third oxide was formed under the following conditions: a target having an atomic ratio of In:Ga:Zn=1:1:1 was used, the oxygen gas flow rate was 45 sccm, the pressure was 0.7 Pa, and the substrate temperature was room temperature.

Next, a silicon oxynitride film to be the insulator 412 was formed by a CVD method to have a thickness of 13 nm.

Then, heat treatment was performed. The heat treatment was performed in an atmosphere containing nitrogen at 400° C. for one hour.

Next, as a fourth oxide to be the conductors 404a and 404g, a 10 nm-thick In—Ga—Zn oxide film was formed by a sputtering method. The fourth oxide was formed under the following conditions: a target having an atomic ratio of In:Ga:Zn=4:2:4.1 was used, the oxygen gas flow rate was 45 sccm, the pressure was 0.7 Pa, and the substrate temperature was 200° C.

Next, a titanium nitride film to be the conductors 404b and 404h was formed over the fourth oxide by a sputtering method to have a thickness of 5 nm. A tungsten film to be the conductors 404c and 404i was formed over the titanium nitride film by a sputtering method to have a thickness of 50 nm. Note that the titanium nitride film and the tungsten film were successively formed.

Then, heat treatment was performed. The heat treatment was performed in an atmosphere containing nitrogen at 400° C. for one hour.

Next, the tungsten film, the titanium nitride film, and the fourth oxide were etched in this order by a lithography method. A dry etching method was used for the etching of the tungsten film and the titanium nitride film, and a wet etching method was used for the fourth oxide. By the processing, the conductors 404 and the conductor 404j were formed.

Then, an aluminum oxide film to be the barrier film 418 and the barrier film 418b was formed by an ALD method to have a thickness of 7 nm. Sequentially, by a lithography method, part of the aluminum oxide film was etched. The aluminum oxide film was etched by a dry etching method. By the processing, the barrier film 418 and the barrier film 418b were formed.

Next, by a lithography method, parts of the silicon oxynitride film, which was to be the insulator 412, and the third oxide were etched in this order. A dry etching method was used for the etching. By the processing, the insulator 412 and the oxide 406c were formed. Here, the oxide 406c was formed to cover the oxides 406a and 406b, the conductors 416a1 and 41a2, and the barrier films 417a1 and 417a2.

Then, as the insulator 408a, a 20 nm-thick aluminum oxide film was formed by a sputtering method under the following conditions: the argon gas flow rate was 25 sccm, the oxygen gas flow rate was 25 sccm, the pressure was 0.4 Pa, and the substrate temperature was 250° C.

Then, an aluminum oxide film to be the insulator 408b was formed by an ALD method to have a thickness of 5 nm. The substrate temperature was 250° C.

Next, a silicon oxynitride film to be the insulator 410 was formed by a CVD method to have a thickness of 430 nm. Then, CMP treatment was performed to polish the silicon oxynitride film so that the surface of the silicon oxynitride film was planarized; accordingly, the insulator 410 was formed.

Next, as the insulator 420, a 40 nm-thick aluminum oxide film was formed over the insulator 410. The aluminum oxide film was formed by a sputtering method under the following conditions: the argon gas flow rate was 25 sccm, the oxygen gas flow rate was 25 sccm, the pressure was 0.4 Pa, and the substrate temperature was 250° C.

Then, heat treatment was performed. As the heat treatment, treatment was performed in an atmosphere containing nitrogen at 400° C. for one hour, and subsequently another treatment was performed in an oxygen atmosphere at 400° C. for one hour.

Next, a silicon oxynitride film to be the insulator 422 was formed by a CVD method to have a thickness of 150 nm.

Next, a contact hole reaching the conductor 718, a contact hole reaching the conductor 416a1, a contact hole reaching the conductor 416a2, a contact hole reaching the conductor 404, and a contact hole reaching the conductor 404j were formed by a lithography method. Subsequently, a 40 nm-thick tantalum nitride film was formed by a sputtering method, a 5 nm-thick titanium nitride film was formed by an ALD method, and a 250 nm-thick tungsten film was formed by a CVD method.

Next, the tungsten film, the titanium nitride film, and the tantalum nitride film were polished by CMP treatment until the insulator 422 is reached, so that the conductors were embedded in the contact holes to form the conductor 785.

Then, a 20 nm-thick first titanium film, a 30 nm-thick first titanium nitride film, a 100 nm-thick aluminum film, a 5 nm-thick second titanium film, and a 45 nm-thick second titanium nitride film were successively formed by a sputtering method.

Next, the first titanium film, the first titanium nitride film, the aluminum film, the second titanium film, and the second titanium nitride film were processed by a lithography method to form a wiring layer corresponding to the conductor 787.

Then, a 1.6 μm-thick photosensitive polyimide film was formed by a coating method, and a part of the photosensitive polyimide film that is to be a measurement terminal (measurement pad) was removed by a lithography method.

Lastly, the photosensitive polyimide film was subjected to heat treatment at 300° C. for one hour.

Through the above steps, Sample 1A was fabricated.

<Electrical Characteristics of Transistor>

Next, the $I_d$-$V_g$ characteristics were measured as the electrical characteristics of Sample 1A.

Note that in the $I_d$-$V_g$ characteristics, a change in current (hereinafter drain current $I_d$) between the conductors 416a1 and 416a2, which function as a source electrode and a drain electrode of the transistor 700, in the case where a potential applied to the conductor 404, which functions as the first gate electrode of the transistor 700, was changed from a first value to a second value was measured.

Here, a change in drain current $I_d$ in the case where a potential between the conductors 416a1 and 416a2 (hereinafter drain potential $V_d$) was 0.1 V and 3.3 V, and a potential between the conductors 416a1 and 404 (hereinafter gate potential $V_g$) was changed from −3.3 V to +3.3 V was measured.

Figure 14A:
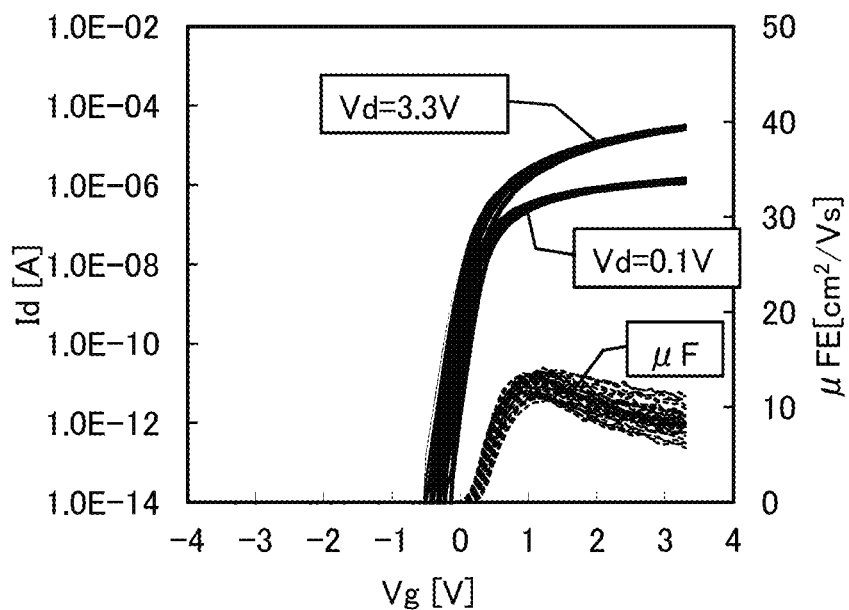
FIGS. 14A to 14D show the $I_d$-$V_g$ characteristics and variations in a substrate of Example.

Note that in this measurement, the potential of the conductor 310 functioning as a second gate electrode (back gate electrode) was set to 0 V. Furthermore, in this measurement, the $I_d$-$V_g$ characteristics and field-effect mobility (μFE) of 36 transistors in a plane of each sample were measured. The results are shown in FIG. 14A.

Figure 14B:
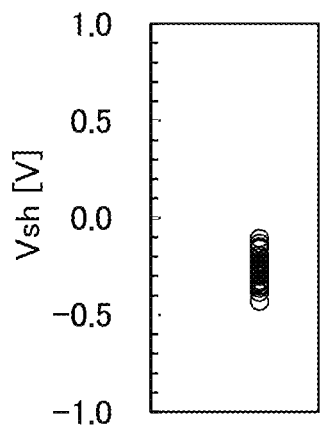

Here, FIG. 14B shows the variations in $V_{sh}$ of the substrate in the case where a drain potential $V_d$ of 3.3V was applied. Note that in $I_d$-$V_g$ characteristics, $V_{sh}$ is defined as a value of $V_g$ when $I_d$ is $1.0\times10^{-12}$ A.

Figure 14C:
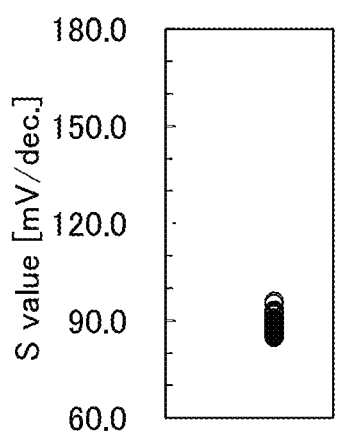
Figure 14D:
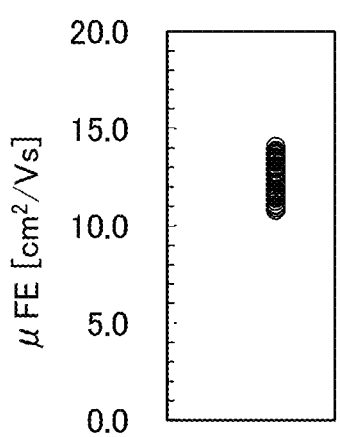

FIG. 14C shows variations in subthreshold value (hereinafter the S value) in the substrate in the case where a drain potential $V_d$ of 0.1 V was applied. FIG. 14D shows variations in field-effect mobility (linear) in the substrate in the case where a drain potential Vd of 0.1 V was applied.

It is found that Sample 1A has small variations in the $V_{sh}$, the S value, and the mobility in the substrate. Specifically, in Sample 1A, the $V_{sh}$ is varied between approximately 0.0 V to approximately 0.5V. The S value is varied between approximately 80 mV/dec. to approximately 100 mV/dec. The field-effect mobility is varied between approximately 10.0 cm²/Vs to approximately 15.0 cm²/Vs.

<Bias-Temperature (BT) Stress Test of Transistor>

Next, the reliability test of Sample 1A was performed. As the reliability test, bias temperature (BT) stress tests were performed. The BT stress tests are one of the most important reliability test items in the reliability test of a transistor.

For example, in a gate bias temperature (GBT) stress test, one potential is supplied to the conductor 416a1, the conductor 416a2, and the conductor 310, which function as the source electrode, the drain electrode, and the second gate electrode (back gate), respectively, of the transistor 700, and a potential different from that supplied to the conductor 416a1, the conductor 416a2, and the conductor 310 is supplied to the conductor 404, which functions as the first gate electrode, for a certain time.

Note that a case where the potential supplied to the conductor 404 is higher than the potential of the conductors 416a1 and 416a2 is called positive (+) stress (+GBT), and a case where the potential supplied to the conductor 404 is lower than the potential of the conductors 416a1 and 416a2 is called negative (−) stress (−GBT).

A stress test in which the conductors 404, 310, and 416a1 are supplied with one potential and the conductor 416a2 is supplied with a potential higher than that of the conductors 404, 310, and 416a1 for a certain time is called a positive drain bias temperature (+DBT) stress test. Furthermore, a stress test in which the conductors 404, 416a1, and 416a2 are supplied with one potential and the conductor 310 is supplied with a potential lower than that of the conductors 404, 416a1, and 416a2 for a certain time is called a negative back gate bias temperature (−BGBT) stress test.

Here, in the +GBT stress test, the sample temperature was −125° C., the gate potential $V_g$ was +3.63 V, the drain potential $V_d$ was 0 V, the source potential $V_s$ was 0 V, and the back gate potential $V_{bg}$ was 0 V. In the −GBT stress test, the sample temperature was 125° C., the gate potential $V_g$ was −3.63 V, the drain potential $V_d$ was 0 V, the source potential $V_s$ was 0 V, and the back gate potential $V_{bg}$ was 0 V.

In the +DBT stress test, the sample temperature was 125° C., the drain potential $V_d$ was +3.63 V, the gate potential $V_g$ was 0 V, the source potential $V_s$ was 0 V, and the back gate potential $V_{bg}$ was 0 V. In the −BGBT stress test, the sample temperature was 125° C., the back gate potential $V_{bg}$ was −5 V, the drain potential $V_d$ was 0 V, the source potential $V_s$ was 0 V, and the gate potential $V_g$ was 0 V.

As an index of the amount of change in electrical characteristics of the transistor, $\Delta V_{sh}$ showing variations in the $V_{sh}$ with time was used. For example, if the $V_{sh}$ when the stress starts to be applied is 0.50 V and the $V_{sh}$ after the stress is applied for 100 seconds is −0.55V, the $\Delta V_{sh}$ after the stress is applied for 100 seconds is −1.05 V.

Figure 15:
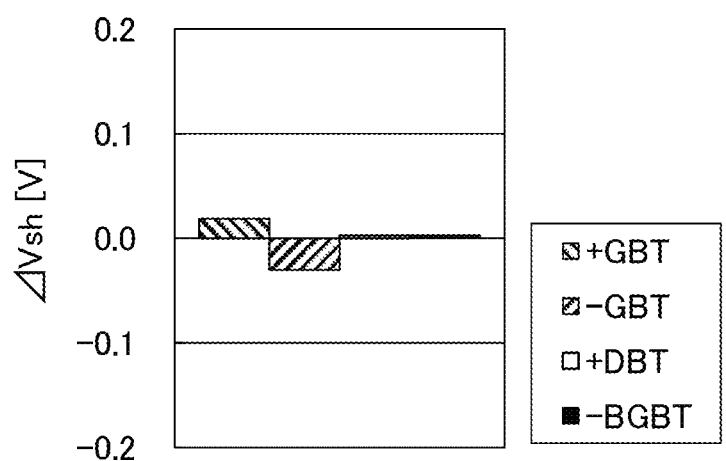
FIG. 15 shows the results of BT stress tests of Example.

FIG. 15 shows the results of the tests on Sample 1A. In FIG. 15, the vertical axis indicates the amount of change in threshold voltage of the transistor ($\Delta V_{sh}$[V]).

As shown in FIG. 15, the amount of change in threshold voltage ($\Delta V_{sh}$) in each BT test on Sample 1A was within ±0.03 V. Thus, Sample 1A has high reliability.

Figure 16A:
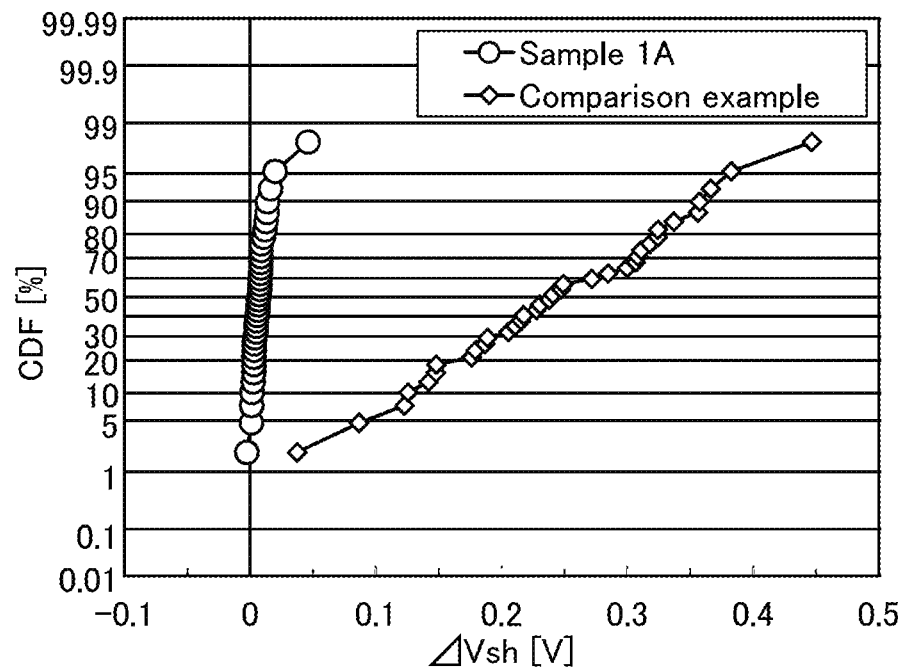
FIGS. 16A and 16B show variations in a substrate and stress time dependence of $\Delta V_{sh}$ of Example.

Next, FIG. 16A shows a distribution diagram of variations in the substrate after the stress was applied for 100 seconds in the +GBT test on Sample 1A. For the distribution diagram, a cumulative distribution function was used. Furthermore, the measurement results of a transistor fabricated by a conventional manufacturing method are also shown as a comparison example. Note that in FIG. 16A, circles indicate the measurement results of Sample 1A, and rhombuses indicate the measurement results of the comparison example.

As shown in FIG. 16A, Sample 1A has very small variations in the substrate. Specifically, in the comparison example, $\Delta V_{sh}$ was varied between approximately 0.0 V and approximately 0.5 V. In contrast, in Sample 1A, $\Delta V_{sh}$ was varied between approximately 0.0 V and less than approximately 0.1 V.

Figure 16B:
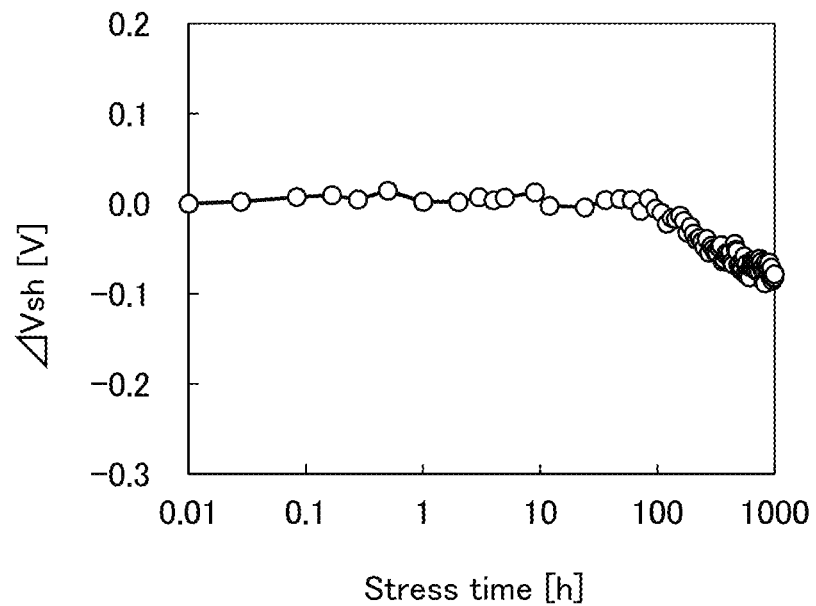

FIG. 16B shows stress time dependence of $\Delta V_{sh}$ when the +GBT stress test was performed on Sample 1A for 1000 hours.

As shown in the results of FIG. 16B, in Sample 1A, a change of the $\Delta V_{sh}$ due to the +GBT stress test is smaller than 0.1 V, which is very small.

The results of the BT stress tests show that Sample 1A has a small amount of change in $V_{sh}$, and thus has good reliability.

Thus, it is found that the transistor using one embodiment of the present invention can have high on-state current (Ion) and high field-effect mobility. It is also found that the potential rises very steeply around 0 V. Moreover, it is found that variations in one substrate was small.

At least part of this embodiment can be implemented in combination with any of the other embodiments described in this specification as appropriate.

EXPLANATION OF REFERENCE

001: region, 002: region, 301: insulator, 302: insulator, 303: insulator, 310: conductor, 310a: conductor, 310A: conductive film, 310b: conductor, 310B: conductive film, 310ca: conductor, 310cb: conductor, 310cc: conductor, 310da: conductor, 310db: conductor, 310dc: conductor, 310ea: conductor, 310eb: conductor, 310ec: conductor, 401: insulator, 402: insulator, 404: conductor, 404a: conductor, 404A: conductive film, 404b: conductor, 404B: conductive film, 404c: conductor, 404C: conductive film, 404d: conductor, 404e: conductor, 404f: conductor, 404g: conductor, 404h: conductor, 404i: conductor, 404j: conductor, 404k: conductor, 406a: oxide, 406A: oxide film, 406b: oxide, 406B: oxide film, 406c: oxide, 406C: oxide film, 406d: oxide, 408a: insulator, 408b: insulator, 410: insulator, 412: insulator, 412a: insulator, 412A: insulating film, 416a1: conductor, 416a2: conductor, 416A: conductive film, 416B: conductive film, 417a1: barrier film, 417a2: barrier film, 417A: barrier film, 418: barrier film, 418b: barrier film, 418A: barrier film, 419a1: conductor, 419a2: conductor, 419A: conductive film, 420: insulator, 422: insulator, 600: capacitor, 612: conductor, 616: conductor, 630: insulator, 632: insulator, 634: insulator, 650: insulator, 700: transistor, 710: insulator, 718: conductor, 785: conductor, 787: conductor, 800: transistor, 811: substrate, 812: semiconductor region, 814: insulator, 816: conductor, 818a: low-resistance region, 818b: low-resistance region, 820: insulator, 822: insulator, 824: insulator, 826: insulator, 828: conductor, 830: conductor, 850: insulator, 852: insulator, 854: insulator, 856: conductor, 858: insulator, 900: transistor, 3001: wiring, 3002: wiring, 3003: wiring, 3004: wiring, 3005: wiring, 3006: wiring, 3007: wiring, 3008: wiring, 3009: wiring, 3010: wiring This application is based on Japanese Patent Application serial no. 2016-131997 filed with Japan Patent Office on Jul. 1, 2016, the entire contents of which are hereby incorporated by reference.

The invention claimed is:

1. A method for manufacturing a semiconductor device, comprising the steps of:
    forming a first conductor;
    forming a first insulator over the first conductor;
    performing first heat treatment after the first insulator is formed;
    forming a first oxide over the first insulator;
    forming a second oxide over the first oxide at a substrate temperature of higher than or equal to 100° C. and lower than 140° C. with a proportion of an oxygen gas of higher than or equal to 0% and lower than or equal to 30%;
    forming a second conductor and a third conductor over the second oxide so that the second conductor and the third conductor are separate from each other;
    forming a third oxide over the first insulator, the second oxide, the second conductor, and the third conductor at a substrate temperature of higher than or equal to room temperature and lower than 200° C. with a proportion of an oxygen gas of higher than or equal to 70% to cover the first oxide and the second oxide;
    forming a second insulator over the third oxide;
    performing second heat treatment after the second insulator is formed;
    forming a fourth conductor over the second insulator;
    performing third heat treatment after the fourth conductor is formed;
    etching part of the fourth conductor selectively after the third heat treatment to form a fifth conductor at least part of which overlaps with the second oxide; and
    forming a third insulator over the first insulator, the second insulator, and the fifth conductor.

2. The method for manufacturing a semiconductor device according to claim 1, wherein the first heat treatment, the second heat treatment, and the third heat treatment are performed in a nitrogen gas atmosphere.

3. The method for manufacturing a semiconductor device according to claim 1,
    wherein the second oxide comprises a first crystal part and a second crystal part,
    wherein the first crystal part comprises a plurality of nanocrystals,
    wherein the second crystal part comprises a plurality of nanocrystals, and
    wherein the plurality of nanocrystals in the first crystal part has c-axis alignment.

4. The method for manufacturing a semiconductor device according to claim 1, wherein the third oxide has higher crystallinity than the second oxide.

5. The method for manufacturing a semiconductor device according to claim 1,
    wherein one side end portion of the second conductor is substantially aligned with one side end portion of the first oxide and one side end portion of the second oxide, and
    wherein one side end portion of the third conductor is substantially aligned with the other side end portion of the first oxide and the other side end portion of the second oxide.

6. A method for manufacturing a semiconductor device, comprising the steps of:
    forming a first conductor;
    forming a first insulator over the first conductor;
    forming a first oxide over the first insulator;
    forming a second oxide over the first oxide;
    forming a second conductor and a third conductor over the second oxide;
    forming a third oxide over the first insulator, the second oxide, the second conductor, and the third conductor;
    forming a second insulator over the third oxide;
    forming a fourth conductor over the second insulator;
    etching part of the fourth conductor selectively to form a fifth conductor at least part of which overlaps with the second oxide; and
    forming a third insulator over the first insulator, the second insulator, and the fifth conductor,
    wherein the third oxide is formed over the first insulator, the second oxide, the second conductor, and the third conductor at a substrate temperature of higher than or equal to room temperature and lower than 200° C. with a proportion of an oxygen gas of higher than or equal to 70% to cover the first oxide and the second oxide.

7. The method for manufacturing a semiconductor device according to claim 6,
    wherein a first heat treatment is performed after the first insulator is formed;
    wherein a second heat treatment is performed after the second insulator is formed; and
    wherein a third heat treatment is performed after the fourth conductor is formed.

8. The method for manufacturing a semiconductor device according to claim 6,
    wherein the second oxide is formed over the first oxide at a substrate temperature of higher than or equal to 100°

C. and lower than 140° C. with a proportion of an oxygen gas of higher than or equal to 0% and lower than or equal to 30%.

9. The method for manufacturing a semiconductor device according to claim 7, wherein the part of the fourth conductor is selectively etched after the third heat treatment.

10. The method for manufacturing a semiconductor device according to claim 7, wherein the first heat treatment, the second heat treatment, and the third heat treatment are performed in a nitrogen gas atmosphere.

11. The method for manufacturing a semiconductor device according to claim 6,
wherein the second oxide comprises a first crystal part and a second crystal part,
wherein the first crystal part comprises a plurality of nanocrystals,
wherein the second crystal part comprises a plurality of nanocrystals, and
wherein the plurality of nanocrystals in the first crystal part has c-axis alignment.

12. The method for manufacturing a semiconductor device according to claim 6, wherein the third oxide has higher crystallinity than the second oxide.

13. The method for manufacturing a semiconductor device according to claim 6,
wherein one side end portion of the second conductor is substantially aligned with one side end portion of the first oxide and one side end portion of the second oxide, and
wherein one side end portion of the third conductor is substantially aligned with the other side end portion of the first oxide and the other side end portion of the second oxide.

* * * * *